US012520482B2

(12) United States Patent
Sharma et al.

(10) Patent No.: US 12,520,482 B2
(45) Date of Patent: Jan. 6, 2026

(54) MEMORY ARRAYS WITH BACKSIDE COMPONENTS AND ANGLED TRANSISTORS

(71) Applicant: Intel Corporation, Santa Clara, CA (US)

(72) Inventors: Abhishek A. Sharma, Portland, OR (US); Sagar Suthram, Portland, OR (US); Tahir Ghani, Portland, OR (US); Anand S. Murthy, Portland, OR (US); Cory E. Weber, Hillsboro, OR (US); Rishabh Mehandru, Portland, OR (US); Wilfred Gomes, Portland, OR (US); Pushkar Sharad Ranade, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 364 days.

(21) Appl. No.: 18/325,492

(22) Filed: May 30, 2023

(65) Prior Publication Data

US 2024/0008255 A1 Jan. 4, 2024

Related U.S. Application Data

(63) Continuation of application No. PCT/US2022/035581, filed on Jun. 29, 2022.

(51) Int. Cl.
*H10B 12/00* (2023.01)
(52) U.S. Cl.
CPC ......... *H10B 12/315* (2023.02); *H10B 12/033* (2023.02); *H10B 12/05* (2023.02); *H10B 12/482* (2023.02)
(58) Field of Classification Search
CPC .... H10B 12/315; H10B 12/033; H10B 12/05; H10B 12/482; H10B 53/30; H10D 1/716
See application file for complete search history.

(56) References Cited

U.S. PATENT DOCUMENTS 5,218,568 A 6/1993 Lin et al.
5,412,596 A 5/1995 Hoshiba
(Continued)

FOREIGN PATENT DOCUMENTS

DE 10047963 A1 3/2001
JP 2007250618 A 9/2007
(Continued)

OTHER PUBLICATIONS

Barroso, Luiz A., "Impact of Chip-Level Integration on Performance of OLTP Workloads," Sixth International Symposium on High-Performance Computer Architecture (HPCA), Jan. 2000, 12 pages.

(Continued)

*Primary Examiner* — David Vu
(74) *Attorney, Agent, or Firm* — Akona IP PC

(57) ABSTRACT

Memory arrays with backside components and angled transistors, and related assemblies and methods, are disclosed herein. A transistor is referred to as an "angled transistor" if a longitudinal axis of an elongated semiconductor structure of the transistor (e.g., a fin or a nanoribbon) is neither perpendicular nor parallel to any edges of front or back sides of a support structure (e.g., a die) over which the transistor is implemented. A component is referred to as a "backside component" if it is provided on the side of a semiconductor substrate that is opposite to the side over which the transistors of the memory arrays are provided. Memory arrays with backside components and angled transistors provide a promising way to increasing densities of memory cells on the limited real estate of semiconductor chips and/or decreasing adverse effects associated with continuous scaling of IC components.

20 Claims, 26 Drawing Sheets

(56) References Cited

U.S. PATENT DOCUMENTS

| | | |
|---|---|---|
| 5,515,311 A | 5/1996 | Mihara |
| 5,600,587 A | 2/1997 | Koike |
| 8,841,777 B2 | 9/2014 | Farooq et al. |
| 9,640,509 B1 | 5/2017 | Yang |
| 9,773,728 B1 | 9/2017 | Juengling |
| 10,224,318 B2 | 3/2019 | Kurita et al. |
| 11,018,264 B1 | 5/2021 | Gomes et al. |
| 11,044,812 B2 | 6/2021 | Voraberger |
| 11,056,492 B1 | 7/2021 | Gomes et al. |
| 11,139,300 B2 | 10/2021 | Gomes et al. |
| 11,239,208 B2 | 2/2022 | Chuang et al. |
| 11,239,238 B2 | 2/2022 | Gomes et al. |
| 11,257,822 B2 | 2/2022 | Gomes et al. |
| 11,355,686 B2 | 6/2022 | Hong |
| 2004/0000722 A1 | 1/2004 | Powers |
| 2005/0199913 A1 | 9/2005 | Hofmann et al. |
| 2005/0230682 A1 | 10/2005 | Hara |
| 2006/0012966 A1 | 1/2006 | Chakravorty |
| 2006/0268597 A1 | 11/2006 | Sakuma |
| 2008/0048226 A1 | 2/2008 | Heo et al. |
| 2008/0121956 A1 | 5/2008 | Kanaya |
| 2009/0108457 A1 | 4/2009 | Christensen et al. |
| 2009/0111214 A1 | 4/2009 | Christensen et al. |
| 2009/0142888 A1 | 6/2009 | Tsuchiya |
| 2010/0059898 A1 | 3/2010 | Keeth et al. |
| 2010/0321975 A1 | 12/2010 | Kimura et al. |
| 2012/0040528 A1 | 2/2012 | Kim et al. |
| 2012/0193697 A1 | 8/2012 | Takemura |
| 2012/0248621 A1 | 10/2012 | Sadaka |
| 2012/0273747 A1 | 11/2012 | Saitoh et al. |
| 2012/0273859 A1* | 11/2012 | Oyu ............... H10D 30/62 257/296 |
| 2012/0314476 A1 | 12/2012 | Appenzeller et al. |
| 2013/0140680 A1 | 6/2013 | Harada et al. |
| 2014/0001604 A1 | 1/2014 | Sadaka |
| 2014/0239458 A1 | 8/2014 | Farooq et al. |
| 2015/0021771 A1 | 1/2015 | Lin |
| 2015/0162185 A1 | 6/2015 | Pore |
| 2015/0228551 A1 | 8/2015 | Oi et al. |
| 2016/0027490 A1 | 1/2016 | Müller |
| 2016/0240503 A1 | 8/2016 | Shu et al. |
| 2016/0318757 A1 | 11/2016 | Chou et al. |
| 2016/0343762 A1 | 11/2016 | Kagawa et al. |
| 2017/0025381 A1 | 1/2017 | Tsai et al. |
| 2017/0110494 A1 | 4/2017 | Tsai et al. |
| 2017/0179153 A1 | 6/2017 | Ogawa et al. |
| 2017/0200700 A1 | 7/2017 | Das et al. |
| 2018/0182763 A1 | 6/2018 | Juengling |
| 2018/0277517 A1 | 9/2018 | Kim et al. |
| 2018/0366456 A1 | 12/2018 | Jeong et al. |
| 2019/0221557 A1 | 7/2019 | Kim et al. |
| 2020/0075497 A1 | 3/2020 | Dabral et al. |
| 2020/0090990 A1 | 3/2020 | Fan et al. |
| 2020/0091162 A1 | 3/2020 | Morris et al. |
| 2020/0098719 A1 | 3/2020 | Park et al. |
| 2020/0135617 A1 | 4/2020 | Shen et al. |
| 2020/0135683 A1 | 4/2020 | Kim et al. |
| 2020/0135719 A1 | 4/2020 | Brewer |
| 2020/0144242 A1 | 5/2020 | Park |
| 2020/0203329 A1 | 6/2020 | Kanamori et al. |
| 2020/0211970 A1 | 7/2020 | Gomes et al. |
| 2020/0279594 A1 | 9/2020 | Liu |
| 2020/0303301 A1 | 9/2020 | Chen et al. |
| 2020/0303361 A1 | 9/2020 | Shih |
| 2020/0365514 A1 | 11/2020 | Yang et al. |
| 2020/0381512 A1 | 12/2020 | Kao et al. |
| 2020/0411428 A1 | 12/2020 | Lilak et al. |
| 2021/0020596 A1 | 1/2021 | Yi et al. |
| 2021/0036144 A1 | 2/2021 | Liaw |
| 2021/0057309 A1 | 2/2021 | Hu et al. |
| 2021/0125990 A1 | 4/2021 | Gomes et al. |
| 2021/0134802 A1 | 5/2021 | Gomes et al. |
| 2021/0151438 A1 | 5/2021 | Gomes et al. |
| 2021/0159229 A1 | 5/2021 | Gomes et al. |
| 2021/0193666 A1 | 6/2021 | Gomes et al. |
| 2021/0335791 A1 | 10/2021 | Gomes et al. |
| 2021/0366855 A1 | 11/2021 | Okina |
| 2021/0375790 A1 | 12/2021 | Oda et al. |
| 2022/0045065 A1 | 2/2022 | Gomes et al. |
| 2022/0068931 A1 | 3/2022 | Gomes et al. |
| 2022/0173046 A1 | 6/2022 | Gomes et al. |
| 2022/0173090 A1 | 6/2022 | Gomes et al. |
| 2022/0181256 A1 | 6/2022 | Gomes et al. |
| 2022/0181313 A1 | 6/2022 | Gomes et al. |
| 2022/0199628 A1 | 6/2022 | Sato et al. |
| 2022/0344320 A1 | 10/2022 | Juengling |
| 2022/0415841 A1 | 12/2022 | Sharma et al. |
| 2022/0415892 A1 | 12/2022 | Gomes et al. |
| 2022/0415904 A1 | 12/2022 | Sharma et al. |

FOREIGN PATENT DOCUMENTS

| | | |
|---|---|---|
| WO | 2016025451 A1 | 2/2016 |
| WO | 2018111215 A1 | 6/2018 |
| WO | 2018125024 A1 | 7/2018 |
| WO | 2022119621 A1 | 6/2022 |
| WO | 2022125166 A1 | 6/2022 |

OTHER PUBLICATIONS

Fujun B. et al., "A Stacked Embedded DRAM Array for LPDDR4/4X using Hybrid Bonding 3D Integration with 34GB/s/1Gb 0.88 pJ/b Logic-to-Memory Interface," 2020 IEEE International Electron Devices Meeting (IEDM) Dec. 12, 2020 (pp. 6-6); 4 pages.

Sinha, Saurabh, et al., "Stack up your chips: Betting on 3D integration to augment Moores Law scaling," IEEE Smart City Summit (SCS) Conference, Nov. 1, 2019, San Jose, CA; 5 pages.

Tallis, Billy, "Micron 3D NAND Status Update," AnandTech, retrieved from the internet on Jun. 10, 2019, https://www.anandtech.com/show/10028/micron-3d-nand-status-update, 6 pages.

\* cited by examiner

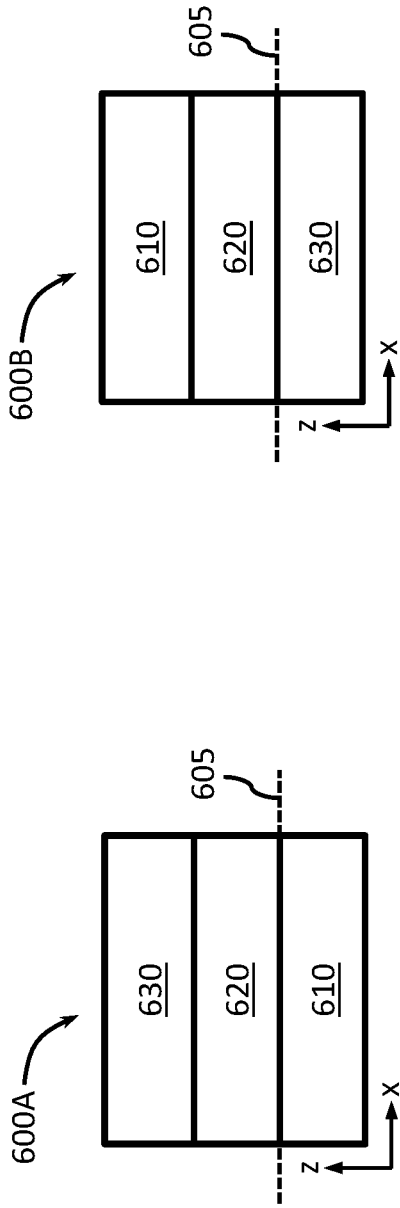
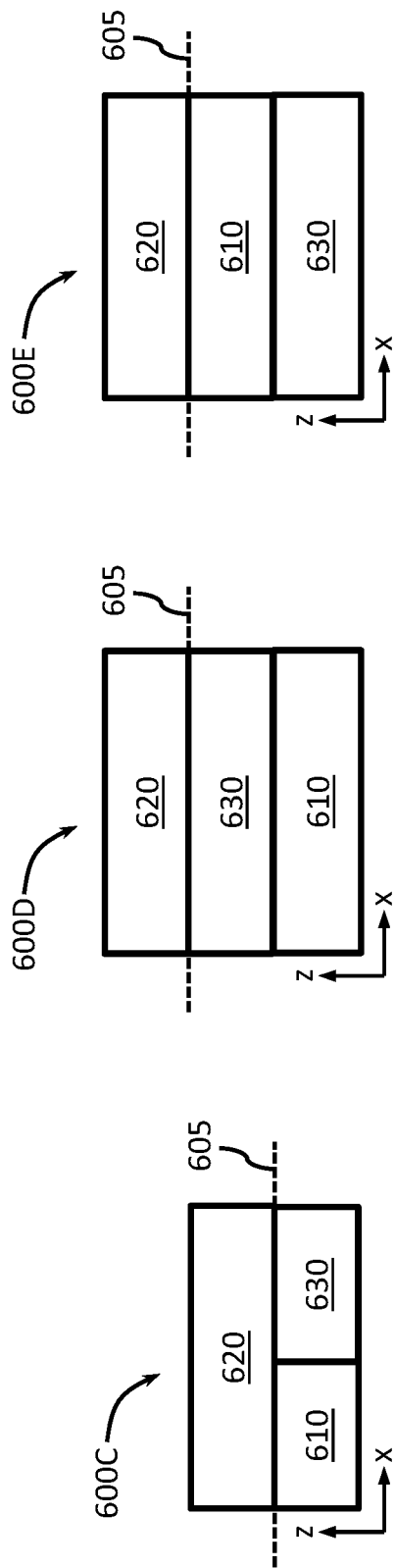

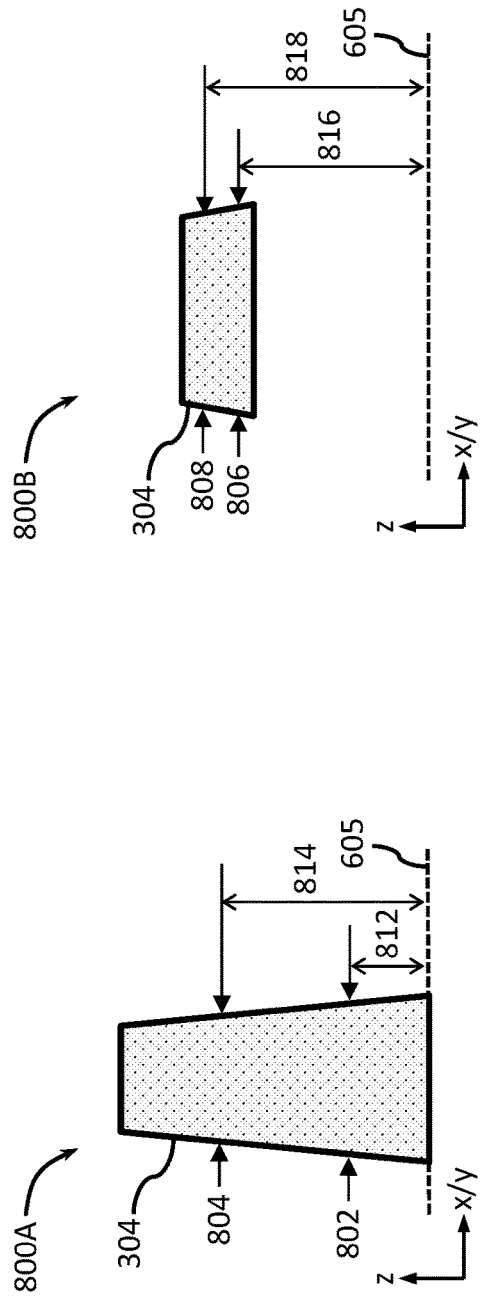
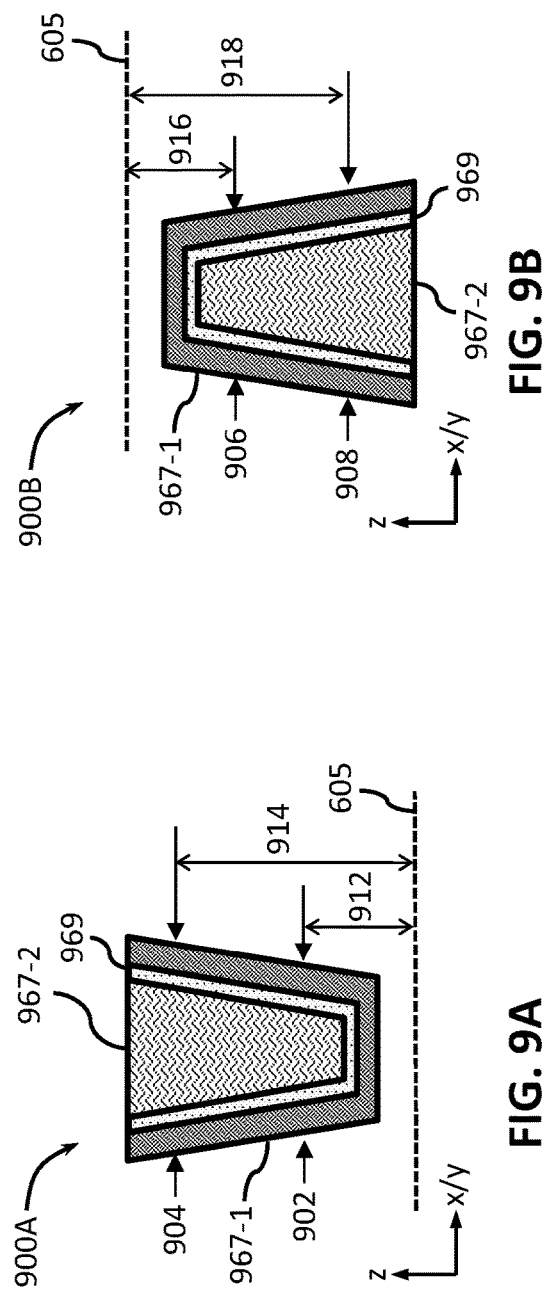

MEMORY ARRAYS WITH BACKSIDE COMPONENTS AND ANGLED TRANSISTORS

CROSS-REFERENCE TO RELATED APPLICATION

This application is a continuation of (and claims the benefit and priority under 35 U.S.C. 120 of) International Application No. PCT/US2022/035581, filed 29 Jun. 2022, entitled "MEMORY ARRAYS WITH BACKSIDE COMPONENTS AND ANGLED TRANSISTORS," the disclosure of which is considered part of, and is incorporated by reference in, the disclosure of this application.

BACKGROUND

Embedded memory is important to the performance of modern system-on-a-chip (SoC) technology. Low power and high-density embedded memory arrays are used in many different computer products and further improvements are always desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 6A-6E provide schematic illustrations of IC devices with various arrangements of frontside and backside components, in accordance with some embodiments.

FIGS. 8A-8B provide cross-sectional side views of, respectively, a frontside fin and a frontside nanoribbon, in accordance with some embodiments.

FIGS. 9A-9B provide cross-sectional side views of, respectively, a frontside capacitor and a backside capacitor, in accordance with some embodiments.

DETAILED DESCRIPTION

Figure 1:
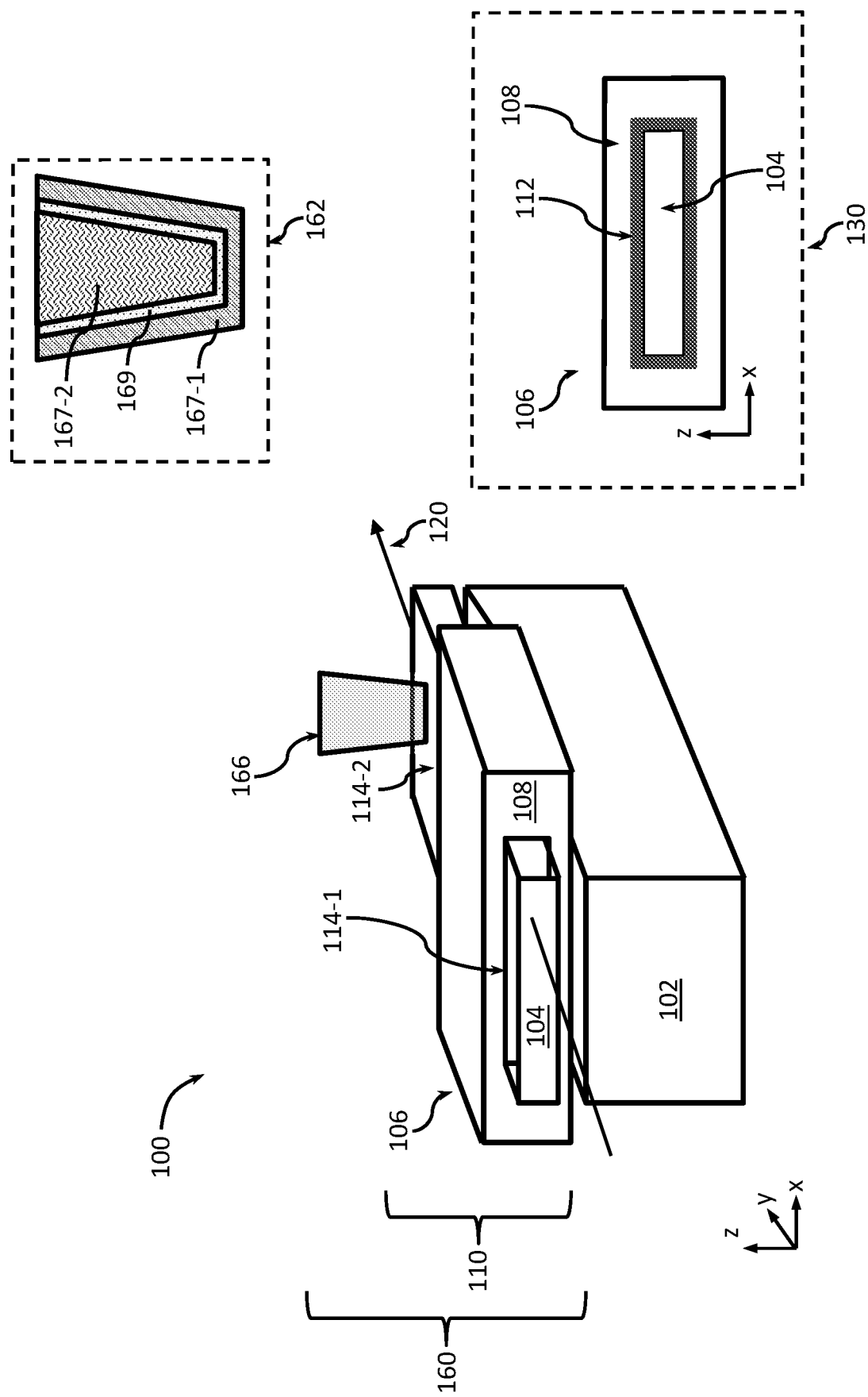
FIG. 1 provides a perspective view of an example integrated circuit (IC) device implementing a nanoribbon transistor, in accordance with some embodiments.

Memory arrays with backside components and angled transistors, and related assemblies and methods, are disclosed herein. The devices, assemblies, and methods of this disclosure each have several innovative aspects, no single one of which is solely responsible for all the desirable attributes disclosed herein. Details of one or more implementations of the subject matter described in this specification are set forth in the description below and the accompanying drawings.

For purposes of illustrating memory arrays with backside components and angled transistors, proposed herein, it might be useful to first understand phenomena that may come into play in such arrangements. The following foundational information may be viewed as a basis from which the present disclosure may be properly explained. Such information is offered for purposes of explanation only and, accordingly, should not be construed in any way to limit the broad scope of the present disclosure and its potential applications.

Some memory devices may be considered "standalone" devices in that they are included in a chip that does not also include compute logic (where, as used herein, the term "compute logic devices" or simply "compute logic" or "logic devices," refers to devices, e.g., transistors, for performing computing/processing operations). Other memory devices may be included in a chip along with compute logic and may be referred to as "embedded" memory devices. Using embedded memory to support compute logic may improve performance by bringing the memory and the compute logic closer together and eliminating interfaces that increase latency. Various embodiments of the present disclosure relate to embedded memory arrays, as well as corresponding methods and devices.

Some embodiments of the present disclosure may refer to dynamic random-access memory (DRAM) and in particular, embedded DRAM (eDRAM), because this type of memory has been introduced in the past to address the limitation in density and standby power of some other types of memory devices. A DRAM memory cell may include a capacitor for storing a bit value, or a memory state (e.g., logical "1" or "0") of the cell, and an access transistor controlling access to the cell (e.g., access to write information to the cell or access to read information from the cell). Such a memory cell may be referred to as a "1T-1C memory cell," highlighting the fact that it uses one transistor (i.e., "1T" in the term "1T-1C memory cell") and one capacitor (i.e., "1C" in the term "1T-1C memory cell"). The access transistor of a 1T-1C memory cell may be a field-effect transistor (FET), e.g., a metal-oxide-semiconductor FET (MOSFET), having a source terminal, a drain terminal, and a gate terminal. A FET typically includes a semiconductor channel material, a source region and a drain region provided in the channel material, and a gate that includes at least a gate electrode material and, optionally, may also include a gate insulator. In such a transistor, the gate is provided over a portion of the channel material between the source region and the drain region. The term "source terminal" typically refers to either the source region or a contact to the source region, the term "drain terminal" terminal" typically refers to either the drain region or a contact to the drain region, and the term "gate terminal" typically refers to either the gate or a contact to the gate. Since, as is common in the field of FETs, designations of "source" and "drain" are often interchangeable, source and drain regions/contacts/terminals of a transistor may be referred to as first and second source or drain (S/D) regions/contacts/terminals, where, in some embodiments, the first S/D region/contact/terminal is a source region/contact/terminal and the second S/D region/contact/terminal is a drain region/contact/terminal and, in other embodiments, this designation of source and drain may be reversed. The capacitor of a 1T-1C memory cell may be coupled to one S/D terminal of the access transistor (e.g., to the source terminal of the access transistor), while the other S/D terminal of the access transistor may be coupled to a BL, and a gate terminal of the transistor may be coupled to a wordline (WL). Since such a memory cell can be fabricated with as little as a single access transistor, it can provide higher density and lower standby power versus some other types of memory in the same process technology, e.g., static random-access memory (SRAM).

Various 1T-1C memory cells have, conventionally, been implemented with access transistors being front-end-of-line (FEOL), logic-process based, transistors implemented in an upper-most layer (i.e., at the front side) of a semiconductor substrate and with all other components associated with the memory cells (e.g., the capacitors of the memory cells and/or various memory control lines such as BLs, WLs, etc.) also built at the front side of the substrate. Furthermore, conventional implementations of 1T-1C memory cells employ transistors that are substantially aligned with (i.e., either parallel or perpendicular to) the edges of the substrate. Inventors of the present disclosure realized that such conventional implementations create several challenges for increasing memory density.

In contrast to such conventional implementations, embodiments of the present disclosure provide memory arrays with backside components and angled transistors. As used herein, a component is referred to as a "backside component" if it is provided on the side of a semiconductor substrate that is opposite to the side over which the transistors of the memory arrays are provided. Thus, if the side over which the transistors are built is a front side, then backside components described herein are built on the back side. Providing some components associated with a memory array, such as BLs and/or capacitors of 1T-1C memory cells as backside components of an IC device may provide advantages in terms of, e.g., easier fabrication, decreased complexity of signal routing, and increased density of memory cells. Furthermore, backside components may advantageously reduce some of the parasitic effects in an IC device by increasing spacing between various electrically conductive elements that may contribute to such effects. Implementing at least some of the access transistors of the memory cells are angled transistors may provide additional advantages. As used herein, a transistor is referred to as an "angled transistor" if the direction of carrier transport of the transistor is neither perpendicular nor parallel to any edges of the front side or the back side of a support structure (e.g., a die) over which the transistor is implemented. For example, a transistor may be described as an "angled transistor" if an angle between a projection of an elongated semiconductor structure of the transistor (e.g., a fin or a nanoribbon) onto a plane of the support structure and one or more of the edges of the support structure is neither 0 degrees, no 90 degrees, e.g., between about 10 degrees and 80 degrees. Like parking cars at an angle with the periphery of a parking lot may increase the density of cars that a parking lot of a given size may accommodate, angled transistors may help increase density of memory cells. Moreover, angling access transistors of memory cells advantageously allows sharing of some of the terminals of the transistors (e.g., having a single terminal serve as a S/D terminal of a transistor of one memory cell as well as a S/D terminal of a transistor of another memory cell), further decreasing the overall footprint of the memory array. Thus, memory arrays with backside components and angled transistors as described herein allow significantly increasing density of memory cells in a memory array having a given footprint area (the footprint area being defined as an area in a plane of the substrate, or a plane parallel to the plane of the substrate, i.e., the x-y plane of an example coordinate system shown in the drawings of the present disclosure), or, conversely, allows significantly reducing the footprint area of the memory array with a given memory cell density.

Since, in geometry, not just one but two angles may be defined among any two lines crossing one another when the angles are defined as measured clockwise or counterclockwise with respect to one of the lines, the two such angles adding together to be 180 degrees, for the angled transistors described herein the angles refer to the smaller of the two angles. When a transistor is implemented as an angled transistor, the gate of the transistor may still be aligned with the edges of the support structure (e.g., be either perpendicular or parallel to the support structure), which means that the gate is non-angled with respect to the edges of the support structure but is angled with respect to the direction of carrier transport of the transistor. Alternatively, the gate of the transistor may also be angled with respect to the edges of the support structure, as long as it remains angled (e.g., not perpendicular) with respect to the direction of carrier transport of the transistor. Embodiments of the present disclosure are based on recognition that implementing transistors as angled transistors with gates that are angled with respect to the direction of carrier transport of the transistors, means that, for a given width of an elongated structure of the transistor, the effective cross-section over which the carriers may be transported between source and drain is increased (e.g., the cross-section of the gates in the x-z plane of the example coordinate system illustrated in the present drawings), advantageously resulting in an increased drive current.

Conversely, implementing transistors as angled transistors with gates that are angled with respect to the direction of carrier transport of the transistors may advantageously allow reducing the widths of the elongated structures of the transistors, thus reducing the footprints of transistors, while keeping the drive current substantially matched to what it would have been without angling. Thus, memory arrays with backside components and angled transistors provide a promising way to increasing densities of memory cells on the limited real estate of semiconductor chips and/or decreasing adverse effects associated with continuous scaling of IC components.

Embodiments of the present disclosure are further based on recognition that memory arrays with backside components and angled transistors may be optimized even further if transistors are to be operated at relatively low temperatures, where, as used herein, low-temperature operation (or "lower-temperature" operation) refers to operation at temperatures below room temperature, e.g., below 200 Kelvin degrees or lower. Thermal energy is much lower at low temperatures and, consequently, the off-current (Ioff) of a transistor is much lower and the subthreshold swing is much sharper, compared to room temperature operation. Consequently, if a transistor is operated at low temperatures, its gate length can be shorter than what can be achieved at room temperatures, while keeping the short-channel effects at a level that does not significantly compromise transistor performance. As a result, at low temperatures, it may be possible to further decrease footprints of the transistor arrangements described herein, thereby decreasing their effective gate lengths, while still maintaining adequate performance.

In the following detailed description, various aspects of the illustrative implementations may be described using terms commonly employed by those skilled in the art to convey the substance of their work to others skilled in the art. For example, the term "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via). In yet another example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," "sulfide," etc. refer to compounds containing, respectively, oxygen, carbon, nitrogen, sulfur, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−10%, e.g., within +/−5% or within +/−2%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−8% of a target value, e.g., within +/−5% of a target value or within +/−2% of a target value, based on the context of a particular value as described herein or as known in the art.

The term "interconnect" may refer to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "metal traces," "lines," "metal lines," "wires," "metal wires," "trenches," or "metal trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PIC. In such cases, the term "interconnect" may refer to optical waveguides (e.g., structures that guide and confine light waves), including optical fiber, optical splitters, optical combiners, optical couplers, and optical vias.

The terms "over," "under," "between," and "on" as used herein refer to a relative spatial position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, analogous elements designated in the present drawings with different reference numerals after a dash, e.g., edges 303-1, 303-2, 303-3, and 303-4, may be collectively referred to together without the reference numerals after the dash, e.g., as "edges 303." Similarly, analogous elements designated in the present drawings with different a letter after a reference numeral, e.g., IC devices 600A, 600B, and 600C, may be collectively referred to together without the letter, e.g., as "IC devices 600." A plurality of drawings with the same number and different letters may be referred to without the letters, e.g., FIGS. 6A-6E may be referred to as "FIG. 6." In order to not clutter the drawings, if multiple instances of certain elements are illustrated in a given drawing, only some of the elements may be labeled with a reference sign.

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using, e.g., Physical Failure Analysis (PFA) would allow determination of presence of memory arrays with backside components and angled transistors as described herein.

Various memory arrays with backside components and angled transistors as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Recently, FETs with non-planar architectures, such as FinFETs (also sometimes referred to as "wrap around gate transistors" or "tri-gate transistors") and nanoribbon/nanowire transistors (also sometimes referred to as "gate all-around (GAA) transistors"), have been extensively explored as alternatives to transistors with planar architectures.

In a FinFET, an elongated semiconductor structure (e.g., an elongated structure that includes one or more semiconductor materials) shaped as a fin extends away from a base (e.g., from a semiconductor substrate or any suitable support structure). A portion of a fin that is closest to the base may be enclosed by an insulator material. Such an insulator material, typically an oxide, is commonly referred to as a "shallow trench isolation" (STI), and the portion of the fin enclosed by the STI is referred to as a "subfin portion" or simply a "subfin." A gate stack may wrap around an upper portion of the fin (e.g., the portion farthest away from the base). The portion of the fin around which the gate stack wraps is referred to as a "channel region" (or, alternatively, as a "channel portion" or simply a "channel") of a FinFET. A semiconductor material of the channel region is commonly referred to as a "channel material" of the transistor. FinFETs are sometimes referred to as "tri-gate transistors" because, in use, such transistors may form conducting channels on three "sides" of the channel region of the fin. A source region and a drain region may be provided in the fin on the opposite sides of the gate stack, forming, respectively, a source and a drain of a FinFET.

In a nanoribbon transistor, a gate stack may be provided around a portion of an elongated semiconductor structure called "nanoribbon", forming a gate on all sides of the nanoribbon. The "channel" or the "channel region" of a nanoribbon transistor is the portion of the nanoribbon around which the gate stack wraps. Such transistors are sometimes referred to as "GAA transistors" because, in use, such transistors may form conducting channels on all "sides" of the channel region of the nanoribbon. A source region and a drain region are provided in the nanoribbon on each side of the gate stack, forming, respectively, a source and a drain of a nanoribbon transistor. In some settings, the term "nanoribbon" has been used to describe an elongated semiconductor structure that has a substantially rectangular transverse cross-section (e.g., a cross-section in a plane perpendicular to the longitudinal axis of the structure), while the term "nanowire" has been used to describe a similar structure but with a substantially circular or square transverse cross-sections. In the following, a single term "nanoribbon transistor" is used to describe all non-planar transistors where a gate stack wraps around substantially all sides of an elongated semiconductor structure, independent of the shape of the transverse cross-section. Thus, as used herein, the term "nanoribbon transistor" is used to cover transistors with elongated semiconductor structures that have substantially rectangular transverse cross-sections (possibly with rounded corners), transistors with elongated semiconductor structures that have substantially square transverse cross-sections (possibly with rounded corners), transistors with elongated semiconductor structures that have substantially circular or elliptical/oval transverse cross-sections, as well as transistors with elongated semiconductor structures that have any polygonal transverse cross-sections.

Figure 2:
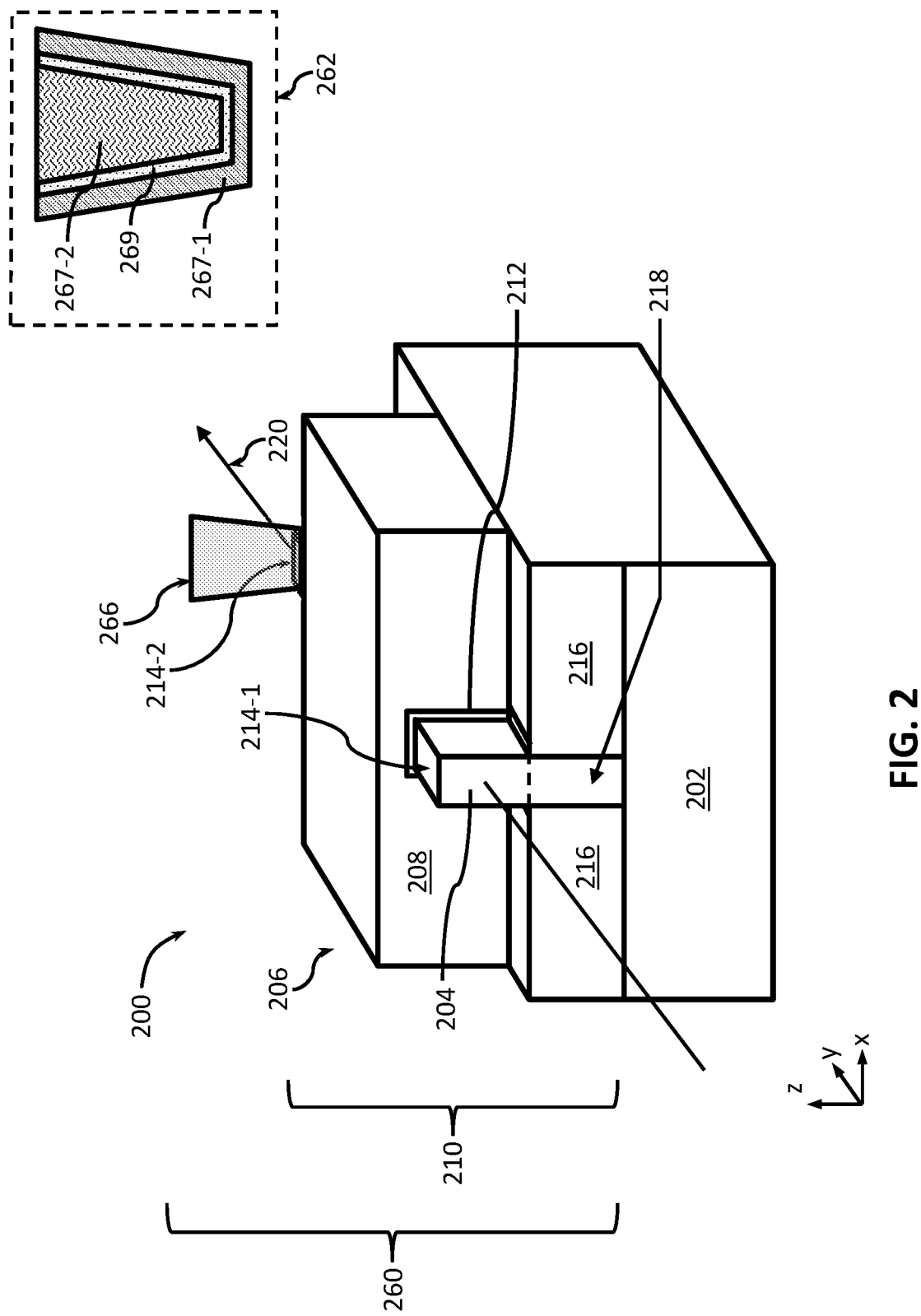
FIG. 2 provides a perspective view of an example IC device implementing a fin-based field-effect transistor (FinFET), in accordance with some embodiments.

An example of a nanoribbon transistor is shown in FIG. 1, while an example of a FinFET is shown in FIG. 2. However, although in the following, some descriptions may be provided with respect to FinFETs and nanoribbon transistors, embodiments of the present disclosure, in particular various embodiments of memory arrays with backside components and angled transistors, are applicable to transistors of other architectures, such as planar transistors.

As the foregoing illustrates, both FinFETs and nanoribbon transistors are built based on elongated semiconductor structures (in the following referred to, simply, as "elongated structures"), e.g., fins or nanoribbons, respectively. A longitudinal axis of such an elongated structure may be defined as an axis that includes a line along the direction of carrier transport between source and drain regions of the transistor. Typically, such an axis is substantially parallel to the support structure on/in which a transistor resides and is one of lines of symmetry for the elongated structure of the transistor (at least for the idealized version of the transistor that does not reflect unintended manufacturing variations that may affect the real-life geometry of the transistor). Conventionally, FinFETs and nanoribbon transistors are oriented on a support structure so that the direction of their carrier transport (which direction may be represented by the longitudinal axes of their elongated structures), is parallel to the front and back sides/faces/planes of the support structure and is either perpendicular or parallel to different edges of the support structure, in particular, being either perpendicular or parallel to different edges of the front face or the back face of the support structure. The gates of such transistors are then oriented so that an angle between a projection of a gate of a given transistor onto a plane of the support structure and a projection of the longitudinal axis of an elongated structure onto said plane is 90 degrees (e.g., the gates extend in directions perpendicular to longitudinal axes of elongated structures). In contrast to such conventional implementations, in some embodiments of the present disclosure, transistors may be implemented as transistors having their longitudinal axes being at an angle other than 0 or 90 degrees with respect to one or more edges of the corresponding support structure.

FIG. 1 provides a perspective view of an example IC device 100 implementing a nanoribbon transistor 110, in accordance with some embodiments. The nanoribbon transistor 110 is one example of a transistor that may be implemented as an access transistor of a memory array with backside components and angled transistors as described herein. Because FIG. 1 is provided to assist explanations of what, in general, a nanoribbon transistor is, it does not illustrate a gate angled with respect to the direction of carrier transport of the transistor 110. Rather, FIG. 1 shows a conventional gate that is not angled with respect to the direction of carrier transport of the transistor, with subsequent drawings showing illustrations of angled transistors (e.g., FIG. 3 and FIG. 12). The same applies to FIG. 2.

Turning to the details of FIG. 1, the IC device 100 may include a semiconductor material, which may include one or more semiconductor materials, formed as a nanoribbon 104 (e.g., an elongated structure) extending substantially parallel to a support structure 102. The transistor 110 may be formed on the basis of the nanoribbon 104 by having a gate stack 106 at least partially wrap around a portion of the nanoribbon referred to as a "channel region" and by having source and drain regions, shown in FIG. 1 as a first S/D region 114-1 and a second S/D region 114-2, on either side of the gate stack 106. In some embodiments, a layer of oxide material (not specifically shown in FIG. 1) may be provided between the support structure 102 and the gate stack 106.

The IC device 100 shown in FIG. 1, as well as IC devices shown in other drawings of the present disclosure, are intended to show some of the components therein, and these IC devices, or portions thereof, may include other components that are not illustrated. For example, although not specifically illustrated in FIG. 1, a dielectric spacer may be provided between a first S/D contact (not shown in FIG. 1) that may be coupled to a first S/D region 114-1 of the transistor 110 and the gate stack 106 as well as between a second S/D contact (also not shown in FIG. 1) that may be coupled to a second S/D region 114-2 of the transistor 110 and the gate stack 106 in order to provide electrical isolation between the source, gate, and drain contacts (in general, such contacts may also be referred to as "electrodes"). In another example, although not specifically illustrated in FIG. 1, at least portions of the transistor 110 may be surrounded in an insulator material, such as any suitable interlayer dielectric (ILD) material. In some embodiments, such an insulator material may be a high-k dielectric including elements such as hafnium, silicon, oxygen, titanium, tantalum, lanthanum, aluminum, zirconium, barium, strontium, yttrium, lead, scandium, niobium, and zinc. Examples of high-k materials that may be used for this purpose may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In other embodiments, the insulator material surrounding portions of the transistor 110 may be a low-k dielectric material. Some examples of low-k dielectric materials include, but are not limited to, silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass. Similar considerations are applicable to other IC devices shown in the present drawings, e.g., those shown in FIGS. 2-3 and FIGS. 7-11.

Implementations of the present disclosure may be formed or carried out on any suitable support structure 102, such as a substrate, a die, a wafer, or a chip. The support structure 102 may, e.g., be the wafer 2000 of FIG. 14, discussed below, and may be, or be included in, a die, e.g., the singulated die 2002 of FIG. 14, discussed below. The support structure 102 may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (e.g., materials from groups III and V of the periodic system of elements), group II-VI (e.g., materials from groups II and IV of the periodic system of elements), or group IV materials (e.g., materials from group IV of the periodic system of elements). In some embodiments, the substrate may be non-crystalline. In some embodiments, the support structure 102 may be a printed circuit board (PCB) substrate. Although a few examples of materials from which the support structure 102 may be formed are described here, any material that may serve as a foundation upon which an IC device with memory arrays with backside components and angled transistors as described herein may be built falls within the spirit and scope of the present disclosure. As used herein, the term "support structure" does not necessarily mean that it provides mechanical support for the IC devices/structures (e.g., transistors, capacitors, interconnects, and so on) built thereon. For example, some other structure (e.g., a carrier substrate or a package substrate) may provide such mechanical support and the support structure 102 may provide material "support" in that, e.g., the IC devices/structures are build based on the semiconductor materials of the support structure 102. However, in some embodiments, the support structure 102 may provide mechanical support.

The nanoribbon 104 may take the form of a nanowire or nanoribbon, for example. In some embodiments, an area of a transverse cross-section of the nanoribbon 104 (e.g., an area in the x-z plane of the example coordinate system x-y-z shown in FIG. 1) may be between about 25 and 10000 square nanometers, including all values and ranges therein (e.g., between about 25 and 1000 square nanometers, or between about and 500 square nanometers). The transverse cross-section of the nanoribbon 104 is cross-section along a plane perpendicular to a longitudinal axis 120 of the nanoribbon 104, where the longitudinal axis 120 may, e.g., be along the y-axis of the example coordinate system shown in FIG. 1. In some embodiments, a width of the nanoribbon 104 (e.g., a dimension measured in a plane parallel to the support structure 102 and in a direction perpendicular to the longitudinal axis 120, e.g., along the x-axis of the example coordinate system shown FIG. 1) may be at least about 3 times larger than a thickness (or a "height") of the nanoribbon 104 (e.g., a dimension measured in a plane perpendicular to the support structure 102, e.g., along the z-axis of the example coordinate system shown in FIG. 1), including all values and ranges therein, e.g., at least about 4 times larger, or at least about 5 times larger. It should be noted that FIG. 1 illustrates the x-y-z coordinate system being aligned so that the longitudinal axis 120 is along the y-axis and the gate being aligned along the x-axis only for the ease of explanations of this particular drawing. However, for nanoribbon transistors that are implemented as angled transistors as described herein, the longitudinal axis 120 would be in the x-y plane but angled (e.g., at an angle between about 10 and 80 degrees) with respect to the y-axis.

Although the nanoribbon 104 illustrated in FIG. 1 is shown as having a rectangular cross-section, the nanoribbon 104 may instead have a cross-section that is rounded at corners or otherwise irregularly shaped, and the gate stack 106 may conform to the shape of the nanoribbon 104. The terms "front face" and "back face" of a nanoribbon may refer to the faces of the nanoribbon 104 that are substantially parallel to the support structure 102, the term "sidewall" (or "side face") of a nanoribbon may refer to the opposing faces of the nanoribbon 104 that are substantially perpendicular to the support structure 102 and extend in a direction of the longitudinal axis 120 of the nanoribbon 104, while the term "end" of a nanoribbon may refer to the opposing faces of the nanoribbon 104 that are substantially perpendicular to the longitudinal axis 120 of the nanoribbon 104.

The nanoribbon 104 may be formed of one or more semiconductor materials, together referred to as a "channel material." In general, channel materials of any of the transistors described herein, e.g., the channel material of the transistor 110, may be composed of semiconductor material systems including, for example, N-type or P-type materials systems. In some embodiments, the channel material may include a substantially monocrystalline semiconductor, such as silicon (Si) or germanium (Ge). In some embodiments, the channel material may include a compound semiconductor with a first sub-lattice of at least one element from group III of the periodic table (e.g., Al, Ga, In), and a second sub-lattice of at least one element of group V of the periodic table (e.g., P, As, Sb). In some embodiments, the channel material may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material may include a combination of semiconductor materials.

For some example N-type transistor embodiments (e.g., for the embodiments where the transistor is an N-type metal-oxide-semiconductor (NMOS) transistor), the channel material may include a III-V material having a relatively high electron mobility, such as, but not limited to InGaAs, InP, InSb, and InAs. For some such embodiments, the channel material may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). For some example P-type transistor embodiments (e.g., for the embodiments where the transistor in which the channel material is included is a P-type metal-oxide-semiconductor (PMOS) transistor), the channel material may advantageously be a group IV material having a high hole mobility, such as, but not limited to Ge or a Ge-rich SiGe alloy. For some example embodiments, the channel material may have a Ge content between 0.6 and 0.9, and advantageously may be at least 0.7.

In some embodiments, the channel material may be a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the channel material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc.

As noted above, the channel material may include IGZO. IGZO-based devices have several desirable electrical and manufacturing properties. IGZO has high electron mobility compared to other semiconductors, e.g., in the range of 20-50 times than amorphous silicon. Furthermore, amorphous IGZO (a-IGZO) transistors are typically characterized by high band gaps, low-temperature process compatibility, and low fabrication cost relative to other semiconductors. IGZO can be deposited as a uniform amorphous phase while retaining higher carrier mobility than oxide semiconductors such as zinc oxide. Different formulations of IGZO include different ratios of indium oxide, gallium oxide, and zinc oxide. One particular form of IGZO has the chemical formula $InGaO_3(ZnO)_5$. Another example form of IGZO has an indium:gallium:zinc ratio of 1:2:1. In various other examples, IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10). IGZO can also contain tertiary dopants such as aluminum or nitrogen.

In some embodiments, any of the transistors that may be implemented as access transistors of memory cells as described herein, e.g., the transistor 110, may be a thin-film transistor (TFT). A TFT is a special kind of a FET made by depositing active semiconductor material over a support (e.g., a support structure as described above) that may be a non-conducting support. Some such materials may be deposited at relatively low temperatures, which allows depositing them within the thermal budgets imposed on back-end fabrication to avoid damaging the front-end components such as the logic devices of an IC device in which the transistor may be included. Thus, in some embodiments, the channel material of any of the transistors described herein, e.g., the transistor 110, may be a semiconductor material deposited at relatively low temperatures, and may include any of the oxide semiconductor materials described above.

In other embodiments, instead of being deposited at relatively low temperatures as described above with reference to the TFTs, the channel material of any of the transistors described herein, e.g., the transistor 110, may be epitaxially grown in what typically involves relatively high-temperature processing. In such embodiments, the channel material may include any of the semiconductor materials described above, including oxide semiconductor materials. In some such embodiments, the channel material may be epitaxially grown directly on a semiconductor layer of a support structure over which the transistor will be fabricated, in a process known as "monolithic integration." In other such embodiments, the channel material may be epitaxially grown on a semiconductor layer of another support structure and then the epitaxially grown layer of the channel material may be transferred, in a process known as a "layer transfer," to a support structure over which the transistor will reside, in which case the latter support structure may but does not have to include a semiconductor layer prior to the layer transfer. Layer transfer advantageously allows forming transistors, such as FinFETs or nanoribbon transistors, over support structures or in layers that do not include semiconductor materials (e.g., in the back end of an IC device). Layer transfer also advantageously allows forming transistors of any architecture (e.g., non-planar or planar transistors) without imposing the negative effects of the relatively high-temperature epitaxial growth process on devices that may already be present over a support structure.

A channel material that is deposited at relatively low temperatures is typically a polycrystalline, polymorphous, or amorphous semiconductor, or any combination thereof. A channel material that is epitaxially grown is typically a highly crystalline (e.g., monocrystalline or single-crystalline) material. Therefore, whether the channel material of any of the transistors described herein, is deposited at relatively low temperatures or epitaxially grown can be identified by inspecting grain size of the active portions of the channel material (e.g., of the portions of the channel material that form channels of transistors). An average grain size of a channel material of a transistor being between about 0.5 and 1 millimeters (in which case the material may be polycrystalline) or smaller than about 0.5 millimeter (in which case the material may be polymorphous or amorphous) may be indicative of the channel material having been deposited (e.g., if the transistor in which such a channel material is included is a TFT). On the other hand, an average grain size of a channel material of a transistor being equal to or greater than about 1 millimeter (in which case the material may be a single-crystal material) may be indicative of the channel material having been epitaxially grown and included in the final device either by monolithic integration or by layer transfer.

In some embodiments, the channel material of any of the transistors described herein, e.g., the transistor 110, may include a two-dimensional (2D) semiconductor material, e.g., a semiconductor material with a thickness of a few nanometers or less, where electrons in the material are free to move in the 2D plane but their restricted motion in the third direction is governed by quantum mechanics. In some such embodiments, such a channel material may include a single atomic monolayer of a 2D semiconductor material, while, in other such embodiments, such a channel material may include five or more atomic monolayers of a 2D semiconductor material. Examples of 2D materials that may be used to implement the channel material of any of the transistors described herein include, but are not limited to, graphene, hexagonal boron nitride, or transition-metal chalcogenides.

A gate stack 106 including a gate electrode material 108 and, optionally, a gate insulator 112, may wrap entirely or almost entirely around a portion of the nanoribbon 104 as shown in FIG. 1, with the channel region of the transistor 110 being the active region (channel region) of the channel material in the portion of the nanoribbon 104 wrapped by the gate stack 106. The gate insulator 112 is not shown in the perspective drawing of the IC device 100 shown in FIG. 1 but is shown in an inset 130 of FIG. 1, providing a cross-sectional side view of a portion of the nanoribbon 104 with a gate stack 106 wrapping around it. As shown in FIG. 1, the gate insulator 112 may wrap around a transversal portion/cross-section of the nanoribbon 104, and the gate electrode material 108 may wrap around the gate insulator 112.

The gate electrode material 108 may include at least one P-type work function metal or N-type work function metal, depending on whether the transistor 110 is a PMOS transistor or an NMOS transistor. P-type work function metal may be used as the gate electrode material 108 when the transistor 110 is a PMOS transistor and N-type work function metal may be used as the gate electrode material 108 when the transistor 110 is an NMOS transistor. For a PMOS transistor, metals that may be used for the gate electrode material 108 may include, but are not limited to, ruthenium, palladium, platinum, cobalt, nickel, and conductive metal oxides (e.g., ruthenium oxide). For an NMOS transistor, metals that may be used for the gate electrode material 108 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode material 108 may include a stack of two or more metal layers, where one or more metal layers are work function metal layers and at least one metal layer is a fill metal layer. Further layers may be included next to the gate electrode material 108 for other purposes, such as to act as a diffusion barrier layer or/and an adhesion layer.

In some embodiments, the gate insulator 112 may include one or more high-k dielectrics including any of the materials discussed herein with reference to the insulator material that may surround portions of the transistor 110. In some embodiments, an annealing process may be carried out on the gate insulator 112 during manufacture of the transistor 110 to improve the quality of the gate insulator 112. The gate insulator 112 may have a thickness that may, in some embodiments, be between about 0.5 nanometers and 3 nanometers, including all values and ranges therein (e.g., between about 1 and 3 nanometers, or between about 1 and 2 nanometers), although, in other embodiments, the thickness of the gate insulator 112 may be greater than 3 nanometers. In some embodiments, the gate stack 106 may be surrounded by a gate spacer, not shown in FIG. 1. Such a gate spacer would be configured to provide separation between the gate stack 106 and source/drain contacts of the transistor 110 and could be made of a low-k dielectric material, some examples of which have been provided above. A gate spacer may include pores or air gaps to further reduce its dielectric constant.

In some embodiments, the gate insulator 112 may include a hysteretic material or a hysteretic arrangement, which, together, may be referred to as a "hysteretic element." Transistors 110 in which the gate insulator 124 includes a hysteretic element may be described as "hysteretic transistors" and may be used to implement hysteretic memory. Hysteretic memory refers to a memory technology employing hysteretic materials or arrangements, where a material or an arrangement may be described as hysteretic if it exhibits the dependence of its state on the history of the material (e.g., on a previous state of the material). Ferroelectric (FE) and antiferroelectric (AFE) materials are examples of hysteretic materials. Layers of different materials arranged in a stack to exhibit charge-trapping phenomena is an example of a hysteretic arrangement.

A FE or an AFE material is a material that exhibits, over some range of temperatures, spontaneous electric polarization, e.g., displacement of positive and negative charges from their original position, where the polarization can be reversed or reoriented by application of an electric field. In particular, an AFE material is a material that can assume a state in which electric dipoles from the ions and electrons in the material may form a substantially ordered (e.g., substantially crystalline) array, with adjacent dipoles being oriented in opposite (antiparallel) directions (e.g., the dipoles of each orientation may form interpenetrating sub-lattices, loosely analogous to a checkerboard pattern), while a FE material is a material that can assume a state in which all of the dipoles point in the same direction. Because the displacement of the charges in FE and AFE materials can be maintained for some time even in the absence of an electric field, such materials may be used to implement memory cells. Because the current state of the electric dipoles in FE and AFE materials depends on the previous state, such materials are hysteretic materials. Memory technology where logic states are stored in terms of the orientation of electric dipoles in (e.g., in terms of polarization of) FE or AFE materials is referred to as "FE memory," where the term "ferroelectric" is said to be adopted to convey the similarity of FE memories to ferromagnetic memories, even though there is typically no iron (Fe) present in FE or AFE materials.

A stack of alternating layers of materials that is configured to exhibit charge-trapping is an example of a hysteretic arrangement. Such a stack may include as little as two layers of materials, one of which is a charge-trapping layer (e.g., a layer of a material configured to trap charges when a voltage is applied across the material) and the other one of which is a tunneling layer (e.g., a layer of a material through which the charge is to be tunneled to the charge-trapping layer). The tunneling layer may include an insulator material such as a material that includes silicon and oxygen (e.g., silicon oxide), or any other suitable insulator. The charge-trapping layer may include a metal or a semiconductor material that is configured to trap charges. Because the trapped charges may be kept in a charge-trapping arrangement for some time even in the absence of an electric field, such arrangements may be used to implement memory cells. Because the presence and/or the number of trapped charges in a charge-trapping arrangement depends on the previous state, such arrangements are hysteretic arrangements. Memory technology where logic states are stored in terms of the amount of charge trapped in a hysteretic arrangement may be referred to as "charge-trapping memory."

Hysteretic memories have the potential for adequate non-volatility, short programming time, low power consumption, high endurance, and high-speed writing. In addition, hysteretic memories may be manufactured using processes compatible with the standard complementary metal-oxide-semiconductor (CMOS) technology. Therefore, over the last few years, these types of memories have emerged as promising candidates for many growing applications.

In some embodiments, the hysteretic element of the gate insulator 112 may be provided as a layer of a FE or an AFE material. Such an FE/AFE material may include one or more materials that can exhibit sufficient FE/AFE behavior even at thin dimensions, e.g., such as an insulator material at least about 5%, e.g., at least about 7% or at least about 10%, of which is in an orthorhombic phase and/or a tetragonal phase (e.g., as a material in which at most about 95-90% of the material may be amorphous or in a monoclinic phase). For example, such materials may be based on hafnium and oxygen (e.g., hafnium oxides), with various dopants added to ensure sufficient amount of an orthorhombic phase or a tetragonal phase. Some examples of such materials include materials that include hafnium, oxygen, and zirconium (e.g., hafnium zirconium oxide (HfZrO, also referred to as HZO)), materials that include hafnium, oxygen, and silicon (e.g., silicon-doped (Si-doped) hafnium oxide), materials that include hafnium, oxygen, and germanium (e.g., germanium-doped (Ge-doped) hafnium oxide), materials that include hafnium, oxygen, and aluminum (e.g., aluminum-doped (Al-doped) hafnium oxide), and materials that include hafnium, oxygen, and yttrium (e.g., yttrium-doped (Y-doped) hafnium oxide). However, in other embodiments, any other materials which exhibit FE/AFE behavior at thin dimensions may be used as the hysteretic element and are within the scope of the present disclosure.

In other embodiments, the hysteretic element of the gate insulator 112 may be provided as a stack of alternating layers of materials that can trap charges. In some such embodiments, the stack may be a two-layer stack, where one layer is a charge-trapping layer and the other layer is a tunneling layer. The tunneling layer may include an insulator material such as a material that includes silicon and oxygen (e.g., silicon oxide), or any other suitable insulator. The charge-trapping layer may include an electrically conductive material such as a metal, or a semiconductor material. In some embodiments, the charge-trapping layer may include a sub-stoichiometric material (e.g., a material that includes less than a stochiometric amount of a reagent). The sub-stoichiometric material may include vacancies in concentration of at least about $10^{18}$ vacancies per cubic centimeter, e.g., in concentration between about $10^{18}$ vacancies per cubic centimeter and about $10^{22}$-$10^{23}$ vacancies per cubic centimeter. As known in the art, vacancies refer to cites where atoms (e.g., oxygen or nitrogen) that should be present are missing, thus providing a defect in a material. For example, the sub-stoichiometric material of any of the hysteretic elements described herein may include oxygen and the vacancies may be oxygen vacancies, or the sub-stoichiometric material may include nitrogen and the vacancies may be nitrogen vacancies. During operation, charges may be trapped in the vacancies of the sub-stoichiometric material. Thus, implementing a sub-stoichiometric material with vacancies is one way to provide a charge-trapping layer of a hysteretic arrangement. In general, any material that has defects that can trap charge may be used in/as a charge-trapping layer. Such defects are very detrimental to operation of logic devices and, therefore, typically, deliberate steps need to be taken to avoid presence of the defects. However, for memory devices, such defects may be desirable because charge-trapping may be used to represent different memory states of a memory cell.

In some embodiments of the hysteretic element being provided as a stack of alternating layers of materials that can trap charges, the stack may be a three-layer arrangement where an insulator material is provided on both sides of a charge-trapping layer. In such embodiments, a layer of an insulator material on one side of the charge-trapping layer may be referred to as a "tunneling layer" while a layer of an insulator material on the other side of the charge-trapping layer may be referred to as a "field layer."

In various embodiments of the hysteretic element being provided as a stack of alternating layers of materials that can trap charges, a thickness of each layer the stack may be between about 0.5 and 10 nanometers, including all values and ranges therein, e.g., between about 0.5 and 5 nanometers. In some embodiment of a three-layer stack, a thickness of each layer of the insulator material may be about 0.5 nanometers, while a thickness of the charge-trapping layer may be between about 1 and 8 nanometers, e.g., between about 2.5 and 7.5 nanometers, e.g., about 5 nanometers. In some embodiments, a total thickness of the hysteretic element provided as a stack of alternating layers of materials that can trap charges (e.g., a hysteretic arrangement) may be between about 1 and 10 nanometers, e.g., between about 2 and 8 nanometers, e.g., about 6 nanometers.

Turning to the S/D regions 114 of the transistor 110, in some embodiments, the S/D regions may be highly doped, e.g., with dopant concentrations of about $10^{21}$ dopants per cubic centimeter, in order to advantageously form Ohmic contacts with the respective S/D electrodes, although these regions may also have lower dopant concentrations and may form Schottky contacts in some implementations. Irrespective of the exact doping levels, the S/D regions of a transistor may be the regions having dopant concentration higher than in other regions, e.g., higher than a dopant concentration in the channel region (e.g., in a channel material extending between the first S/D region 114-1 and the second S/D region 114-2), and, therefore, may be referred to as "highly doped" (HD) regions. The channel region of the transistor 110 may include semiconductor materials with doping concentrations significantly smaller than those of the S/D regions 114.

The S/D regions 114 of the transistor 110 may generally be formed using either an implantation/diffusion process or an etching/deposition process. In the former process, dopants such as boron, aluminum, antimony, phosphorous, or arsenic may be ion-implanted into the nanoribbon 104 to form the source and drain regions. An annealing process that activates the dopants and causes them to diffuse further into the nanoribbon 104 may follow the ion implantation process. In the latter process, portions of the nanoribbon 104 may first be etched to form recesses at the locations of the future S/D regions 114. An epitaxial deposition process may then be carried out to fill the recesses with material that is used to fabricate the S/D regions 114. In some implementations, the S/D regions 114 may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions 114 may be formed using one or more alternate semiconductor materials such as germanium or a group III-V material or alloy. And in further embodiments, one or more layers of metal and/or metal alloys may be used to form the S/D regions 114. In some embodiments, a distance between the first and second S/D regions 114 (e.g., a dimension measured along the longitudinal axis 120 of the nanoribbon 104) may be between about 5 and 40 nanometers, including all values and ranges therein (e.g., between about 22 and 35 nanometers, or between about 20 and 30 nanometers).

As shown in FIG. 1, the transistor 110 may be a part of a 1T-1C memory cell 160 that further includes a capacitor 166, electrically coupled to the S/D region 114-2 of the transistor 110. In general, the capacitor 166 may include two electrodes 167-1 and 167-2, separated by a memory material 169. One example of an arrangement of the electrodes 167 and the memory material 169 of the capacitor 166 is schematically illustrated within the dashed contour of an inset 162 of FIG. 1, showing that the capacitor 166 may be a metal-insulator-metal (MIM) cylindrical capacitor. However, in other embodiments, the spatial arrangement of the memory material 169 and the electrodes 167 may be different as long as the memory material 169 is spatially between the electrode 167-1 and the electrode 167-2 (e.g., the capacitor 166 may include a vertical stack of the first electrode 167-1, the memory material 169, and the second electrode 167-2). The memory material 169 may be any suitable material that can put into a target state by applying an electric field or energy (e.g., positive or negative voltage or current pulses) to one or both electrodes 167 of the capacitor 166 for a particular duration, thus programming the capacitor 166 to a target data state (e.g., corresponding to a particular charged stored on the capacitor 166 or corresponding to a particular resistance state of the capacitor 166). Such a capacitor 166 may be electrically coupled to the S/D region 114-2 by coupling the electrode 167-1 of the capacitor 166 to the S/D region 114-2 (e.g., in some embodiments, the electrode 167-1 of the capacitor 166 and a contact to the S/D region 114-2 may be a shared contact of a suitable electrically conductive material). In some embodiments, the memory material 169 of the capacitor 166 may be a dielectric material. In other embodiments, the memory material 169 may be a hysteretic element, e.g., as described above with reference to the embodiments where the gate insulator 112 is a hysteretic element.

FIG. 2 provides a perspective view of an example IC device 200 implementing a FinFET 210, in accordance with some embodiments. The FinFET 210 is another example of a transistor that may be implemented as an access transistor of a memory array with backside components and angled transistors as described herein.

Turning to the details of FIG. 2, the IC device 200 may include a semiconductor material, which may include one or more semiconductor materials, formed as a fin 204 extending away from a support structure 202. A FinFET 210 may be formed on the basis of the fin 204 by having a gate stack 206 at least partially wrap around a channel region of the fin 204 and by having source and drain regions, shown in FIG. 2 as a first S/D region 214-1 and a second S/D region 214-2, on either side of the gate stack 206. As shown in FIG. 2, the gate stack 206 includes a gate electrode material 208 and a gate insulator 212, each of which wraps entirely or almost entirely around the channel region of the fin 204, although in other embodiments of the IC device 200 the gate insulator 212 may be absent. Descriptions provided above with reference to the support structure 102, the gate stack 106, the gate electrode material 108, the gate insulator 112, and the S/D regions 114 are applicable to, respectively, the support structure 202, the gate stack 206, the gate electrode material 208, the gate insulator 212, and the S/D regions 214, and, therefore, in the interests of brevity, are not repeated. FIG. 2 further illustrates an STI 216, enclosing sidewalls of a subfin portion 218 of the fin 204. The STI 216 may include any of the insulator materials described above, e.g., any suitable ILD materials. Descriptions provided above with reference to the channel material of the transistor 110 are applicable to the semiconductor material of at least a channel region of the fin 204 (e.g., of at least a portion of the fin 204 wrapped by the gate stack 206) and, therefore, in the interests of brevity, are not repeated.

A longitudinal axis 220 of the fin 204 may be along the y-axis of the example coordinate system shown in the present drawings. The FinFET 210 may have a gate length (e.g., a distance between the first and second S/D regions 214-1, 214-2), a dimension measured along the longitudinal axis 220, which may, in some embodiments, be between 2 and 60 nanometers, including all values and ranges therein (e.g., between 5 and 20 nanometers, or between 5 and 30 nanometers). Although the fin 204 is illustrated in FIG. 2 as having a rectangular cross-section in an x-z plane, the fin 204 may instead have a cross-section that is rounded or sloped at the "top" of the fin 204, and the gate stack 206 may conform to this rounded or sloped fin 204. In use, the FinFET 210 may form conducting channels on three "sides" of the fin 204, potentially improving performance relative to single-gate transistors (which may form conducting channels on one "side" of a channel material or substrate) and double-gate transistors (which may form conducting channels on two "sides" of a channel material or substrate). It should be noted that, similar to FIG. 1, FIG. 2 illustrates the x-y-z coordinate system being aligned so that the longitudinal axis 220 is along the y-axis and the gate being aligned along the x-axis only for the ease of explanations of this particular drawing. However, for FinFETs that are implemented as angled transistors as described herein, the longitudinal axis 220 would be in the x-y plane but angled (e.g., at an angle between about 10 and 80 degrees) with respect to the y-axis.

An example of using the FinFET 210 as a part of a memory cell is illustrated in FIG. 2, showing that the IC device 200 may include a memory cell 260 that includes the FinFET 210 and a capacitor 266, electrically coupled to the S/D region 214-2. In some embodiments, the capacitor 266 may include two electrodes 267-1 and 267-2, separated by a memory material 269. One example of the electrodes 267 and the memory material 269 of the capacitor 266 is schematically illustrated within the dashed contour of an inset 262 of FIG. 2, although, in other embodiments, the spatial arrangement of the memory material 269 and the electrodes 267 may be different as long as the memory material 269 is spatially between the electrode 267-1 and the electrode 267-2 (e.g., the memory material 269 does not have to be a planar layer but may be arranged in any kind of a three-dimensional arrangement). Descriptions provided above with reference to the capacitor 166, the electrodes 167, and the memory material 169 are applicable to, respectively, the capacitor 266, the electrodes 267, and the memory material 269, and, therefore, in the interests of brevity, are not repeated.

Either the nanoribbon 104 or the fin 204 may be an elongated structure based on which any of the access transistors of a memory array with backside components and angled transistors as described herein may be built. In other words, any of the access transistors of a memory array with backside components and angled transistors as described herein may be implemented as, e.g., the transistor 110 or the FinFET 210.

Figure 3:
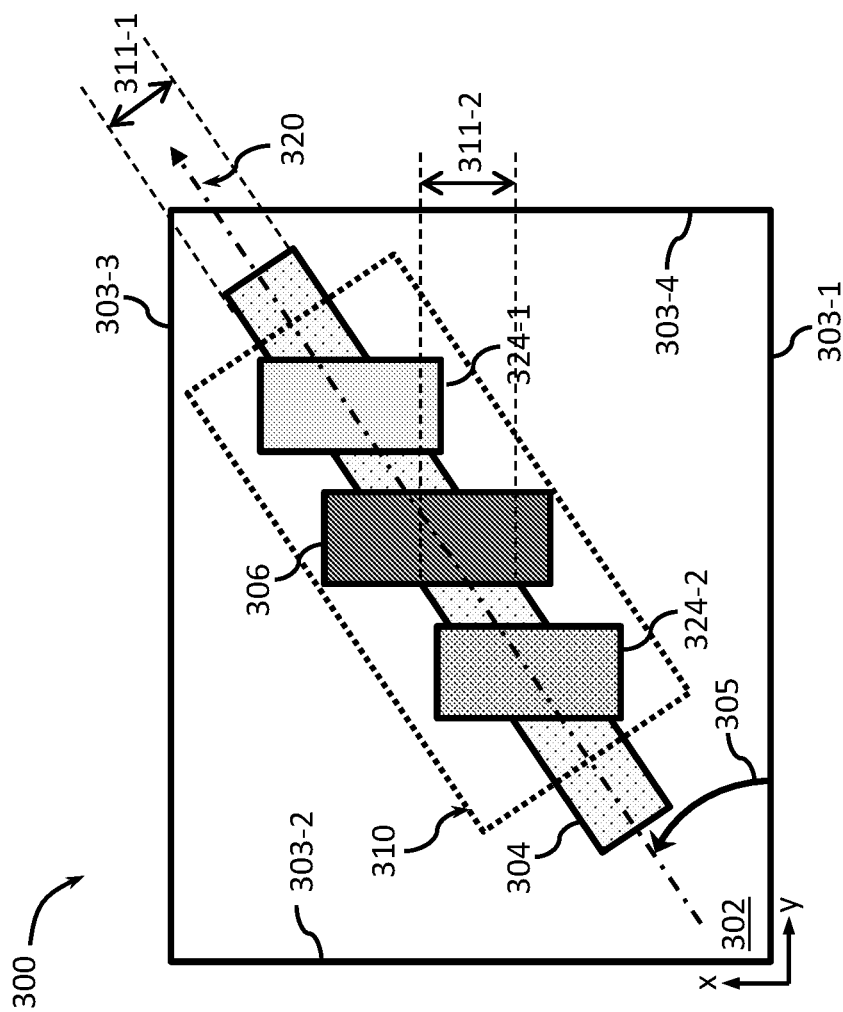
FIG. 3 provides a top-down view of an example IC device with an angled transistor, in accordance with some embodiments.

FIG. 3 provides a top-down view of an example IC device 300 with an angled transistor 310, in accordance with some embodiments. The top-down view of the IC device 300 shown in FIG. 3 is intended to show relative arrangements of some of the components therein, and the IC device 300, or portions thereof, may include other components that are not illustrated. For example, although not specifically illustrated in FIG. 3, the IC device 300 may include multiple transistors implemented in, or based on, the elongated structure 304, and/or may include gate spacers as known in the art. In another example, although not specifically illustrated in FIG. 3, at least portions of the elongated structure 304 may be surrounded in an insulator material, such as any of the ILD materials described above.

As shown in FIG. 3, the IC device 300 may include a support structure 302, which may include four edges 303, individually shown as an edge 303-1, 303-2, 303-3, and 303-4. The edges 303 may be edges of either the front side of the support structure 302 or the back side of the support structure 302, depending on whether the elongated structures 304 are provided on the front side or the back side of the support structure 302. The support structure 302 may be any of the support structures 102/202, described herein. The support structure 302 is, typically, rectangular and, therefore, adjacent ones of the edges 303 are at 90 degrees with respect to one another (e.g., the edges 303-1 and 303-2 are adjacent and at 90 degrees with respect to one another, the edges 303-2 and 303-3 are adjacent and at 90 degrees with respect to one another, and so on).

As shown in FIG. 3, an elongated structure 304 (but, typically, a plurality of such structures) may be provided over the support structure 302. In some embodiments, the elongated structure 304 may be the nanoribbon 104 or the fin 204, described herein. The elongated structure 304 shown in FIG. 3 is "angled" because its longitudinal axis 320 (shown in FIG. 3 as a dash-dotted arrow and being analogous to the longitudinal axes 120, 220, described above) is not at angles of either 0 degrees or 90 degrees with respect to the edges 303 of the support structure 302. As shown in FIG. 3, the longitudinal axis 320 may be at an angle 305 with respect to the y-axis of the example coordinate system shown, where the angle 305 may be between about 10 and 80 degrees. Thus, the transistor 310 (the approximate outline of which is shown in FIG. 3 to be within a dotted contour) is an angled transistor. The transistor 310 may be implemented as, e.g., the transistor 110 or 210, described above.

FIG. 3 illustrates the gate 306 as a non-angled gate (i.e., the gate 306 is at an angle of 90 degrees with respect to each of the edges 303-1 and 303-3 and is at an angle of 0 degrees with respect to each of the edges 303-2 and 303-4). As a result, the gate 306 is angled with respect to the direction of carrier transport of the transistor 310, as defined by the angled longitudinal axis 320. In other embodiments of the IC devices described herein, the gates 306 may be angled with respect to the edges 303, as long as they remain to be angled with respect to the direction of carrier transport of the transistors 310. Any of the gates 306 may be, or may include, any of the gate stacks 106/206, described herein.

FIG. 3 further illustrates that the transistor 310 may include first and second S/D contacts 324-1, 324-2. The first S/D contact 324-1 may be an electrical contact to the first S/D region of the transistor 310 (e.g., the first S/D region 114-1 or 214-1 of FIGS. 1-2), while the second S/D contact 324-2 may be an electrical contact to the second S/D region of the transistor 310 (e.g., the second S/D region 114-2 or 214-2 of FIGS. 1-2), and may include any suitable electrically conductive material, as known in the art. In particular, FIG. 3 illustrates an embodiment where the first and second S/D contacts 324-1, 324-2 may also be non-angled, e.g., may be at the same angle with respect to the edges 303 as the gate 306, although, in other embodiments of the IC devices described herein, the S/D contacts 324 may be angled. Irrespective of whether the S/D contacts 324 are angled, arranging the longitudinal axis 320 of the transistor 310 at an angle with respect to the gate 306 (e.g., arranging the longitudinal axis 320 so that it is not perpendicular to the gate 306) ensures that the cross-section for carrier transport between the first and second S/D regions of the transistor 310 is larger compared to what it would have been for a given width of the elongated structure 304 that is not angled with respect (e.g., perpendicular) to the gate 306, advantageously resulting in an increased drive current for the transistor 310. In particular, if the elongated structure 304 of the transistor 310 was perpendicular to the gate 306, as is done in conventional implementations, then the cross-section for carrier transport between the first and second S/D regions of the transistor 310 would be a cross-section in a plane perpendicular to the x-y plane of the example coordinate system shown in FIG. 3 with the dimension in the x-y plane being a dimension 311-1 (e.g., the width of the elongated structure 304). However, when the elongated structure 304 and the gate 306 are angled with respect to one another, e.g., as shown in FIG. 3, then the cross-section for carrier transport between the first and second S/D regions of the transistor 310 is a cross-section in a plane perpendicular to the x-y plane of the example coordinate system shown in FIG. 3 with the dimension in the x-y plane being a dimension 311-2 (e.g., the dimension along the x-axis of the example coordinate system shown). The dimension 311-2 is larger than the dimension 311-1 because the dimension 311-2 is the hypotenuse of a triangle in which the dimension 311-1 is a side of the triangle. Because for these two scenarios the dimension along the z-axis is the same (as defined by the height of the elongated structure 304 in the z-axis direction), increasing the dimension in the x-y plane leads to an increased cross-section and, thus, to an increased drive current for a given width of the elongated structure 304.

Figure 4:
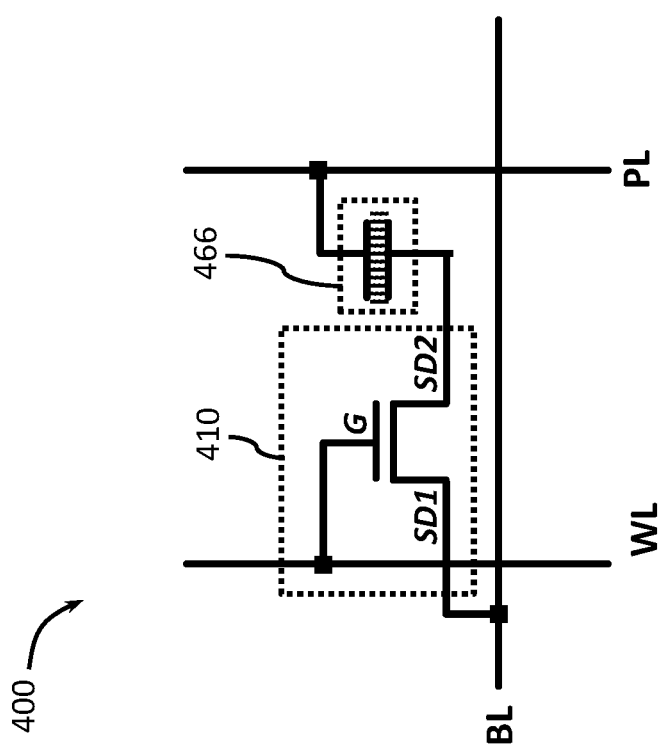
FIG. 4 provides an electric circuit diagram of a one transistor one capacitor (1T-1C) memory cell that may be implemented in a memory array with backside components and angled transistors, in accordance with some embodiments.
Figure 5:
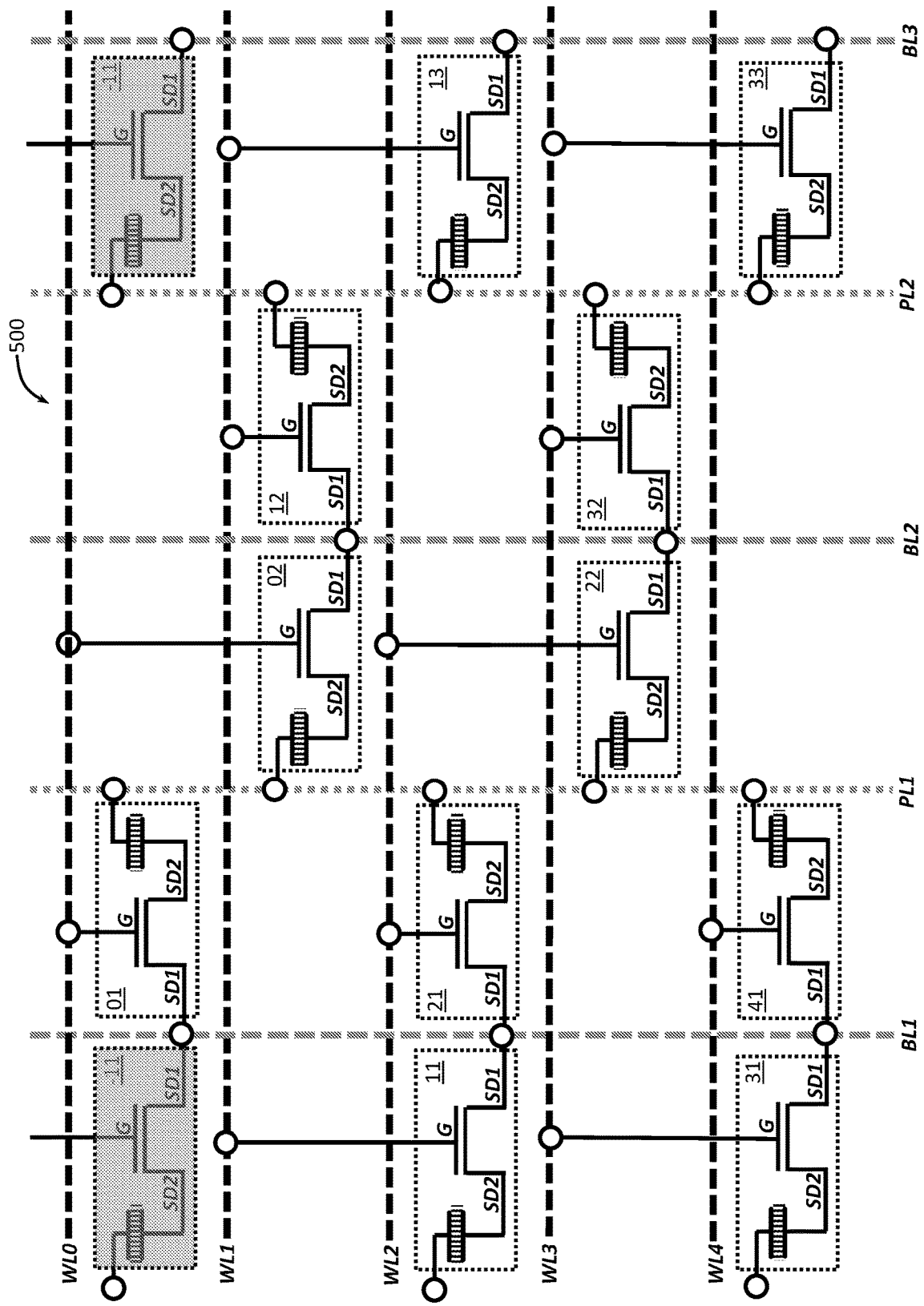
FIG. 5 provides an electric circuit diagram of an array of 1T-1C memory cells of FIG. 4, in accordance with some embodiments.

FIG. 4 provides an electric circuit diagram of a memory cell 400 that may be implemented in a memory array with backside components and angled transistors, in accordance with some embodiments. FIG. 5 provides an electric circuit diagram of a memory array 500 of the memory cells 400, in accordance with some embodiments. In FIGS. 4-5 each of the transistors is illustrated using a conventional electric circuit diagram representation with gate, first S/D, and second S/D terminals being labeled as, respectively, G, SD1, and SD2. FIG. 5 shows multiple instances of the memory cells 400 and labels different instances of the memory cells 400 using two digits to differentiate between the cells. The electric circuit diagrams of FIGS. 4-5 further label various memory control lines that may be coupled to the memory cells 400, such as BL, WL, and PL, sometimes with a digit appended to the label to differentiate between different instances of the same type of control lines (e.g., BL1, BL2, etc.).

Turning to the details of the memory cell 400, as shown in FIG. 4, the memory cell 400 includes a transistor 410 and a capacitor 466, i.e., the memory cell 400 is a 1T-1C memory cell as described above. Each of the transistor 410 and the capacitor 466 is shown in FIG. 4 within a respective dotted contour. The transistor 410 may be any of the transistors 110, 210, 310, described above. The capacitor 466 may be any of the capacitors 116, 266, described above. The first S/D terminal (SD1) of the transistor 410 is coupled (e.g., directly connected) to the BL, the second S/D terminal (SD2) of the transistor 410 is coupled (e.g., directly connected) to the capacitor 466 (in particular, to one of the capacitor electrodes of the capacitor 466), and the gate terminal (G) of the transistor 410 is coupled (e.g., directly connected) to the WL. In general, READ and WRITE access to the memory cell 400 (i.e., performance of READ and WRITE operations) is realized using a combination of the BL, the WL, and the PL, each of which is an interconnect (e.g., an electrically conductive line) to which a certain voltage is applied to sense (i.e., READ) or program (i.e., WRITE) a memory state of the memory cell 400. Together, the BL, the WL, and the PL are referred to herein as "memory control lines" (or, simply, "control lines") because they are used to control a memory state of the memory cell 400.

FIG. 5 illustrates a memory array 500 with a plurality of example memory cells 400 of FIG. 4, in accordance with some embodiments.

As is conventionally used in context of memory, "rows" and "columns" may be defined for the memory array 500, where each of the memory cells 400 may be individually addressable by applying appropriate signals to the BL, WL, and PL of a row and a column to which the memory cell 400 belongs. Namely, the memory cells 400 sharing a single WL may be described as belonging to the same row, while the memory cells 400 sharing a single BL may be described as belonging to the same column. In FIG. 5, individual memory cells 400 are shown within respective dotted contours and labeled with two digits, e.g., 11, 12, 13, and so on, where the first digit represents the row to which the memory cell 400 belongs (i.e., represents the WL to which the memory cell 400 is coupled) and the second digit represents the column to which the memory cell 400 belongs (i.e., represents the BL to which the memory cell 400 is coupled). Thus, in general, a memory cell referred to as a "memory cell 400-$ij$" is the memory cell 400 coupled to WLi and BLj, where i and j are integers (indices). The same notation is used in FIG. 12, providing top-down views of an example IC device that implements the memory array 500. More memory cells 400 fit onto pages of the drawings of FIGS. 12A-12G than onto a page of the drawing of FIG. Thus, FIGS. 12A-12G complement the view of the memory array 500 shown in FIG. 5 and descriptions of FIG. 5 may include references to the memory cells 400 only shown in FIGS. 12A-12G, but not shown in FIG. 5 because they did not fit on the page.

In contrast to the illustration of FIG. 4, the access transistors and the capacitors of various memory cells 400 are not individually labeled with reference numerals and not individually enclosed in dotted contours in FIG. to not clutter the drawings. However, the access transistors of various memory cells 400 shown in FIG. 5 are the access transistors 410, described above, and the capacitors of various memory cells 400 shown in FIG. 5 are the capacitors 466, described above.

In some embodiments of the memory array 500, each BL, WL, and PL coupled to one memory cell 400 can be shared among multiple, possibly different subsets of, the memory cells 400 of the memory array 500, as will now be described.

In the memory array 500, the memory cells 400-11, 400-12, 400-13, 400-14, and so on, belong to the first row (the memory cell 400-14 not shown in FIG. 5 but shown in FIG. 12) because the gates of the access transistors of these memory cells 400 are coupled to a single first WL, WL1. Similarly, the memory cells 400-21, 400-22, 400-23, 400-24 and so on, belong to the second row (the memory cells 400-23 and 400-24 not shown in FIG. 5 but shown in FIG. 12) because the gates of the access transistors of these memory cells 400 are coupled to a single second WL, WL2. Continuing in this manner, the memory cells 400-31, 400-32, 400-33, 400-34, and so on, belong to the third row (the memory cell 400-34 not shown in FIG. 5 but shown in FIG. 12) because the gates of the access transistors of these memory cells 400 are coupled to a single third WL, WL3, while the memory cells 400-41, 400-42, 400-43, 400-44, and so on, belong to the fourth row (the memory cells 400-42, 400-43, and 400-44 not shown in FIG. 5 but shown in FIG. 12) because the gates of the access transistors of these memory cells 400 are coupled to a single fourth WL, WL4, and so on.

In the memory array 500, the memory cells 400-11, 400-21, 400-31, 400-41, and so on, belong to the first column because the first S/D terminals of the access transistors of these memory cells 400 are coupled to a single first BL, BL1. Similarly, the memory cells 400-02, 400-12, 400-22, 400-32, and so on, belong to the second column because the first S/D terminals of the access transistors of these memory cells 400 are coupled to a single second BL, BL2. Continuing in this manner, the memory cells 400-13, 400-23, 400-33, 400-43, and so on, belong to the third column (the memory cells 400-23 and 400-43 not shown in FIG. 5 but shown in FIG. 12) because the first S/D terminals of the access transistors of these memory cells 400 are coupled to a single third BL, BL3, and so on.

As shown in FIG. 5, the memory cells 400-11 and 400-12 may be coupled to a single first WL, WL1, by having the gate terminals of their access transistors being coupled to the WL1. Thus, the gate terminals of the access transistors of the memory cells 400-11 and 400-12 are coupled to one another, via the WL1. The first S/D terminals of these access transistors are coupled to respective (i.e., different) BLs. Namely, the first S/D terminal of the access transistor of the memory cell 400-11 is coupled to the first BL, BL1, while the first S/D terminal of the access transistor of the memory cell 400-12 is coupled to the second BL, BL2. Similarly, the memory cells 400-21 and 400-22 may be coupled to a single second WL, WL2, by having the gate terminals of their access transistors being coupled to the WL2. Thus, the gate terminals of the access transistors of the memory cells 400-21 and 400-22 are coupled to one another, via the WL2. The first S/D terminals of these access transistors are coupled to respective (i.e., different) BLs. Namely, the first S/D terminal of the access transistor of the memory cell 400-21 is coupled to the first BL, BL1, while the first S/D terminal of the access transistor of the memory cell 400-22 is coupled to the second BL, BL2. Continuing in this manner, the memory cells 400-31 and 400-32 may be coupled to a single third WL, WL3, by having the gate terminals of their access transistors being coupled to the WL3. Thus, the gate terminals of the access transistors of the memory cells 400-31 and 400-32 are coupled to one another, via the WL3. The first S/D terminals of these access transistors are coupled to respective (i.e., different) BLs. Namely, the first S/D terminal of the access transistor of the memory cell 400-31 is coupled to the first BL, BL1, while the first S/D terminal of the access transistor of the memory cell 400-32 is coupled to the second BL, BL2. Other memory cells 400 coupled to different WLs may be included in the memory array 500 in a similar manner.

Because both the first S/D terminal of the access transistor of the memory cell 400-11 and the first S/D terminal of the access transistor of the memory cell 400-21 are coupled to a single BL, the BL1, in some embodiments, these two access transistors may be provided along a single elongated structure 304 and have their first S/D terminals being implemented as a single shared first S/D terminal (e.g., as shown in FIG. 12). Similarly, because both the first S/D terminal of the access transistor of the memory cell 400-22 and the first S/D terminal of the access transistor of the memory cell 400-32 are coupled to a single BL, the BL2, in some embodiments, these two access transistors may be provided along a single elongated structure 304 and have their first S/D terminals being implemented as a single shared first S/D terminal (e.g., as shown in FIG. 12). Other such pairs of the memory cells 400 that may share a single first S/D terminal are illustrated in FIG. 5 and/or FIG. 12. For example, as shown in FIG. 5 and in FIG. 12, because both the first S/D terminal of the access transistor of the memory cell 400-31 and the first S/D terminal of the access transistor of the memory cell 400-41 are coupled to a single BL, the BL1, in some embodiments, these two access transistors may be provided along a single elongated structure 304 and have their first S/D terminals being implemented as a single shared first S/D terminal.

As also shown in FIG. 5, the first capacitor electrodes of the capacitors of the memory cells 400 coupled to the WL1 and the WL2 are coupled to the second S/D terminals of the access transistors of the respective memory cells 400, while the second capacitor electrodes of the capacitors of the memory cells 400 coupled to the WL1 and the WL2 are coupled to various PLs. In particular, as shown in FIG. 5, in some embodiments, the second capacitor electrodes of the memory cells 400-01, 400-02, 200-21, 400-22, and 400-41 may be coupled to a single first PL, PL1, while, in some embodiments, the second capacitor electrodes of the memory cells 400-12, 400-13, 200-32, and 400-33, may be coupled to a single second PL, PL2. Thus, in some embodiments, the second capacitor electrodes of some of the memory cells 400 of the memory array 500 may be shared or coupled to one another. FIG. 5 does not illustrate that the second capacitor electrodes of the memory cells 400-11 and 400-31 are shared with the second capacitor electrodes of other memory cells 400 because these memory cells are shown at the periphery of the illustration of FIG. 5. In some embodiments, all of the second capacitor electrodes of the memory cells 400 of the memory array 500 may be coupled to one another, and all coupled to a single voltage, e.g., to a ground voltage, or some other reference voltage. In other embodiments, the second capacitor electrodes of different subsets of the memory cells 400 of the memory array 500 may be coupled to different voltages (i.e., may be individually controlled).

Additional memory cells 400 may be included in the memory array 500, coupled to further BLs, WLs, and PLs.

The descriptions above make clear that certain general rules may be defined for the arrangement of the memory cells 400 as represented by the memory array 500. One rule may be that some pairs of the memory cells 400 of a given column (i.e., coupled to a single BL) but of different (e.g., adjacent) rows (i.e., coupled to different WLs) may have their first S/D terminals shared and/or coupled to a single BL. Phrased differently, this rule may be that some pairs of the memory cells 400 of a given column that have their first S/D terminals shared and/or coupled to a single BL may have gates of their access transistors coupled to different (e.g., adjacent) WLs. In FIG. 5, one example of this is a pair of the memory cells 400-11 and 400-21, another example of this is a pair of the memory cells 400-22 and 400-32, a third example of this is a pair of the memory cells 400-31 and 400-41, and so on (FIG. 12 shows further such examples). Another rule may be that some subsets (e.g., pairs, although it could be more than two) of the memory cells 400 of different (e.g., adjacent) columns (i.e., coupled to different BLs) and of different (e.g., adjacent) rows (i.e., coupled to different WLs) may have the second capacitor electrodes of their capacitors shared and/or coupled to a single PL. Phrased differently, this rule may be that some subsets of the memory cells 400 of different (e.g., adjacent) columns that are coupled to a single PL may have gates of their access transistors coupled to different (e.g., adjacent) WLs. In FIG. 5, one example of this is a pair of the memory cells 400-21 and 400-12, and another example of this is a pair of the memory cells 400-13 and 400-32.

In various embodiments, different ones of the access transistors 410, the capacitors 466, and the BLs of the memory array 500 may be implemented in different layers with respect to one another, and some may be implemented on a front side while the others may be implemented on a back side of a support structure of an IC device. FIGS. 6A-6E provide schematic illustrations of IC devices 600 with various arrangements of frontside and backside components, in accordance with some embodiments, and FIGS. 7A-7E provide flow diagrams of methods for fabricating the IC devices 600 of FIGS. 6A-6E. Each of FIGS. 6A-6E shows a different embodiment of an IC device 600 with a BL layer 610 (i.e., a layer of an IC device 600 in which the BLs of the memory array 500 may be implemented), a transistor layer 620 (i.e., a layer of an IC device 600 in which the access transistors 410 of the memory array 500 may be implemented), and a capacitor layer 630 (i.e., a layer of an IC device 600 in which the capacitors 466 of the memory array 500 may be implemented). Each of FIGS. 6A-6E further illustrates an interface 605, shown as a dashed line that represents an interface between components implemented on the front side of a support structure (i.e., frontside components, represented by everything above the line 605) and components implemented on the back side of a support structure (i.e., backside components, represented by everything below the line 605). In various embodiments, either the transistors of the transistor layer 620 or the BLs of the BL layer 610 may be angled transistors or BLs, respectively. In some embodiments, neither the transistors of the transistor layer 620 nor the BLs of the BL layer 610 are angled.

Turning to the details of FIGS. 6A-6E, each of these drawings illustrates the transistor layer 620 as being at the bottom of the layers of frontside components. For example, the transistor layer 620 may include FEOL transistors that will serve as access transistors of the memory cells 400. In the IC device 600A, shown in FIG. 6A, the capacitor layer 630 is above the transistor layer 620, while the BL layer 610 is below the transistor layer 620 and, therefore, below the interface 605. Thus, in the IC device 600A, the transistors 410 of the transistor layer 620 and the capacitors 466 of the capacitor layer 630 are frontside components and the BLs of the BL layer 610 are backside components. In the IC device 600B, shown in FIG. 6B, the capacitor layer 630 and the BL layer 610 are reversed, i.e., the BL layer 610 is above the transistor layer 620, while the capacitor layer 630 is below the transistor layer 620 and, therefore, below the interface 605. Thus, in the IC device 600B, the transistors 410 of the transistor layer 620 and the BLs of the BL layer 610 are frontside components and the capacitors 466 of the capacitor layer 630 are backside components. In the IC device 600C, shown in FIG. 6C, both the capacitor layer 630 and the BL layer 610 are below the transistor layer 620 and, therefore, below the interface 605. Thus, in the IC device 600C, the transistors 410 of the transistor layer 620 are frontside components, while the capacitors 466 of the capacitor layer 630 and the BLs of the BL layer 610 are backside components. FIG. 6C illustrates the capacitor layer 630 and the BL layer 610 being side by side with one another, at the back side of the transistor layer 620, which represents that the capacitors of the capacitor layer 630 and the BLs of the BL layer 610 may be in a single layer with respect to the transistor layer 620. The illustration of FIG. 6C does not mean that the capacitors of the capacitor layer 630 and the BLs of the BL layer 610 would actually be separated to be over different portions of the back side of the IC device 600C. Rather, it may be more advantageous to have the capacitors of the capacitor layer 630 and the BLs of the BL layer 610 be interspersed with one another over the back side of the IC device 600C. In other embodiments, arrangements of the capacitor layer 630 and the BL layer 610 on the back side may be different. For example, in the IC device 600D, shown in FIG. 6D, the transistors 410 of the transistor layer 620 are frontside components, while the capacitors 466 of the capacitor layer 630 and the BLs of the BL layer 610 are backside components, as in FIG. 6C, but, different from FIG. 6C, in the IC device 600D the capacitor layer 630 is closer to the transistor layer 620 than the BL layer 610. In another example, in the IC device 600E, shown in FIG. 6E, the transistors 410 of the transistor layer 620 are frontside components, while the capacitors 466 of the capacitor layer 630 and the BLs of the BL layer 610 are backside components, as in FIG. 6C, but, different from FIG. 6C, in the IC device 600E the BL layer 610 is closer to the transistor layer 620 than the capacitor layer 630.

FIGS. 7A-7E provide flow diagrams of methods 700 for fabricating IC devices with various arrangements of frontside and backside components, in accordance with some embodiments. The example fabrication methods shown in FIGS. 7A-7E may include other operations not specifically shown in FIGS. 7A-7E, such as various cleaning or planarization operations as known in the art. For example, in some embodiments, any of the layers of the IC device may be cleaned prior to, after, or during any of the processes of the fabrication method described herein, e.g., to remove oxides, surface-bound organic and metallic contaminants, as well as subsurface contamination. In some embodiments, cleaning may be carried out by, e.g., using chemical solutions (such as peroxide) and/or ultraviolet (UV) radiation combined with ozone, and/or oxidizing the surface (e.g., using thermal oxidation) and then removing the oxide (e.g., using hydrofluoric acid (HF)). In another example, the top surfaces of the IC devices described herein may be planarized prior to, after, or during any of the processes of the fabrication method described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

Figure 7A:
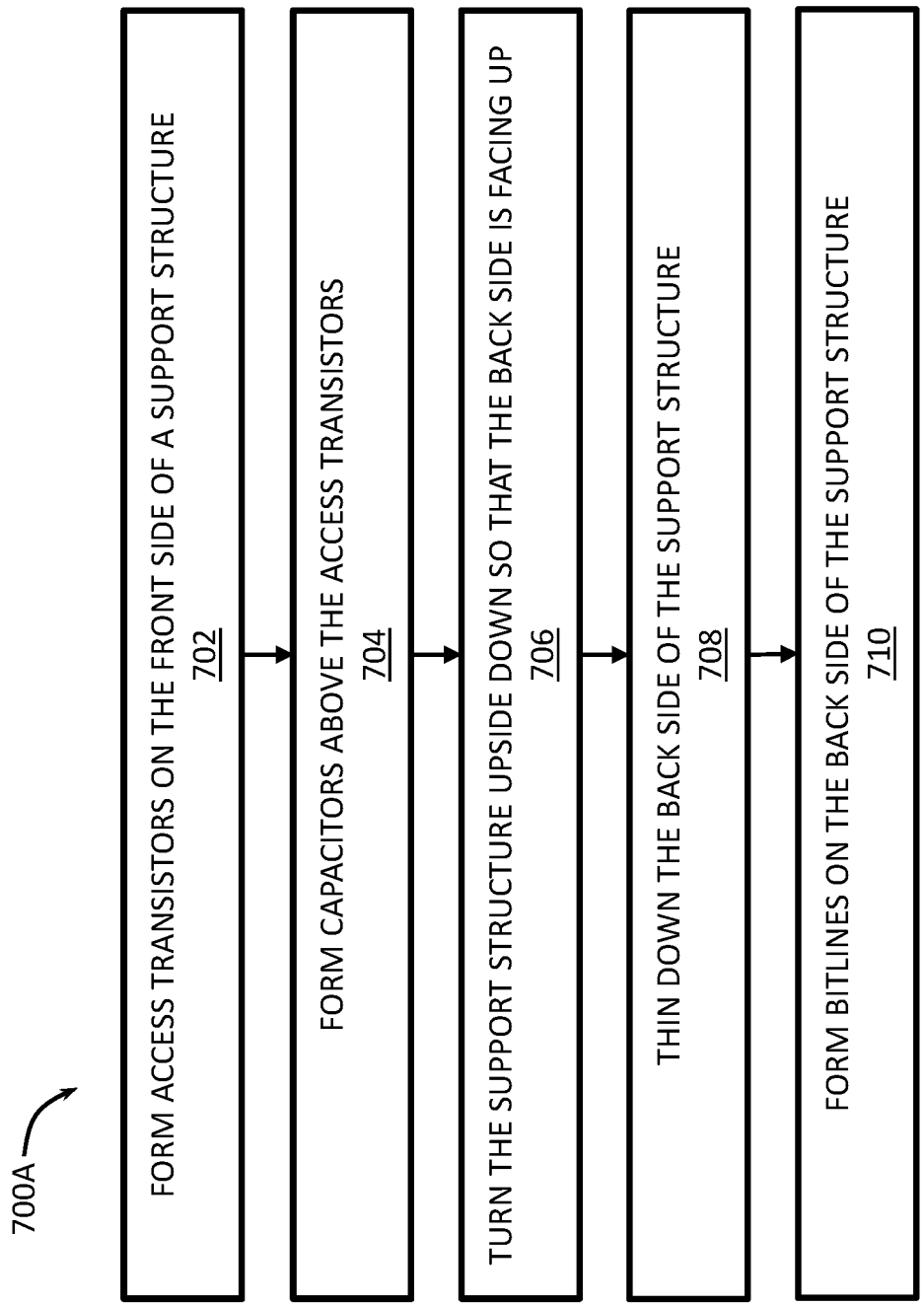
FIGS. 7A-7E provide flow diagrams of methods for fabricating IC devices with various arrangements of frontside and backside components, in accordance with some embodiments.

The IC device 600A of FIG. 6A may be manufactured using a method 700A, shown in FIG. 7A. The fabrication method 700A may begin with a process 702 that includes forming access transistors of the transistor layer 620 over or at least partially in the front side of a support structure. The access transistors formed in the process 702 may be the transistors 410 as described above, e.g., formed in the arrangement of the transistors of the memory array 500 as described herein. The support structure over which the access transistors are formed in the process 702 may be any of the support structures described herein, e.g., any of the support structures 102, 202, 302. The fabrication method 700A may then proceed with a process 704 that includes forming capacitors over the access transistors formed in the process 702. The capacitors formed in the process 704 may be the capacitors 466 as described above, e.g., formed in the arrangement of the capacitors of the memory array 500 as described herein. In the processes 702 and 704, all of the processing was performed on the front side of the support structure. Next, the fabrication method 700A may include a process 706 in which the support structure with the access transistors and the capacitors is flipped upside down, so that the back side of the support structure is now the top surface available for processing and the access transistors and the capacitors are at the bottom. The fabrication method 700A may then proceed with a process 708 that includes thinning down the back side of the support structure that was turned over in the process 706. In some embodiments, the process 708 may include any suitable grinding or polishing process to reduce the thickness of the support structure. In some embodiments, the process 708 may include removing portions of the support structure until the back side of the transistor layer 620 is exposed, e.g., until the S/D regions of the access transistors of the transistor layer 620 are exposed, so that conductive contacts can be made to those regions. However, in other embodiments, a portion of the support structure may remain beyond the transistor layer 620, i.e., the S/D regions of the access transistors of the transistor layer 620 may not necessarily be exposed as long as other interconnects may later be provided so as to electrically couple to the backside components as described herein. The method 700A may further include a process 710 in which BLs are fabricated on the thinned down back side of the support structure, thus being formed as backside components of the IC device 600A. The BLs formed in the process 710 may be the BLs as described above, e.g., formed in the arrangement of the BLs of the memory array 500 as described herein.

Figure 7B:
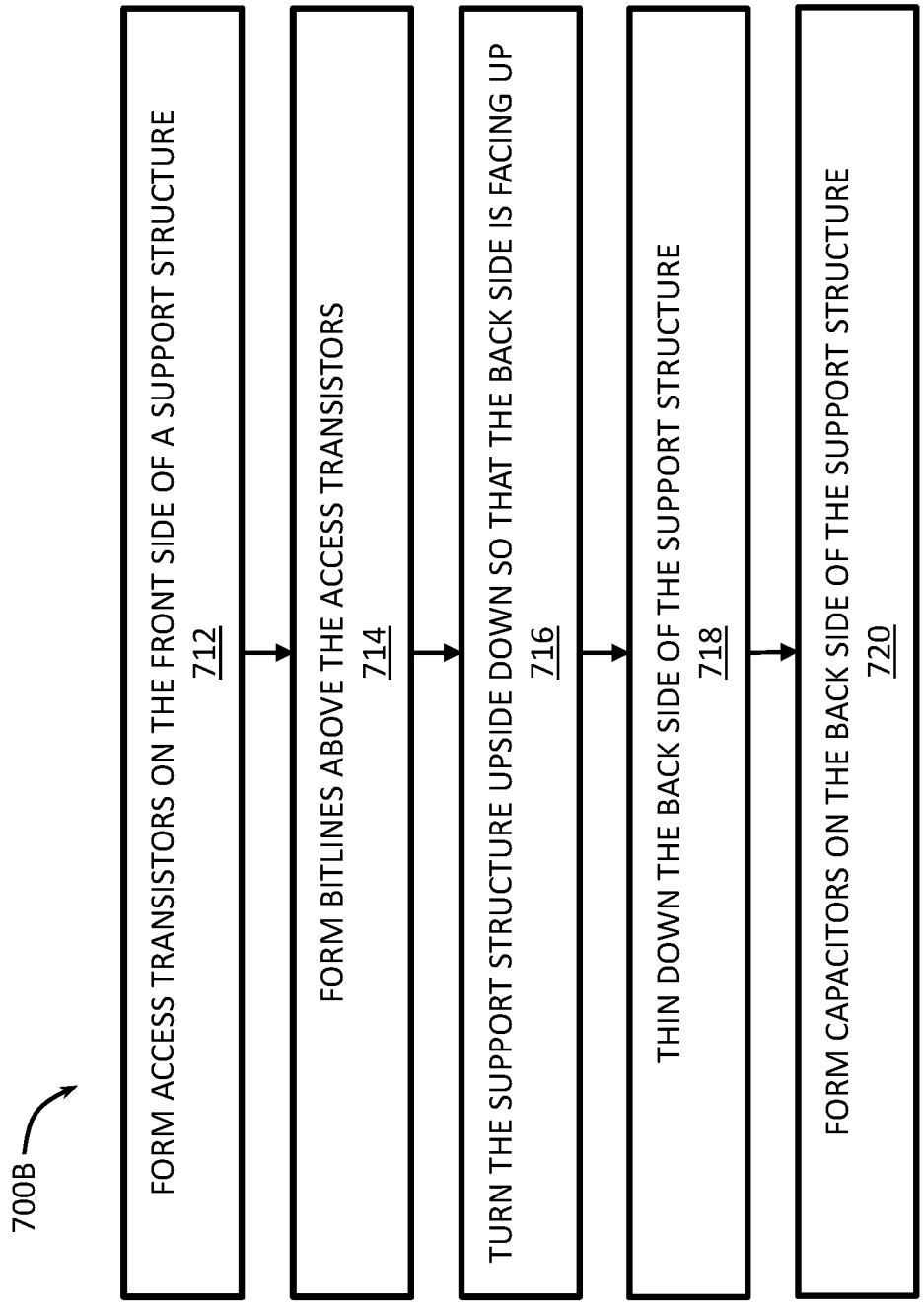

The IC device 600B of FIG. 6B may be manufactured using a method 700B, shown in FIG. 7B. The fabrication method 700B may begin with a transistor fabrication process 712 that may be substantially the same as the process 702, described above. The fabrication method 700B may then proceed with a process 714 that includes forming BLs over the access transistors formed in the process 712. The BLs formed in the process 714 may be the BLs as described above, e.g., formed in the arrangement of the BLs of the memory array 500 as described herein. In the processes 712 and 714, all of the processing was performed on the front side of the support structure. Next, the fabrication method 700B may include a process 716 in which the support structure with the access transistors and the BLs is flipped upside down, so that the back side of the support structure is now the top surface available for processing and the access transistors and the BLs are at the bottom. The fabrication method 700B may then proceed with a back side thinning process 718 that may be substantially the same as the process 708, described above. The method 700B may further include a process 720 in which capacitors are fabricated on the thinned down back side of the support structure, thus being formed as backside components of the IC device 600B. The capacitors formed in the process 720 may be the capacitors 466 as described above, e.g., formed in the arrangement of the capacitors of the memory array 500 as described herein.

Figure 7C:
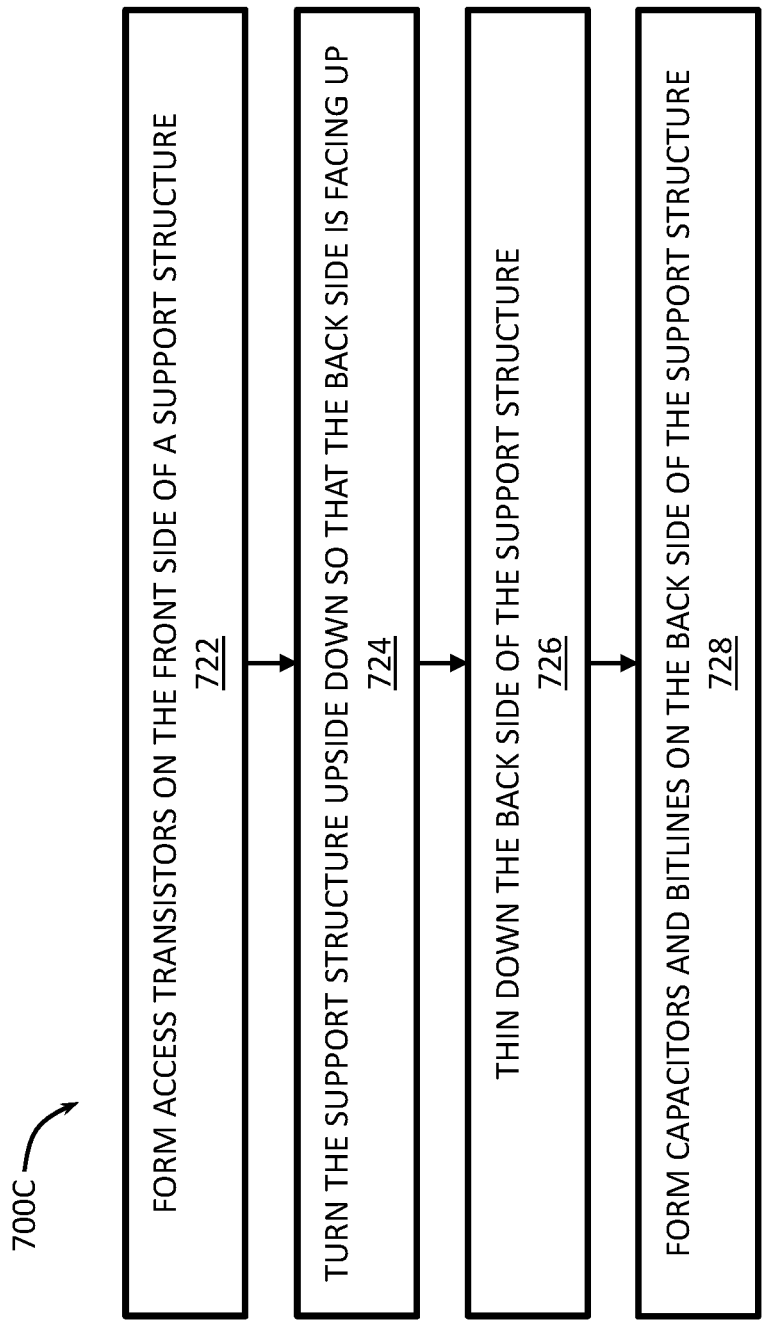

The IC device 600C of FIG. 6C may be manufactured using a method 700C, shown in FIG. 7C. The fabrication method 700C may begin with a transistor fabrication process 722 that may be substantially the same as the process 702, described above. The fabrication method 700C may then proceed with a process 724 that includes turning the support structure with the access transistors formed in the process 722 upside down, so that the back side of the support structure is now the top surface available for processing and the access transistors are at the bottom. The fabrication method 700C may then proceed with a back side thinning process 726 that may be substantially the same as the process 708, described above. The method 700C may further include a process 728 in which capacitors and BLs are fabricated on the thinned down back side of the support structure, thus both the capacitors and the BLs being formed as backside components of the IC device 600C. The capacitors formed in the process 728 may be the capacitors 466 as described above, e.g., formed in the arrangement of the capacitors of the memory array 500 as described herein. The BLs formed in the process 728 may be the BLs as described above, e.g., formed in the arrangement of the BLs of the memory array 500 as described herein.

Figure 7D:
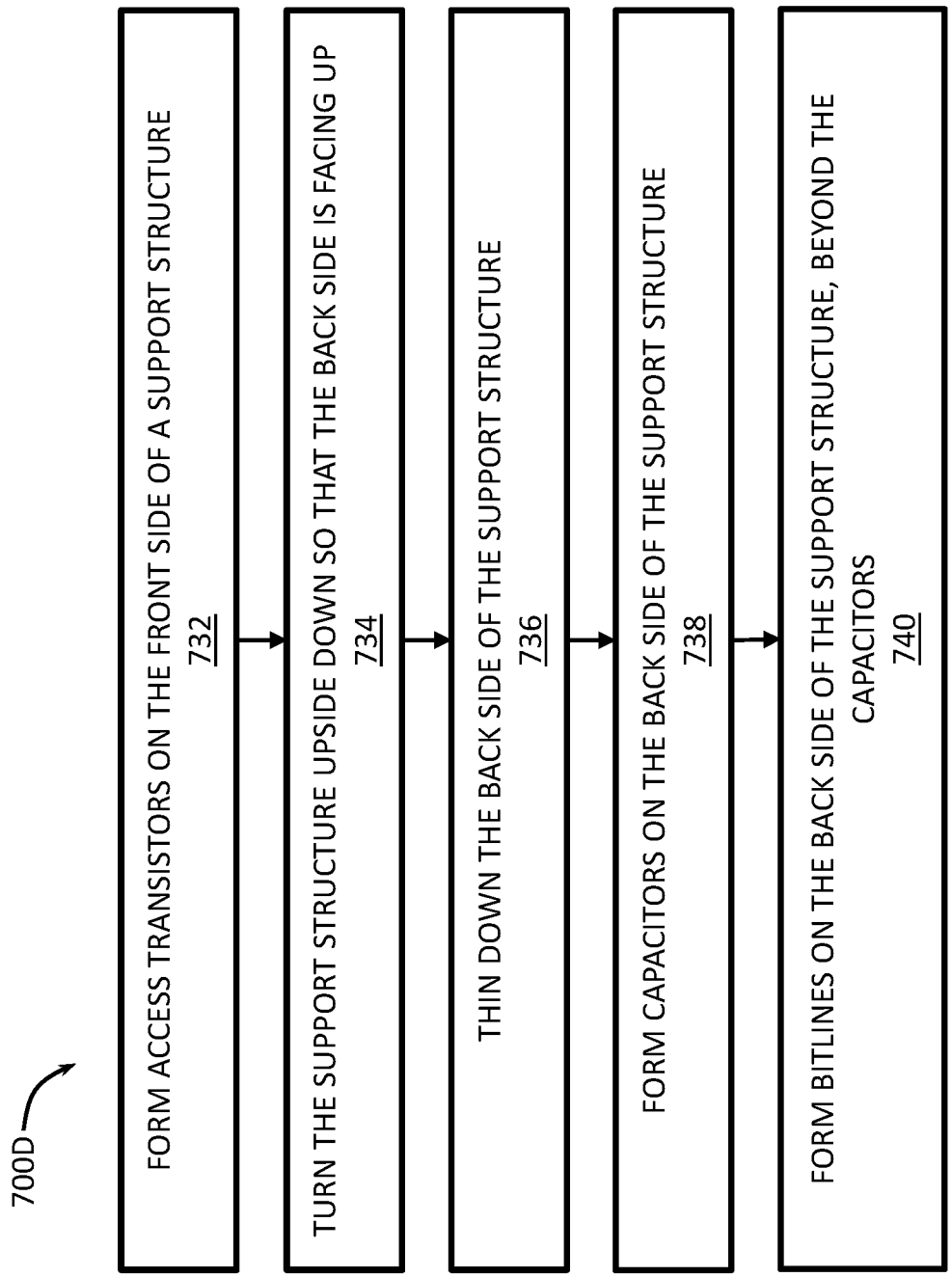

The IC device 600D of FIG. 6D may be manufactured using a method 700D, shown in FIG. 7D. The fabrication method 700D may begin with a transistor fabrication process 732 that may be substantially the same as the process 702, described above. The fabrication method 700D may then proceed with a process 734 that includes turning the support structure with the access transistors formed in the process 732 upside down, so that the back side of the support structure is now the top surface available for processing and the access transistors are at the bottom. The fabrication method 700D may then proceed with a back side thinning process 736 that may be substantially the same as the process 708, described above. The method 700D may further include a process 738 that includes forming capacitors on the thinned down back side of the support structure. The capacitors formed in the process 738 may be the capacitors 466 as described above, e.g., formed in the arrangement of the capacitors of the memory array 500 as described herein. The method 700D may further include a process 740 in which BLs are fabricated on the thinned down back side of the support structure beyond the capacitors formed in the process 738 (i.e., the BLs formed in the process 740 are further away from the transistor layer 620 than the capacitors formed in the process 738). The BLs formed in the process 740 may be the BLs as described above, e.g., formed in the arrangement of the BLs of the memory array 500 as described herein.

Figure 7E:
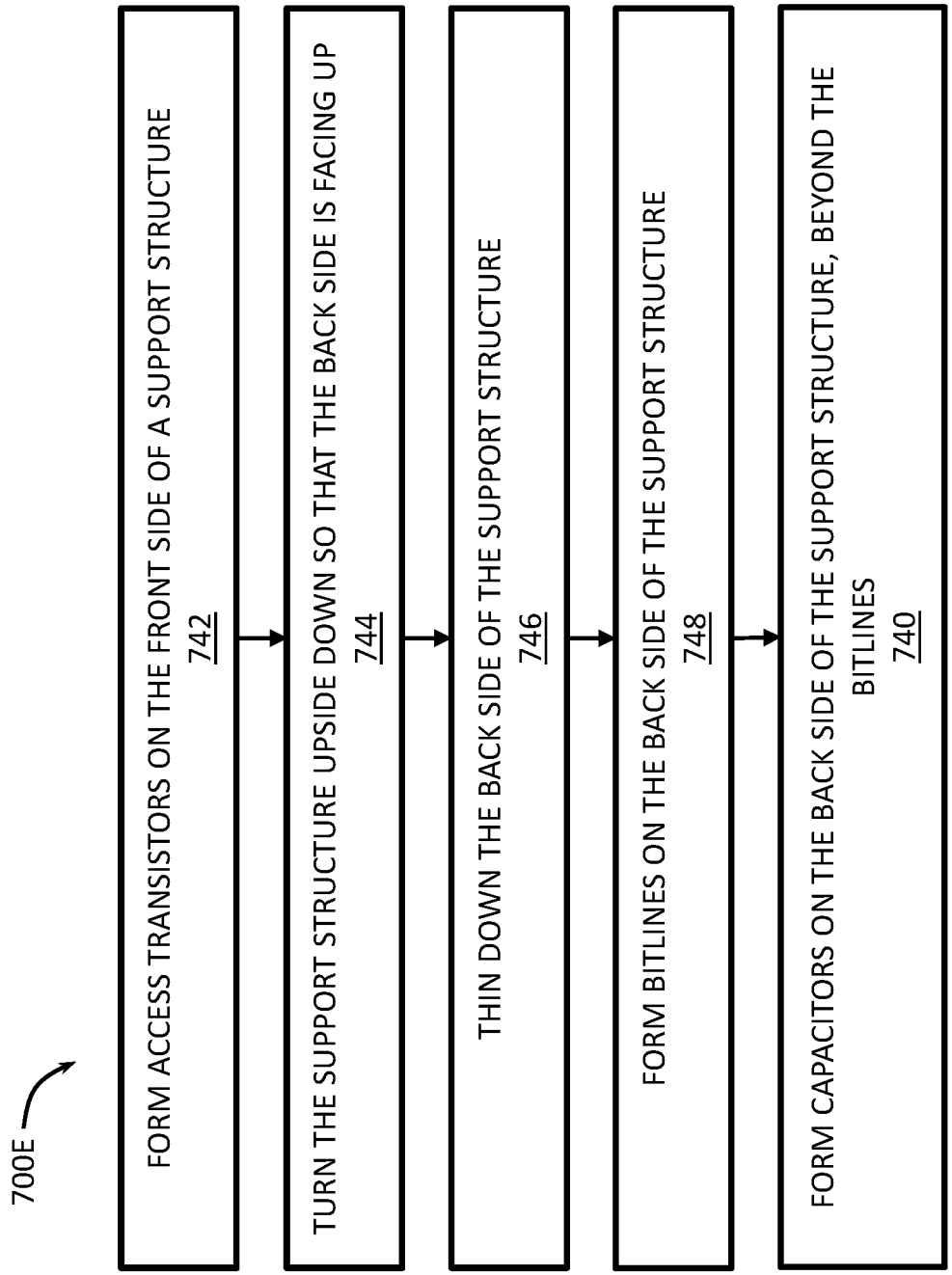

The IC device 600E of FIG. 6E may be manufactured using a method 700E, shown in FIG. 7E. The fabrication method 700E may begin with a transistor fabrication process 742 that may be substantially the same as the process 702, described above. The fabrication method 700E may then proceed with a process 744 that includes turning the support structure with the access transistors formed in the process 742 upside down, so that the back side of the support structure is now the top surface available for processing and the access transistors are at the bottom. The fabrication method 700E may then proceed with a back side thinning process 746 that may be substantially the same as the process 708, described above. The method 700E may further include a process 748 that includes forming BLs on the thinned down back side of the support structure. The BLs formed in the process 748 may be the BLs as described above, e.g., formed in the arrangement of the BLs of the memory array 500 as described herein. The method 700E may further include a process 750 in which capacitors are fabricated on the thinned down back side of the support structure beyond the BLs formed in the process 748 (i.e., the capacitors formed in the process 750 are further away from the transistor layer 620 than the BLs formed in the process 748). The capacitors formed in the process 750 may be the capacitors 466 as described above, e.g., formed in the arrangement of the capacitors of the memory array 500 as described herein.

Because of different components of the IC devices 600 being fabricated on front side or back side of the support structure, and also dependent on the fabrication processes used to form those components, in some embodiments, the IC devices 600 may exhibit characteristic features indicative of the fabrication methods of FIGS. 7A-7E. In particular, for certain manufacturing processes, cross-sectional shapes of various components in their cross-sectional side views may be trapezoidal, i.e., a cross-section of a component may have two sides that are substantially parallel, one of which is a short side and another one of which is a long side. Therefore, examining the trapezoidal cross-sectional shapes of various components of the IC devices 600 may reveal characteristic features of the fabrication methods of FIGS. 7A-7E. Such shapes will now be described with reference to FIGS. 8-11.

Each of FIGS. 8-11 is a cross-sectional side view of various IC devices, meaning that the vertical axis is the z-axis of the example coordinate system used in the present drawings, while the horizontal axis may be the x-axis, the y-axis, or an axis somewhere in the x-y plane of the example coordinate system. The latter is represented in FIGS. 8-11 by labeling the horizontal axis as x/y. The IC devices of FIGS. 8-11 may be examples of various ones of the IC devices 600 of FIGS. 6A-6E, where FIGS. 8-11 illustrate portions of the IC devices 600 relevant to the explanations of the cross-sectional shapes and omit illustrating other portions of the IC devices 600 in order to not clutter the drawings. Each of FIGS. 8-11 illustrates an approximate location of the interface 605 to indicate whether a component shown in each of FIGS. 8-11 is a frontside component (if it is shown above the interface 605) or a backside component (if it is shown below the interface 605).

FIGS. 8A-8B provide cross-sectional side views of IC devices 800 with, respectively, a frontside fin and a frontside nanoribbon, in accordance with some embodiments. The IC device 800A, shown in FIG. 8A, illustrates that, due to the typical fabrication processes used to form the elongated structure 304 as a fin, which typically involves subtractive fabrication techniques, a dimension 802 of the elongated structure 304 at a distance 812 from the interface 605 may be larger than a dimension 804 of the elongated structure 304 at a distance 814 from the interface 605, when the distance 812 is smaller than the distance 814. The dimensions 802 and 804 may be, e.g., widths of the channel region of the fin 204 in a transverse cross-section of the channel region of the FinFET 210 (i.e., in a plane substantially perpendicular to the longitudinal axis 220). Similarly, the IC device 800B, shown in FIG. 8B, illustrates that, due to the typical fabrication processes used to form the elongated structure 304 as a nanoribbon, which typically involves subtractive fabrication techniques, a dimension 806 of the elongated structure 304 at a distance 816 from the interface 605 may be larger than a dimension 808 of the elongated structure 304 at a distance 818 from the interface 605, when the distance 816 is smaller than the distance 818. The dimensions 806 and 808 may be, e.g., widths of the channel region of the nanoribbon 104 in a transverse cross-section of the channel region of the nanoribbon transistor 110 (i.e., in a plane substantially perpendicular to the longitudinal axis 120). Thus, FIGS. 8A-8B illustrate that, for both the fin and the nanoribbon embodiments, in some embodiments of the IC devices 600, the long sides of the trapezoidal cross-sections of the elongated structures 304 may be closer to the interface 605 (and, therefore, to the backside components of the IC devices 600) than the short sides.

FIGS. 9A-9B provide cross-sectional side views of IC devices 900 with, respectively, a frontside capacitor and a backside capacitor, in accordance with some embodiments. The capacitors shown in FIGS. 9A-9B may be the capacitors 466, described above, and may have first and second capacitor electrodes 967-1, 967-2, and a capacitor insulator 969, which could be as the, respectively, the first and second capacitor electrodes 167-1/267-1, 167-2/267-2, and the capacitor insulator 169/269, described above. The IC device 900A, shown in FIG. 9A, illustrates that, due to the typical fabrication processes used to form an MIM capacitor at the front side, which typically involves Damascene fabrication techniques, a dimension 902 of the capacitor 466 at a distance 912 from the interface 605 may be smaller than a dimension 904 of the capacitor 466 at a distance 914 from the interface 605, when the distance 912 is smaller than the distance 914. The dimensions 902 and 904 may be, e.g., widths of the capacitor 466 in a transverse cross-section (i.e., in a plane substantially perpendicular to the interface 605). Thus, FIG. 9A illustrates that, for the frontside capacitor 466, in some embodiments of the IC devices 600, the short side of the trapezoidal cross-section of the capacitor 466 may be closer to the interface 605 (and, therefore, to the backside components of the IC devices 600) than the long side. Similarly, the IC device 900B, shown in FIG. 9B, illustrates that, due to the typical fabrication processes used to form an MIM capacitor at the back side, also using Damascene fabrication techniques, a dimension 906 of the capacitor 466 at a distance 916 from the interface 605 may be smaller than a dimension 908 of the capacitor 466 at a distance 918 from the interface 605, when the distance 916 is smaller than the distance 918. The dimensions 906 and 908 may be, e.g., widths of the capacitor 466 in a transverse cross-section (i.e., in a plane substantially perpendicular to the interface 605). Thus, FIG. 9B illustrates that, for the backside capacitor 466, in some embodiments of the IC devices 600, the short side of the trapezoidal cross-section of the capacitor 466 may be closer to the interface 605 (and, therefore, to the frontside components of the IC devices 600) than the long side. In FIG. 9A, the capacitor 466 is shown to be at a distance from the interface 605 to represent that the transistor layer 620 would typically be closer to the interface 605 than the capacitor layer 630. In FIG. 9B, the capacitor 466 is shown to be at a distance from the interface 605 to represent that the backside BL layer 610 may be closer to the interface 605 than the capacitor layer 630; however, in other embodiments of backside capacitors 466, the capacitor 466 may be right at the interface 605.

Figure 10A:
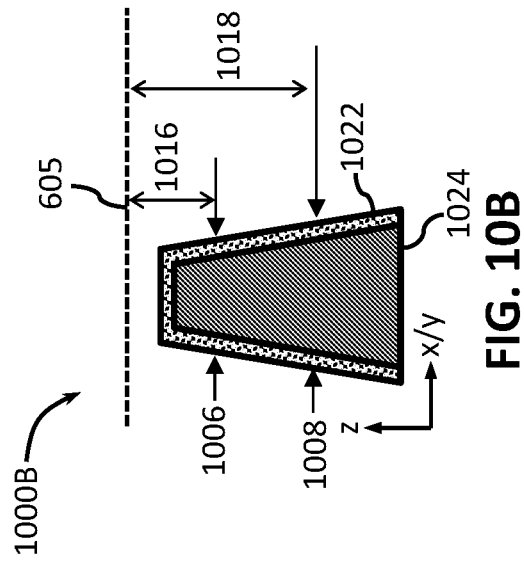
FIGS. 10A-10B provide cross-sectional side views of, respectively, a frontside bitline (BL) formed by Damascene fabrication and a backside BL formed by Damascene fabrication, in accordance with some embodiments.
Figure 10B:
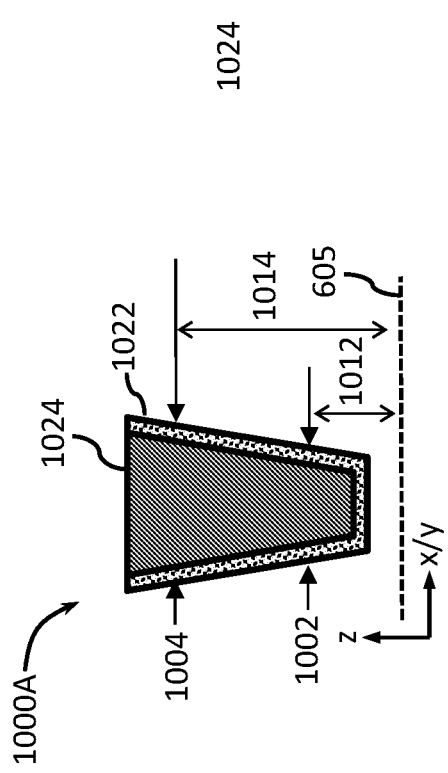
Figure 11A:
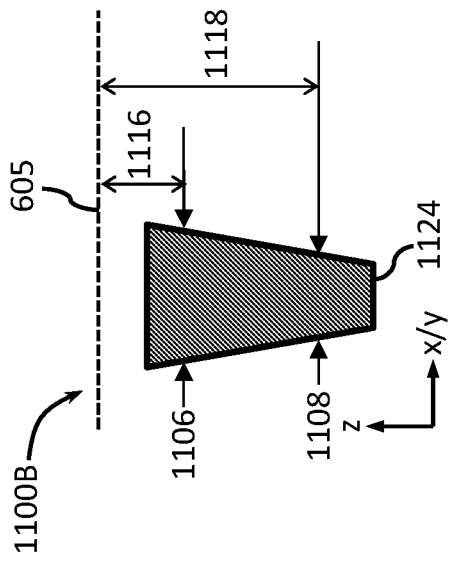
FIGS. 11A-11B provide cross-sectional side views of, respectively, a frontside BL formed by subtractive fabrication and a backside BL formed by subtractive fabrication, in accordance with some embodiments.
Figure 11B:
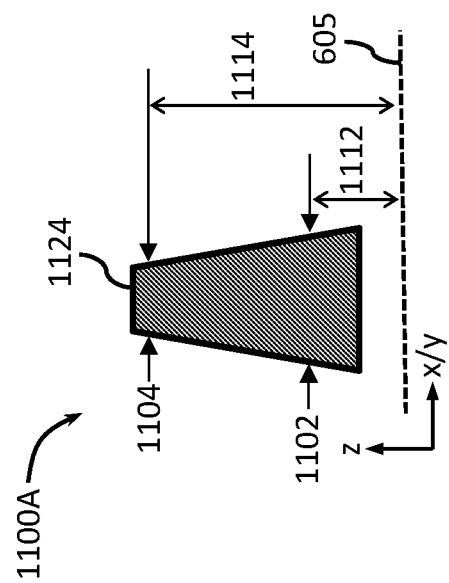

In various embodiments, BLs may be formed by different fabrication techniques and, as a result, will have different characteristic cross-sectional shapes. Such shapes are illustrated in FIGS. 10A-10B and FIGS. 11A-11B. The BLs shown in FIGS. 10A-10B and FIGS. 11A-11B may be the BLs of the memory array 500, described above. In FIG. 10A and FIG. 11A, the BL is shown to be at a distance from the interface 605 to represent that the transistor layer 620 would typically be closer to the interface 605 than the BL layer 610. In FIG. 10B and FIG. 11B, the BL is shown to be at a distance from the interface 605 to represent that the backside capacitor layer 630 may be closer to the interface 605 than the BL layer 610; however, in other embodiments of backside BLs, the BL may be right at the interface 605.

FIGS. 10A-10B provide cross-sectional side views of IC devices 1000 with, respectively, a frontside BL formed by Damascene fabrication and a backside BL formed by Damascene fabrication, in accordance with some embodiments. A BL formed using Damascene fabrication techniques may have a liner 1022 and a fill material 1024. The liner 1022 could line sidewalls and bottom of an opening for the future BL formed in an insulator material. The fill material 1024 would then be deposited to at least partially fill the opening with the liner 1022. The liner 1022 could serve to promote adhesion between the fill material 1024 and the insulator material and may include any material suitable for that purpose (either insulator or electrically conductive material). Examples of materials that may be used as the liner 1022 include one or more of tantalum, tantalum nitride, titanium nitride, tungsten carbide, and cobalt. In various embodiments, the liner 1022 may have a thickness between about 1 and 15 nanometers, including all values and ranges therein, e.g., between about 1 and 10 nanometers, or between about 2 and 6 nanometers. The fill material 1024 would include one or more electrically conductive materials suitable for being deposited within openings. Examples of such materials include copper, nickel, cobalt, tungsten, etc. The IC device 1000A, shown in FIG. 10A, illustrates that, due to the Damascene fabrication processes used to form a BL at the front side, a dimension 1002 of the BL at a distance 1012 from the interface 605 may be smaller than a dimension 1004 of the BL at a distance 1014 from the interface 605, when the distance 1012 is smaller than the distance 1014. The dimensions 1002 and 1004 may be, e.g., widths of the BL in a transverse cross-section (i.e., in a plane substantially perpendicular to the longitudinal axis of the BL). Thus, FIG. 10A illustrates that, for the frontside BL formed using Damascene fabrication techniques, in some embodiments of the IC devices 600, the short side of the trapezoidal cross-section of the BL may be closer to the interface 605 (and, therefore, to the backside components of the IC devices 600) than the long side. Similarly, the IC device 1000B, shown in FIG. 10B, illustrates that, due to the Damascene fabrication processes used to form a BL at the back side, a dimension 1006 of the BL at a distance 1016 from the interface 605 may be smaller than a dimension 1008 of the BL at a distance 1018 from the interface 605, when the distance 1016 is smaller than the distance 1018. The dimensions 1006 and 1008 may be, e.g., widths of the BL in a transverse cross-section (i.e., in a plane substantially perpendicular to the longitudinal axis of the BL). Thus, FIG. 10B illustrates that, for the backside BL formed using Damascene fabrication techniques, in some embodiments of the IC devices 600, the short side of the trapezoidal cross-section of the BL may be closer to the interface 605 (and, therefore, to the frontside components of the IC devices 600) than the long side.

FIGS. 11A-11B provide cross-sectional side views of IC devices 1100 with, respectively, a frontside BL formed by subtractive fabrication and a backside BL formed by subtractive fabrication, in accordance with some embodiments. In contrast to a BL formed using Damascene fabrication techniques, a BL formed using subtractive fabrication techniques would not include a liner but would only include an electrically conductive material 1124. The electrically conductive material 1124 would include one or more electrically conductive materials suitable for being patterned using subtractive fabrication techniques. Examples of such materials include titanium, titanium nitride, ruthenium, cobalt, tungsten, etc. The IC device 1100A, shown in FIG. 11A, illustrates that, due to the subtractive fabrication processes used to form a BL at the front side, a dimension 1102 of the BL at a distance 1112 from the interface 605 may be larger than a dimension 1104 of the BL at a distance 1114 from the interface 605, when the distance 1112 is smaller than the distance 1114. The dimensions 1102 and 1104 may be, e.g., widths of the BL in a transverse cross-section (i.e., in a plane substantially perpendicular to the longitudinal axis of the BL). Thus, FIG. 11A illustrates that, for the frontside BL formed using subtractive fabrication techniques, in some embodiments of the IC devices 600, the long side of the trapezoidal cross-section of the BL may be closer to the interface 605 (and, therefore, to the backside components of the IC devices 600) than the short side. Similarly, the IC device 1100B, shown in FIG. 11B, illustrates that, due to the subtractive fabrication processes used to form a BL at the back side, a dimension 1106 of the BL at a distance 1116 from the interface 605 may be larger than a dimension 1108 of the BL at a distance 1118 from the interface 605, when the distance 1116 is smaller than the distance 1118. The dimensions 1106 and 1108 may be, e.g., widths of the BL in a transverse cross-section (i.e., in a plane substantially perpendicular to the longitudinal axis of the BL). Thus, FIG. 11B illustrates that, for the backside BL formed using subtractive fabrication techniques, in some embodiments of the IC devices 600, the long side of the trapezoidal cross-section of the BL may be closer to the interface 605 (and, therefore, to the frontside components of the IC devices 600) than the short side.

FIGS. 12A-12G provide top-down views of an IC device 1200 with the support structure 302, as described above, and a memory array of 1T-1C memory cells with diagonal elongated structures, in accordance with some embodiments. The views of FIGS. 12A-12G are the same, but this plurality of drawings is provided to highlight some of the features of the IC device 1200 on different drawings to clearly show them individually. As shown in FIGS. 12A-12G, the IC device 1200 includes a plurality of elongated structures 304 (the diagonally angled rectangles shown in dark grey), each of which is an angled elongated structure and houses two access transistors. The memory array implemented in the IC device 1200 may be an example of the memory array 500 of FIG. 5. To that end, some of the individual memory cells 400 labeled in FIG. 5 are also labeled in FIGS. 12A-12G within dotted, dashed, or dash-dotted contours around their access transistors. Capacitors of these memory cells 400 are illustrated in FIG. 12 with large circles, where the same contour as the one used for an access transistor is user to show a capacitor of an individual memory cell 400. Different types of contours are used to differentiate, e.g., in the view of FIG. 12A, between different memory cells 400. Different instances of the WLs and BLs are also shown in FIGS. 12A-12G, as well as the edges 303 of the support structure 302. FIGS. 12A-12G illustrate various components overlayed over one another to show these various components in one drawing. In various embodiments, these components may be implemented in different layers as described with reference to FIG. 6.

Figure 12A:
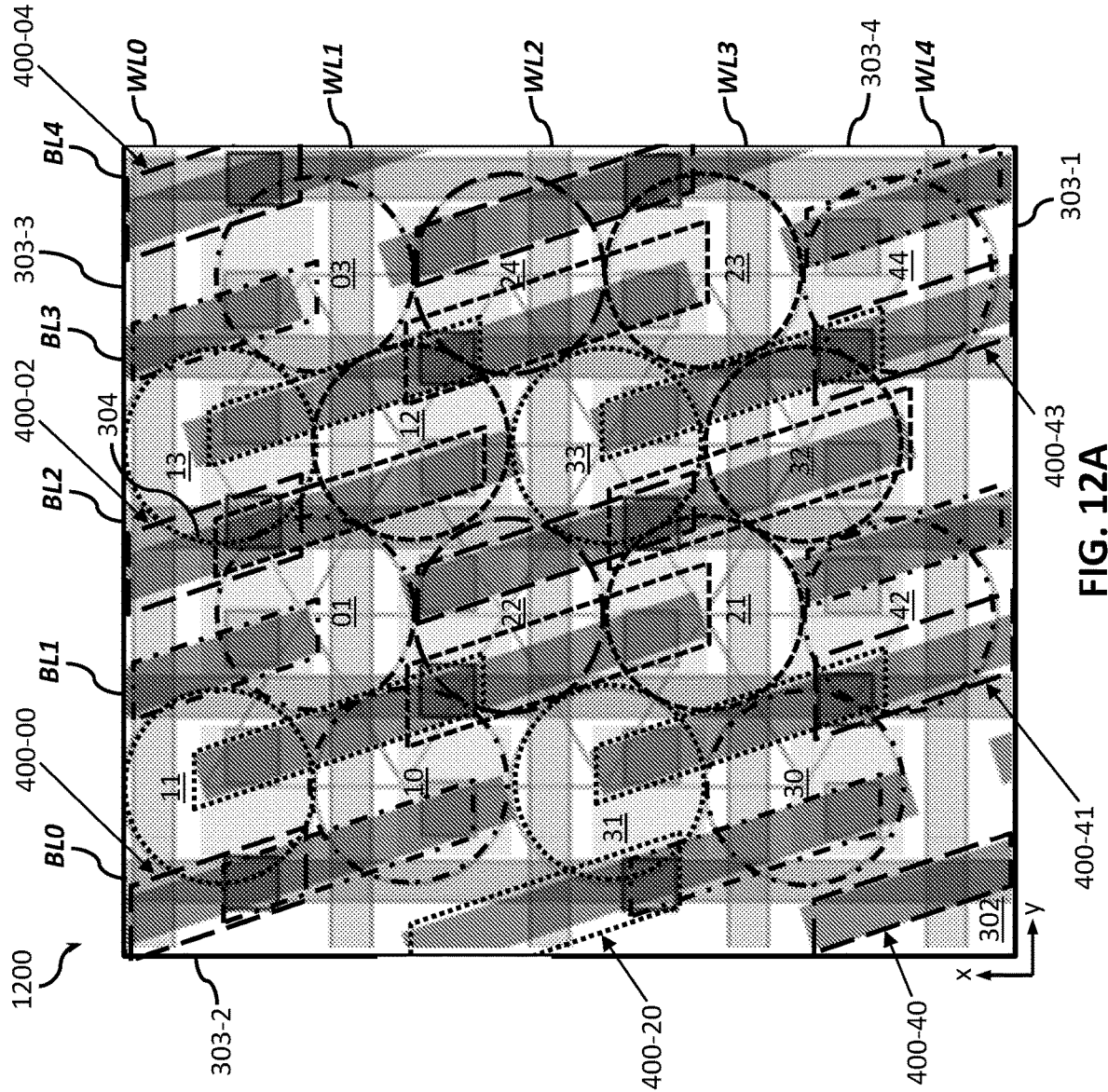
FIGS. 12A-12G provide top-down views of a memory array with diagonal elongated structures, in accordance with some embodiments.

FIG. 12A provides a view of the IC device 1200 with all the memory cells 400 in that view being individually labeled. Those memory cells 400 that have their access transistors and capacitors fit entirely in the view of the IC device 1200 are labeled in FIG. 12A with two digits corresponding to, respectively, the WL and the BL that they are connected to (the same notation as that used in FIG. 5), the two digits shown within the circular contours identifying their capacitors. Those memory cells 400 that do not fit entirely in the view of the IC device 1200 are labeled in FIG. 12A with a reference numeral 400 followed by the two digits.

Figure 12B:
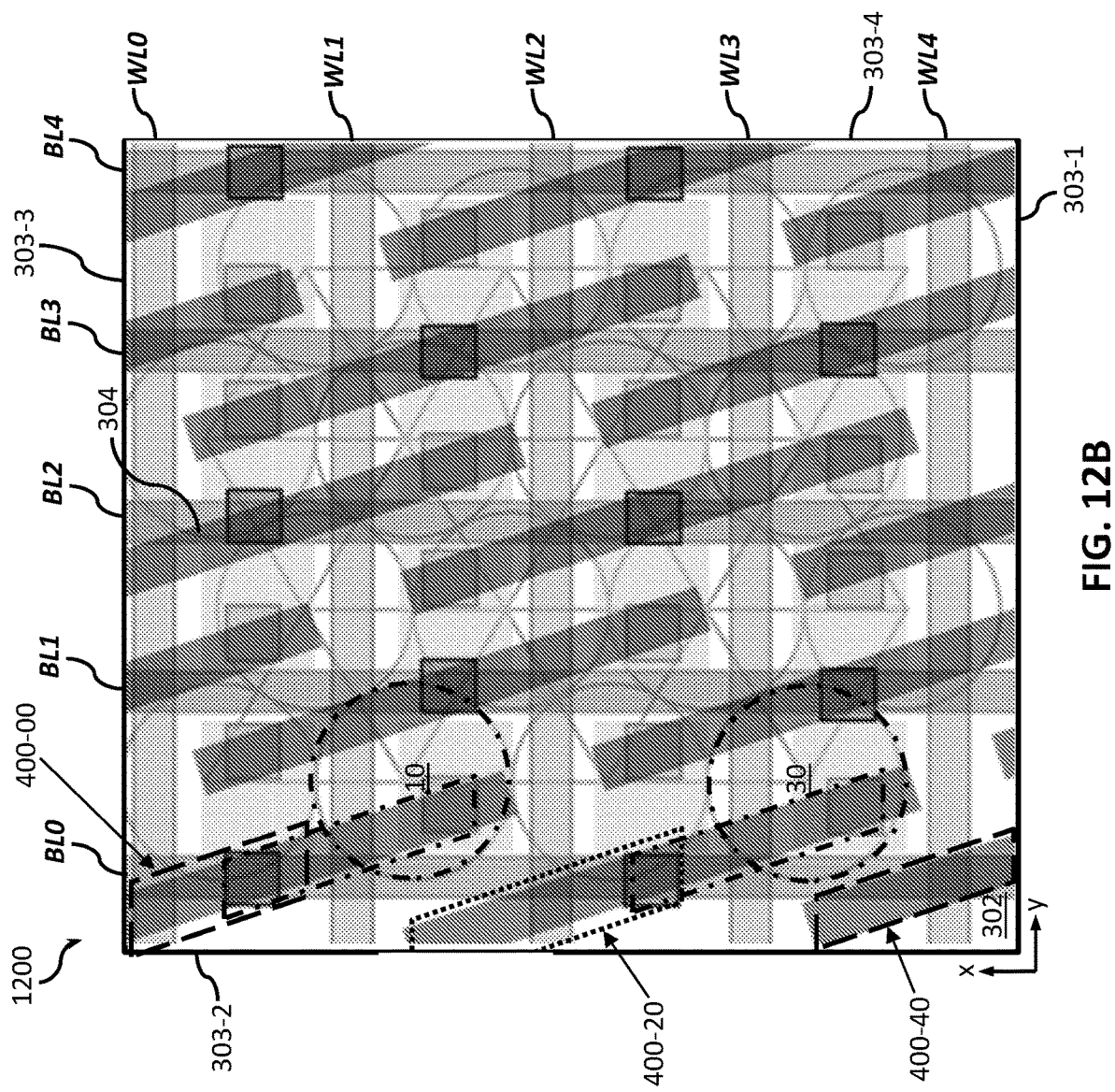
Figure 12C:
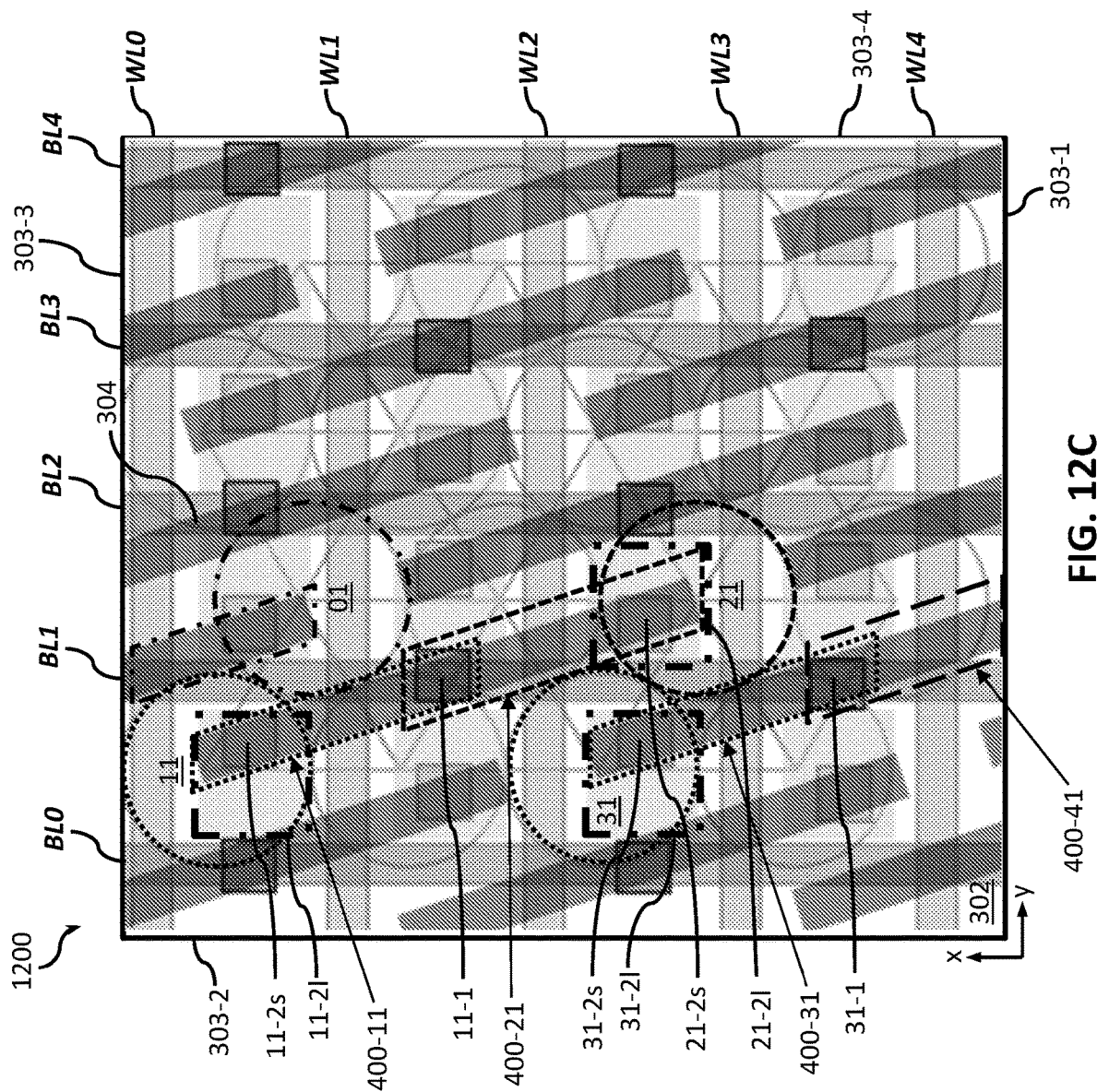
Figure 12D:
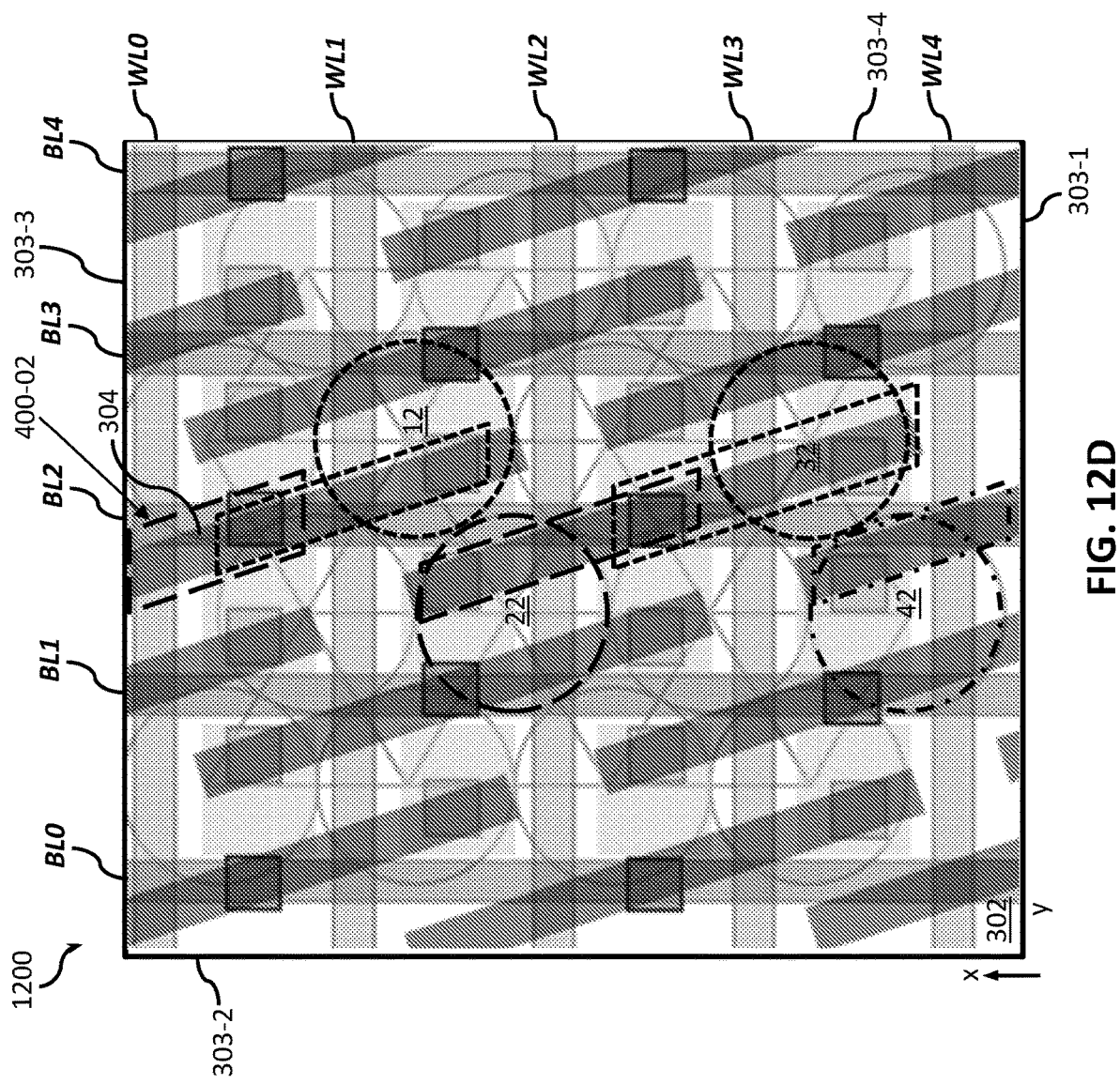
Figure 12E:
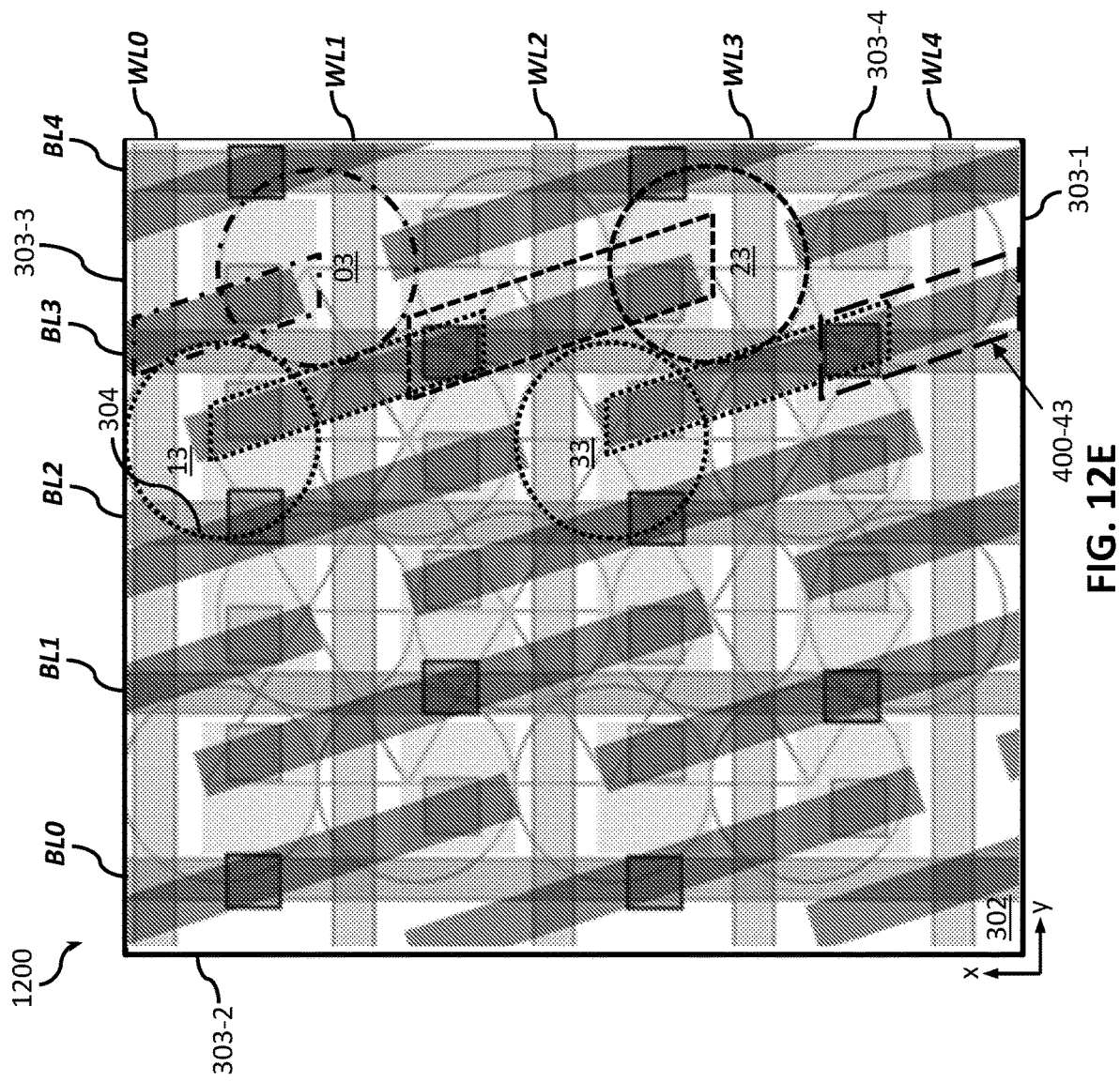
Figure 12F:
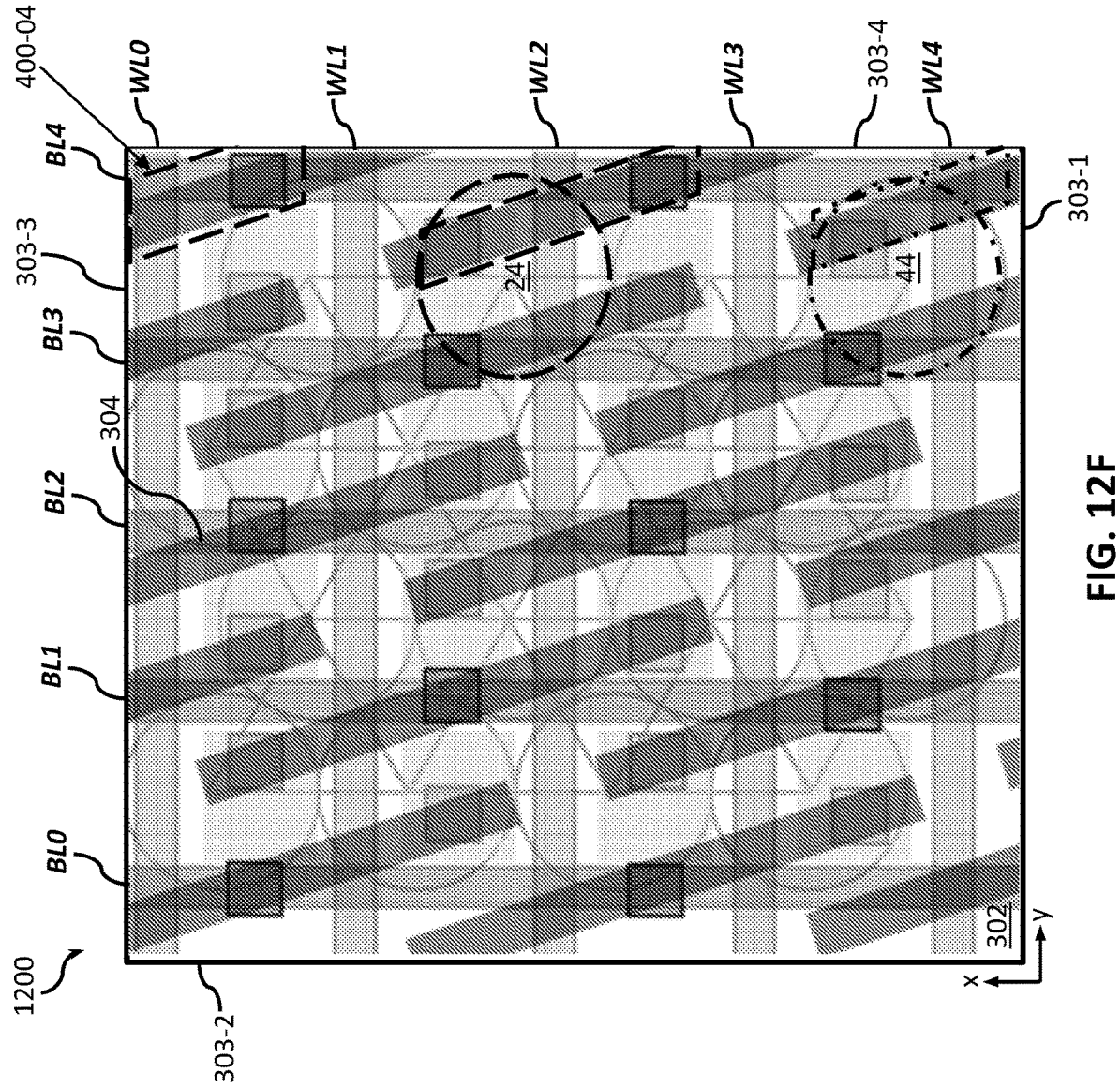

FIG. 12B provides a view of the IC device 1200 with labels provided only for the memory cells 400 coupled to the BL0. FIG. 12C provides a view of the IC device 1200 with labels provided only for the memory cells 400 coupled to the BL1. FIG. 12D provides a view of the IC device 1200 with labels provided only for the memory cells 400 coupled to the BL2. FIG. 12E provides a view of the IC device 1200 with labels provided only for the memory cells 400 coupled to the BL3. FIG. 12F provides a view of the IC device 1200 with labels provided only for the memory cells 400 coupled to the BL4. If overlayed over one another, the labels of these individual views of the memory cells 400 labeled to different BLs add up to the view of FIG. 12A. These drawings clearly illustrate that providing either capacitors 466 or the BLs coupled to different memory cells 400 as backside components and angling the elongated structures 304 allows achieving a particularly compact arrangement of the memory cells 400 that is simply not possible with conventional approaches. These drawings also illustrate how having pairs of access transistors 410 provided along a single elongated structure 304 share a single first S/D terminal also helps achieving a particularly compact arrangement. For example, a square labeled 11-1 in FIG. 12C illustrates an electrical connection between BL1 and the shared first S/D terminal of the access transistors 410 of the memory cells 400-11 and 400-21 that are coupled to BL1. Similarly, a square labeled 31-1 in FIG. 12C illustrates an electrical connection between BL1 and the shared first S/D terminal of the access transistors 410 of the memory cells 400-31 and 400-41 that are also coupled to BL1. A square labeled 11-2s in FIG. 12C illustrates a first interconnect (e.g., a first via) to provide an electrical connection between the second S/D terminal of the access transistor 410 of the memory cell 400-11 and a second interconnect (e.g., a first via, shown in FIG. 12C as a square labeled 11-2l, enclosed within a dash-dotted contour), where the second interconnect 11-2l is further connected to an electrode of the capacitor 466 of the memory cell 400-11. In this manner, the first and second interconnects 11-2s and 11-2l may provide an electrical connection between the second S/D terminal of the access transistor 410 of the memory cell 400-11 and the capacitor 466 of the memory cell 400-11. In a second example, a square labeled 21-2s in FIG. 12C illustrates a first interconnect (e.g., a first via) to provide an electrical connection between the second S/D terminal of the access transistor 410 of the memory cell 400-21 and a second interconnect (e.g., a first via, shown in FIG. 12C as a square labeled 21-2l, enclosed within a dash-dotted contour), where the second interconnect 21-2l is further connected to an electrode of the capacitor 466 of the memory cell 400-21. In this manner, the first and second interconnects 21-2s and 21-2l may provide an electrical connection between the second S/D terminal of the access transistor 410 of the memory cell 400-21 and the capacitor 466 of the memory cell 400-21. In a third example, a square labeled 31-2s in FIG. 12C illustrates a first interconnect (e.g., a first via) to provide an electrical connection between the second S/D terminal of the access transistor 410 of the memory cell 400-31 and a second interconnect (e.g., a first via, shown in FIG. 12C as a square labeled 31-2l, enclosed within a dash-dotted contour), where the second interconnect 31-2l is further connected to an electrode of the capacitor 466 of the memory cell 400-31. In this manner, the first and second interconnects 31-2s and 31-2l may provide an electrical connection between the second S/D terminal of the access transistor 410 of the memory cell 400-31 and the capacitor 466 of the memory cell 400-31. Similar squares of a pair of first and second interconnects are shown for other memory cells 400 in FIG. 12C and other views of FIGS. 12A-12G but are not specifically labeled to not clutter the drawings. The use of the letters "s" and "l" in the reference numerals indicating first and second interconnects are indicative of the first interconnect being smaller (hence, the letter "s") than the second interconnect, or, conversely, of the second interconnect being larger (hence, the letter "l") than the first interconnect.

In FIGS. 12A-12G, a crossing of a particular WL with a particular elongated structure 304 (with the first and second S/D terminals on either side of the crossing) represents the gate of the access transistor 410, as described above.

Figure 12G:
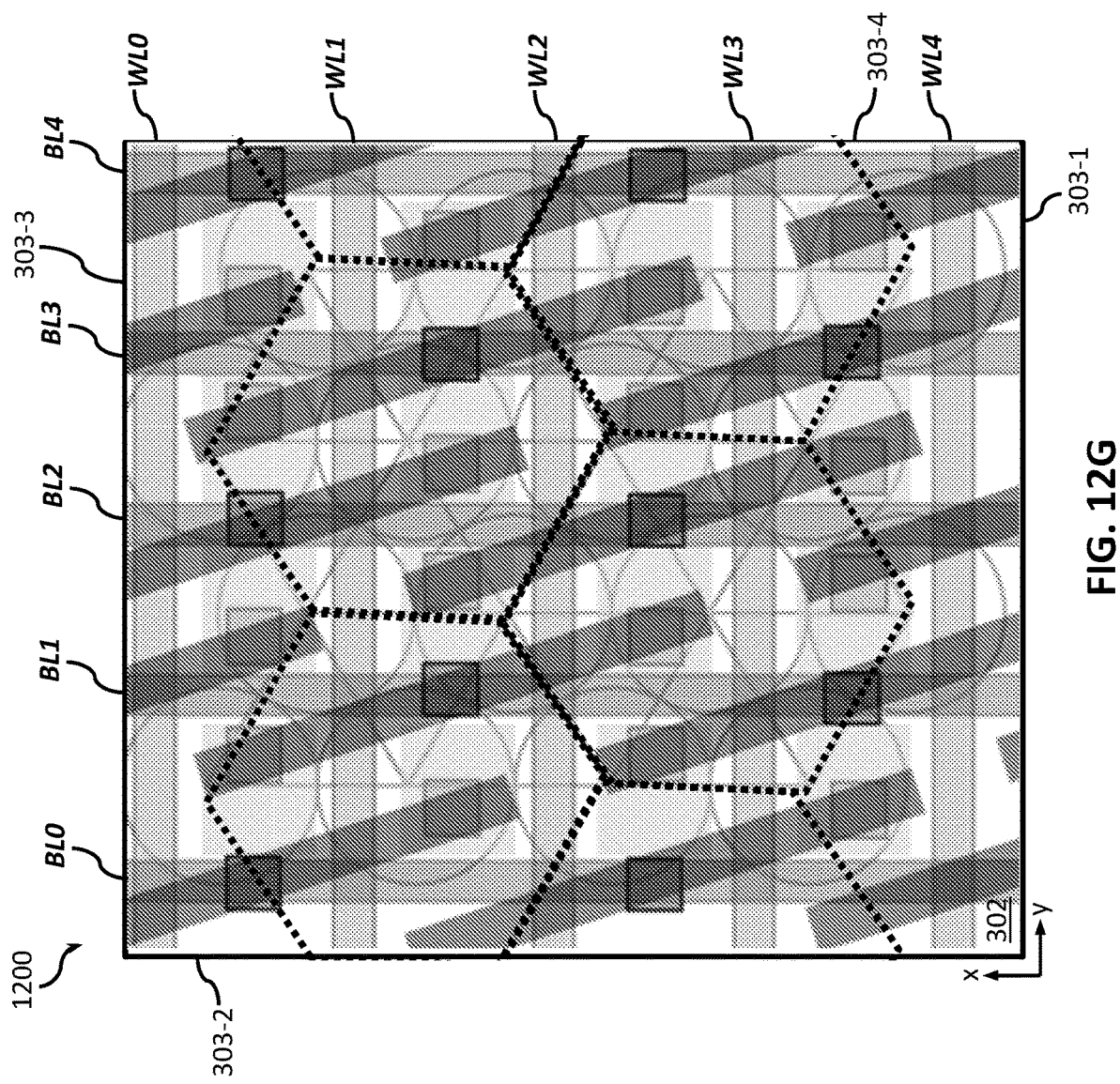

FIG. 12G illustrates how the arrangement of the IC device 1200 as described above enables placing the capacitors 466 of different memory cells 400 as close as possible to one another, e.g., in a hexagonal (honeycomb) arrangement, where some of the example hexagons are shown with dotted contours. In some embodiments, the outer electrodes of the capacitors 466 of different memory cells 400 may be in contact with one another, e.g., if they are all to be coupled to the same voltage during operation (e.g., to ground). In other embodiments, the outer electrodes of the capacitors 466 may still be centered around substantially the same point (i.e., one of the vertices of one or more hexagons) but not be in contact with one another, e.g., if they are to be coupled to different voltages during operation. In such embodiments, the outer electrodes of the capacitors 466 may be electrically isolated from one another with an insulator material.

Any of the memory arrays with backside components and angled transistors described herein may be included in other/larger components. For example, in various embodiments, memory arrays with backside components and angled transistors described herein may be part of one or more of: an IC device, a central processing unit, a memory device (e.g., a high-bandwidth memory device), a memory cell, a logic circuit, input/output circuitry, a field programmable gate array (FPGA) component such as an FPGA transceiver or an FPGA logic, a power delivery circuitry, an amplifier (e.g., a III-V amplifier), Peripheral Component Interconnect Express (pa E) circuitry, Double Data Rate (DDR) transfer circuitry, a computing device (e.g., a wearable or a handheld computing device), etc.

Figures 13A, 13B:
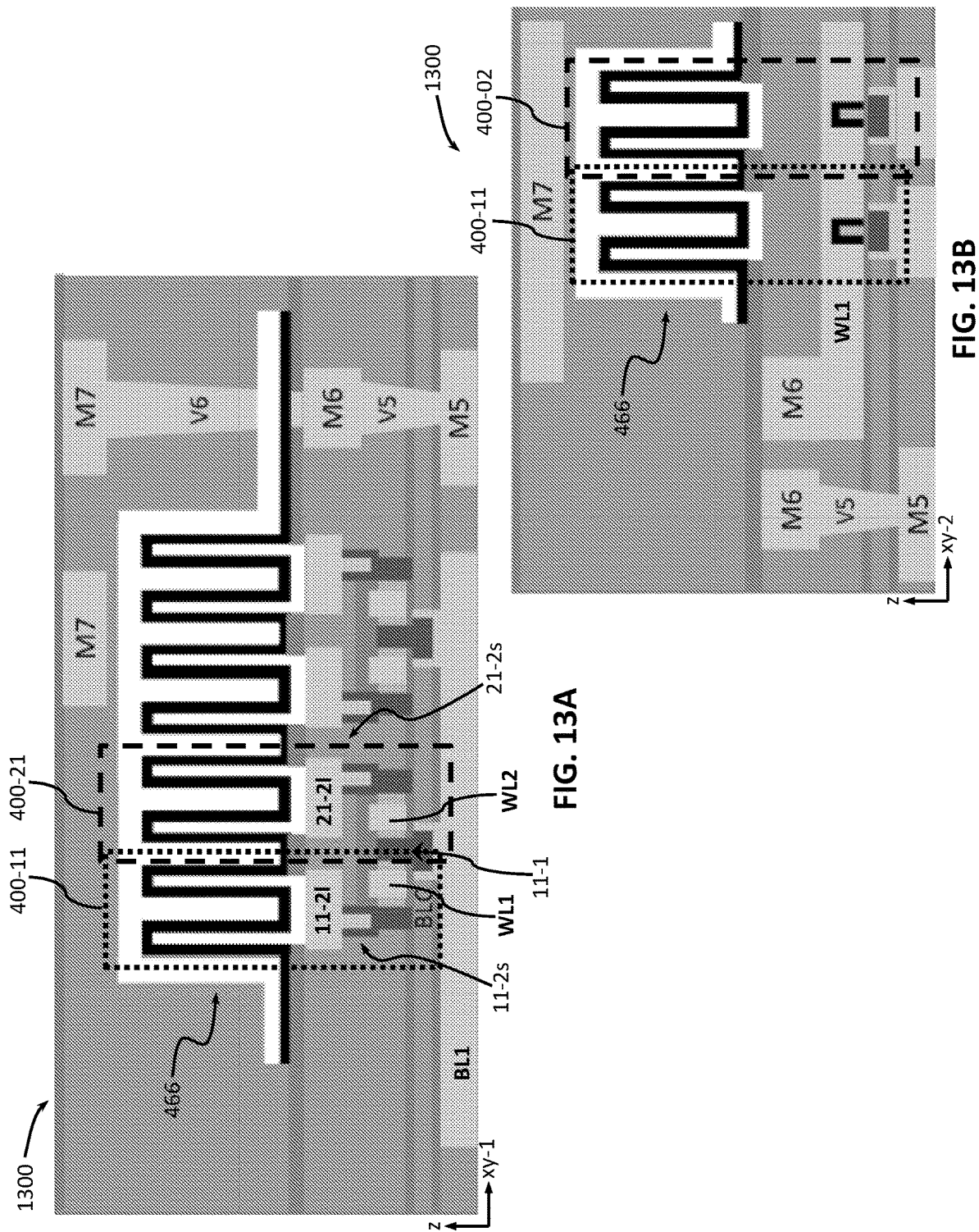
FIGS. 13A-13B provide cross-sectional side views of an IC device with a memory array with diagonal elongated structures, in accordance with some embodiments.

FIGS. 13A-13B provide cross-sectional side views of an IC device 1300 with a memory array with diagonal elongated structures, in accordance with some embodiments. The views of FIGS. 13A and 13B are both cross-sectional side views with cross-sections taken along planes that are both substantially perpendicular to the support structure 302 and are perpendicular to one another. That's why the vertical axis for both FIG. 13A and FIG. 13B is a z-axis of the example coordinate system shown, but the horizontal axes are different axes (xy-1 in FIG. 13A and xy-2 in FIG. 13B) in an x-y plane of the example coordinate system shown, where xy-1 is perpendicular to xy-2, and both are parallel to the support structure 302.

The IC device 1300 may be an example embodiment of the IC device 1200, where elements described with reference to the IC device 1200 are shown in FIGS. 13A-13B with the same reference numerals. For example, FIG. 13A illustrates the memory cells 400-11 and 400-21 as described above (e.g., as labeled in FIG. 12C), both coupled to a shared BL, BL1. To that end, FIG. 13A clearly illustrates the relative difference in cross-sectional widths of the interconnects 11-2s and 11-2l or, similarly, of the interconnects 21-2s and 21-2l, as was described above with reference to FIG. 12C. FIG. 13B further illustrates that, in some embodiments, the first capacitor electrodes of the capacitors 466 of different memory cells 400 may be different (i.e., each one of the memory cells 400 may have a respective/individual first capacitor electrode), while the second capacitor electrodes of these capacitors 466 may be realized by providing a single shared second capacitor electrode, shared among multiple memory cells 400 coupled to a given BL. As described above, in some embodiments, all of the second capacitor electrodes of the memory cells 400 of the memory array 500 may be coupled to one another, and all coupled to a single voltage, e.g., to a ground voltage, or some other reference voltage. FIG. 13B illustrates the memory cells 400-11 and 400-02 as described above (e.g., as labeled in FIG. 12C and FIG. 12D), both coupled to a shared WL, WL1. Interconnects labeled as M5, V5, M6, V6, and M7 represent different example metal lines and vias to provide electrical connectivity to various terminals of the IC device 1300.

The memory arrays with backside components and angled transistors disclosed herein, as well as any IC devices or larger components that include such memory arrays, may be included in any suitable electronic device. FIGS. 14-18 illustrate various examples of apparatuses that may include one or more of the memory arrays with backside components and angled transistors disclosed herein.

Figure 14:
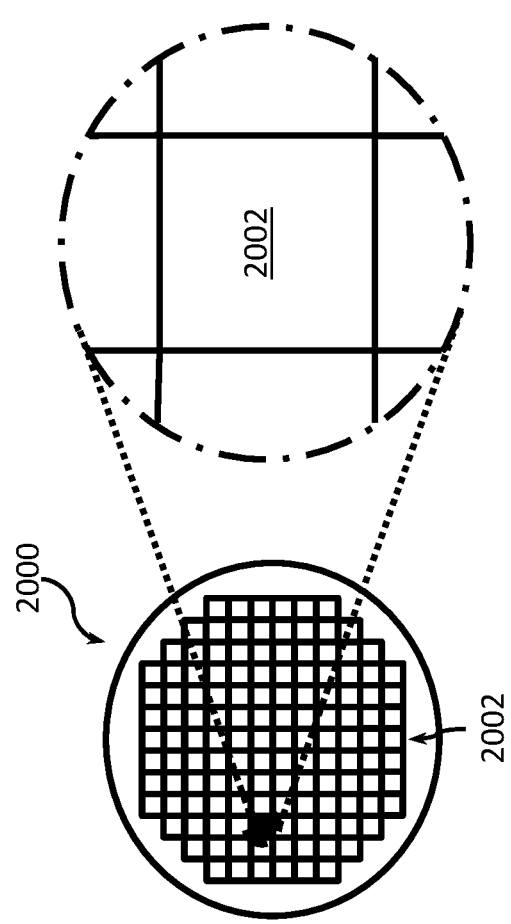
FIG. 14 provides top views of a wafer and dies that may include one or more memory arrays with backside components and angled transistors in accordance with any of the embodiments disclosed herein.

FIG. 14 illustrates top views of a wafer 2000 and dies 2002 that may include one or more memory arrays with backside components and angled transistors in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 15. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more memory arrays with backside components and angled transistors as described herein). After the fabrication of the semiconductor product is complete (e.g., after manufacture of any embodiment of the memory arrays with backside components and angled transistors as described herein), the wafer 2000 may undergo a singulation process in which each of the dies 2002 is separated from one another to provide discrete "chips" of the semiconductor product. In particular, devices that include one or more memory arrays with backside components and angled transistors as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., a hysteretic memory device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 17) or other logic that is configured to store information in the memory devices or execute instructions stored in the memory array.

Figure 15:
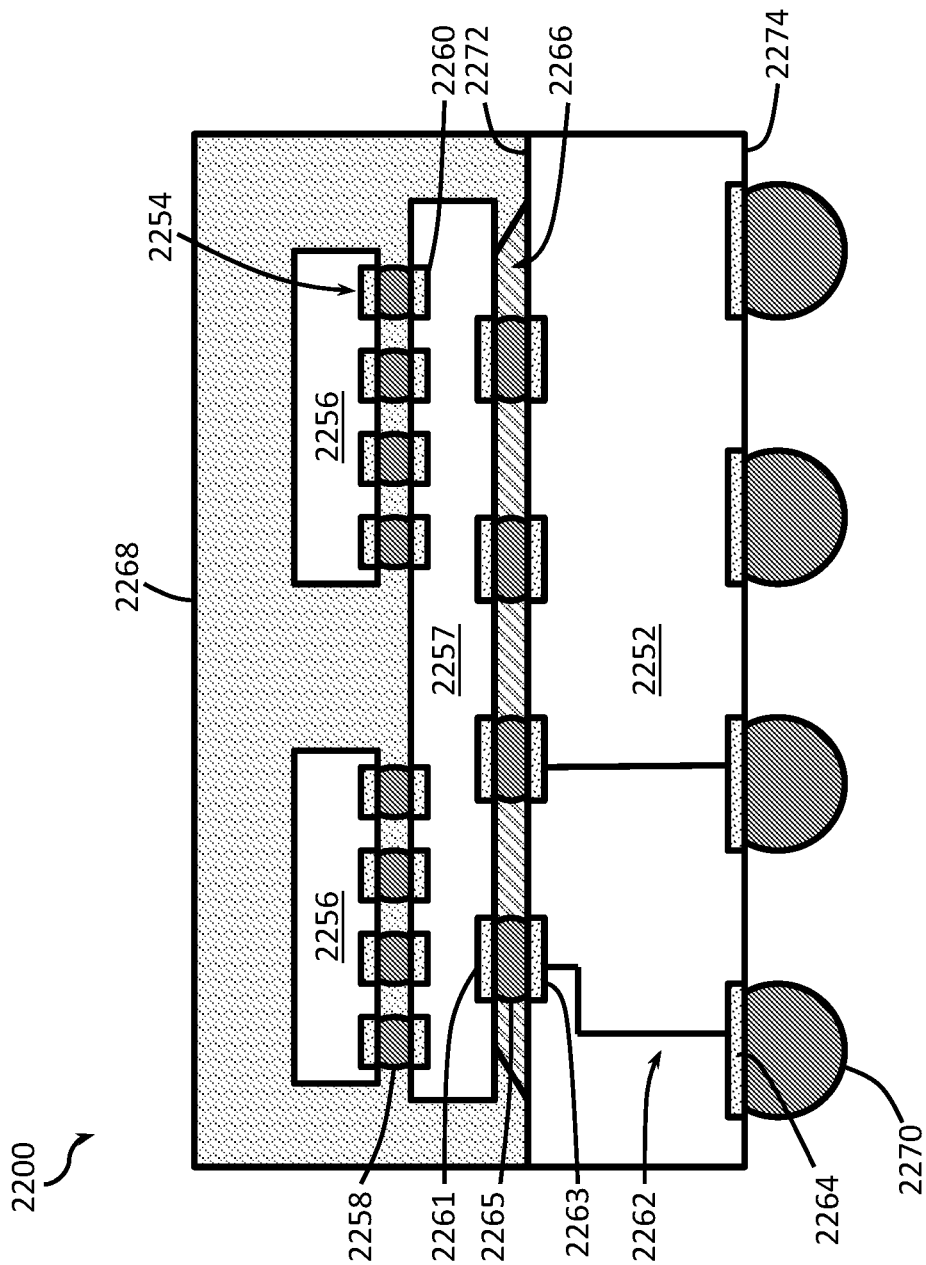
FIG. 15 is a cross-sectional side view of an IC package that may include one or more memory arrays with backside components and angled transistors in accordance with any of the embodiments disclosed herein.

FIG. 15 is a side, cross-sectional view of an example IC package 2200 that may include one or more memory arrays with backside components and angled transistors in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 15 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 15 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 15 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 16.

The dies 2256 may take the form of any of the embodiments of the die 2002 discussed herein (e.g., may include any of the embodiments of the memory arrays with backside components and angled transistors as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high-bandwidth memory), including embedded memory dies as described herein. In some embodiments, any of the dies 2256 may include one or more memory arrays with backside components and angled transistors, e.g., as discussed above; in some embodiments, at least some of the dies 2256 may not include any memory arrays with backside components and angled transistors.

The IC package 2200 illustrated in FIG. 15 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 15, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 16:
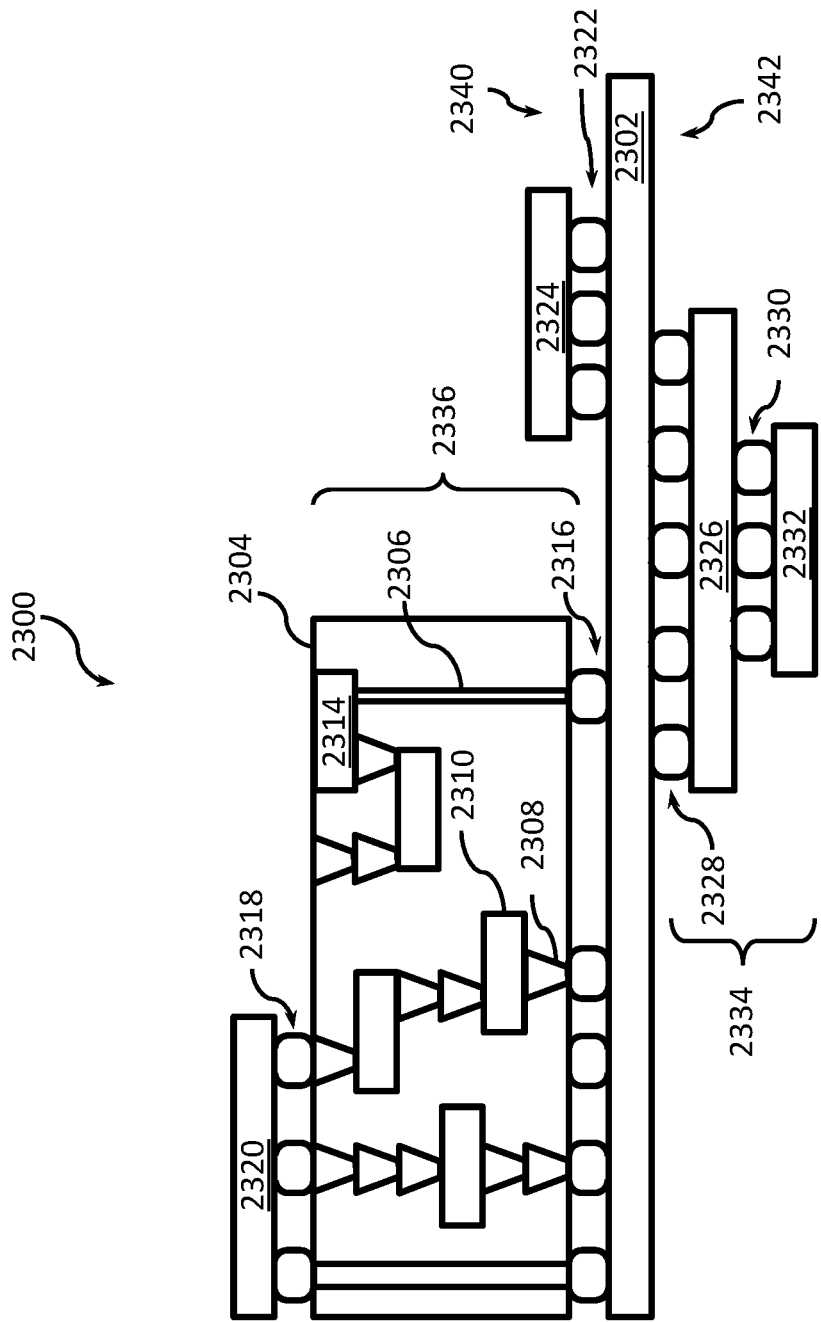
FIG. 16 is a cross-sectional side view of an IC device assembly that may include one or more memory arrays with backside components and angled transistors in accordance with any of the embodiments disclosed herein.

FIG. 16 is a cross-sectional side view of an IC device assembly 2300 that may include components having one or more memory arrays with backside components and angled transistors in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more memory arrays with backside components and angled transistors in accordance with any of the embodiments disclosed herein; e.g., any of the IC packages discussed below with reference to the IC device assembly 2300 may take the form of any of the embodiments of the IC package 2200 discussed above with reference to FIG. 15 (e.g., may include one or more memory arrays with backside components and angled transistors provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 16 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 16), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 14), an IC device, or any other suitable component. In particular, the IC package 2320 may include one or more memory arrays with backside components and angled transistors as described herein. Although a single IC package 2320 is shown in FIG. 16, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 16, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 16 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 17:
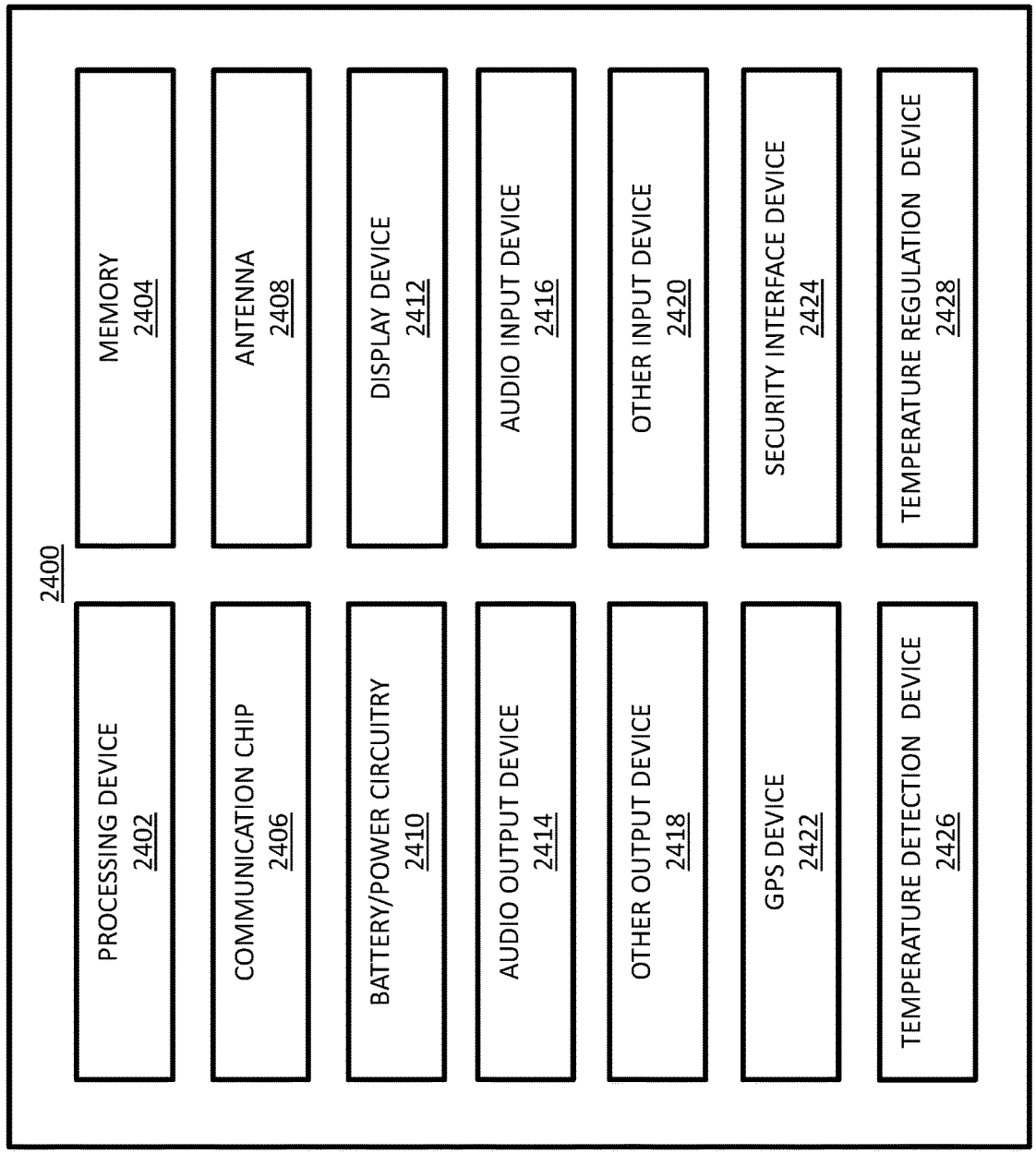
FIG. 17 is a block diagram of an example computing device that may include one or more memory arrays with backside components and angled transistors in accordance with any of the embodiments disclosed herein.

FIG. 17 is a block diagram of an example computing device 2400 that may include one or more components including one or more memory arrays with backside components and angled transistors in accordance with any of the embodiments disclosed herein. For example, any suitable ones of the components of the computing device 2400 may include a die (e.g., the die 2002 of FIG. 14) having one or more memory arrays with backside components and angled transistors as described herein. Any one or more of the components of the computing device 2400 may include, or be included in, an IC package 2200 of FIG. 15 or an IC device 2300 of FIG. 16.

A number of components are illustrated in FIG. 17 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 17, but the computing device 2400 may include interface circuitry for coupling to the one or more components. For example, the computing device 2400 may not include a display device 2412, but may include display device interface circuitry (e.g., a connector and driver circuitry) to which a display device 2412 may be coupled. In another set of examples, the computing device 2400 may not include an audio input device 2416 or an audio output device 2414, but may include audio input or output device interface circuitry (e.g., connectors and supporting circuitry) to which an audio input device 2416 or audio output device 2414 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include embedded DRAM (eDRAM) or spin transfer torque MRAM.

In some embodiments, the computing device 2400 may include a communication chip 2406 (e.g., one or more communication chips). For example, the communication chip 2406 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2406 may implement any of a number of wireless standards or protocols, including but not limited to Institute for Electrical and Electronic Engineers (IEEE) standards including Wi-Fi (IEEE 1402.11 family), IEEE 1402.16 standards (e.g., IEEE 1402.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 1402.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.16 standards. The communication chip 2406 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2406 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2406 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2406 may operate in accordance with other wireless protocols in other embodiments. The computing device 2400 may include an antenna 2408 to facilitate wireless communications and/or to receive other wireless communications (such as AM or FM radio transmissions).

In some embodiments, the communication chip 2406 may manage wired communications, such as electrical, optical, or any other suitable communication protocols (e.g., the Ethernet). As noted above, the communication chip 2406 may include multiple communication chips. For instance, a first communication chip 2406 may be dedicated to shorter-range wireless communications such as Wi-Fi or Bluetooth, and a second communication chip 2406 may be dedicated to longer-range wireless communications such as global positioning system (GPS), EDGE, GPRS, CDMA, WiMAX, LTE, EV-DO, or others. In some embodiments, a first communication chip 2406 may be dedicated to wireless communications, and a second communication chip 2406 may be dedicated to wired communications.

The computing device 2400 may include a battery/power circuitry 2410. The battery/power circuitry 2410 may include one or more energy storage devices (e.g., batteries or capacitors) and/or circuitry for coupling components of the computing device 2400 to an energy source separate from the computing device 2400 (e.g., AC line power).

The computing device 2400 may include a display device 2412 (or corresponding interface circuitry, as discussed above). The display device 2412 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2414 (or corresponding interface circuitry, as discussed above). The audio output device 2414 may include any device that generates an audible indicator, such as speakers, headsets, or earbuds, for example.

The computing device 2400 may include an audio input device 2416 (or corresponding interface circuitry, as discussed above). The audio input device 2416 may include any device that generates a signal representative of a sound, such as microphones, microphone arrays, or digital instruments (e.g., instruments having a musical instrument digital interface (MIDI) output).

The computing device 2400 may include an other output device 2418 (or corresponding interface circuitry, as discussed above). Examples of the other output device 2418 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may include a GPS device 2422 (or corresponding interface circuitry, as discussed above). The GPS device 2422 may be in communication with a satellite-based system and may receive a location of the computing device 2400, as known in the art.

The computing device 2400 may include a security interface device 2424. The security interface device 2424 may include any device that provides security features for the computing device 2400 or for any individual components therein (e.g., for the processing device 2402 or for the memory 2404). Examples of security features may include authorization, access to digital certificates, access to items in keychains, etc. Examples of the security interface device 2424 may include a software firewall, a hardware firewall, an antivirus, a content filtering device, or an intrusion detection device.

In some embodiments, the computing device 2400 may include a temperature detection device 2426 and a temperature regulation device 2428.

The temperature detection device 2426 may include any device capable of determining temperatures of the computing device 2400 or of any individual components therein (e.g., temperatures of the processing device 2402 or of the memory 2404). In various embodiments, the temperature detection device 2426 may be configured to determine temperatures of an object (e.g., the computing device 2400, components of the computing device 2400, devices coupled to the computing device, etc.), temperatures of an environment (e.g., a data center that includes, is controlled by, or otherwise associated with the computing device 2400), and so on. The temperature detection device 2426 may include one or more temperature sensors. Different temperature sensors of the temperature detection device 2426 may have different locations within and around the computing device 2400. A temperature sensor may generate data (e.g., digital data) representing detected temperatures and provide the data to another device, e.g., to the temperature regulation device 2428, the processing device 2402, the memory 2404, etc. In some embodiments, a temperature sensor of the temperature detection device 2426 may be turned on or off, e.g., by the processing device 2402 or an external system. The temperature sensor detects temperatures when it is on and does not detect temperatures when it is off. In other embodiments, a temperature sensor of the temperature detection device 2426 may detect temperatures continuously and automatically or detect temperatures at predefined times or at times triggered by an event associated with the computing device 2400 or any components therein.

The temperature regulation device 2428 may include any device configured to change (e.g., decrease) temperatures, e.g., based on one or more target temperatures and/or based on temperature measurements performed by the temperature detection device 2426. A target temperature may be a preferred temperature. A target temperature may depend on a setting in which the computing device 2400 operates. In some embodiments, the target temperature may be 200 Kelvin degrees or lower. In some embodiments, the target temperature may be 20 Kelvin degrees or lower, or 5 Kelvin degrees or lower. Target temperatures for different objects and different environments of, or associated with, the computing device 2400 can be different. In some embodiments, cooling provided by the temperature regulation device 2428 may be a multi-stage process with temperatures ranging from room temperature to 4K or lower.

In some embodiments, the temperature regulation device 2428 may include one or more cooling devices. Different cooling device may have different locations within and around the computing device 2400. A cooling device of the temperature regulation device 2428 may be associated with one or more temperature sensors of the temperature detection device 2426 and may be configured to operate based on temperatures detected the temperature sensors. For instance, a cooling device may be configured to determine whether a detected ambient temperature is above the target temperature or whether the detected ambient temperature is higher than the target temperature by a predetermined value or determine whether any other temperature-related condition associated with the temperature of the computing device 2400 is satisfied. In response to determining that one or more temperature-related condition associated with the temperature of the computing device 2400 are satisfied (e.g., in response to determining that the detected ambient temperature is above the target temperature), a cooling device may trigger its cooling mechanism and start to decrease the ambient temperature. Otherwise, the cooling device does not trigger any cooling. A cooling device of the temperature regulation device 2428 may operate with various cooling mechanisms, such as evaporation cooling, radiation cooling, conduction cooling, convection cooling, other cooling mechanisms, or any combination thereof. A cooling device of the temperature regulation device 2428 may include a cooling agent, such as a water, oil, liquid nitrogen, liquid helium, etc. In some embodiments, the temperature regulation device 2428 may be, for example, a dilution refrigerator, a helium-3 refrigerator, or a liquid helium refrigerator. In some embodiments, the temperature regulation device 2428 or any portions thereof (e.g., one or more of the individual cooling devices) may be connected to the computing device 2400 in close proximity (e.g., less than about 1 meter) or may be provided in a separate enclosure where a dedicated heat exchanger (e.g., a compressor, a heating, ventilation, and air conditioning (HVAC) system, liquid helium, liquid nitrogen, etc.) may reside.

By maintaining the target temperatures, the energy consumption of the computing device 2400 (or components thereof) can be reduced, while the computing efficiency may be improved. For example, when the computing device 2400 (or components thereof) operates at lower temperatures, energy dissipation (e.g., heat dissipation) may be reduced. Further, energy consumed by semiconductor components (e.g., energy needed for switching transistors of any of the components of the computing device 2400) can also be reduced. Various semiconductor materials may have lower resistivity and/or higher mobility at lower temperatures. That way, the electrical current per unit supply voltage may be increased by lowering temperatures. Conversely, for the same current that would be needed, the supply voltage may be lowered by lowering temperatures. As energy correlates to the supply voltage, the energy consumption of the semiconductor components may lower too. In some implementations, the energy savings due to reducing heat dissipation and reducing energy consumed by semiconductor components of the computing device or components thereof may outweigh (sometimes significantly outweigh) the costs associated with energy needed for cooling.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Figure 18:
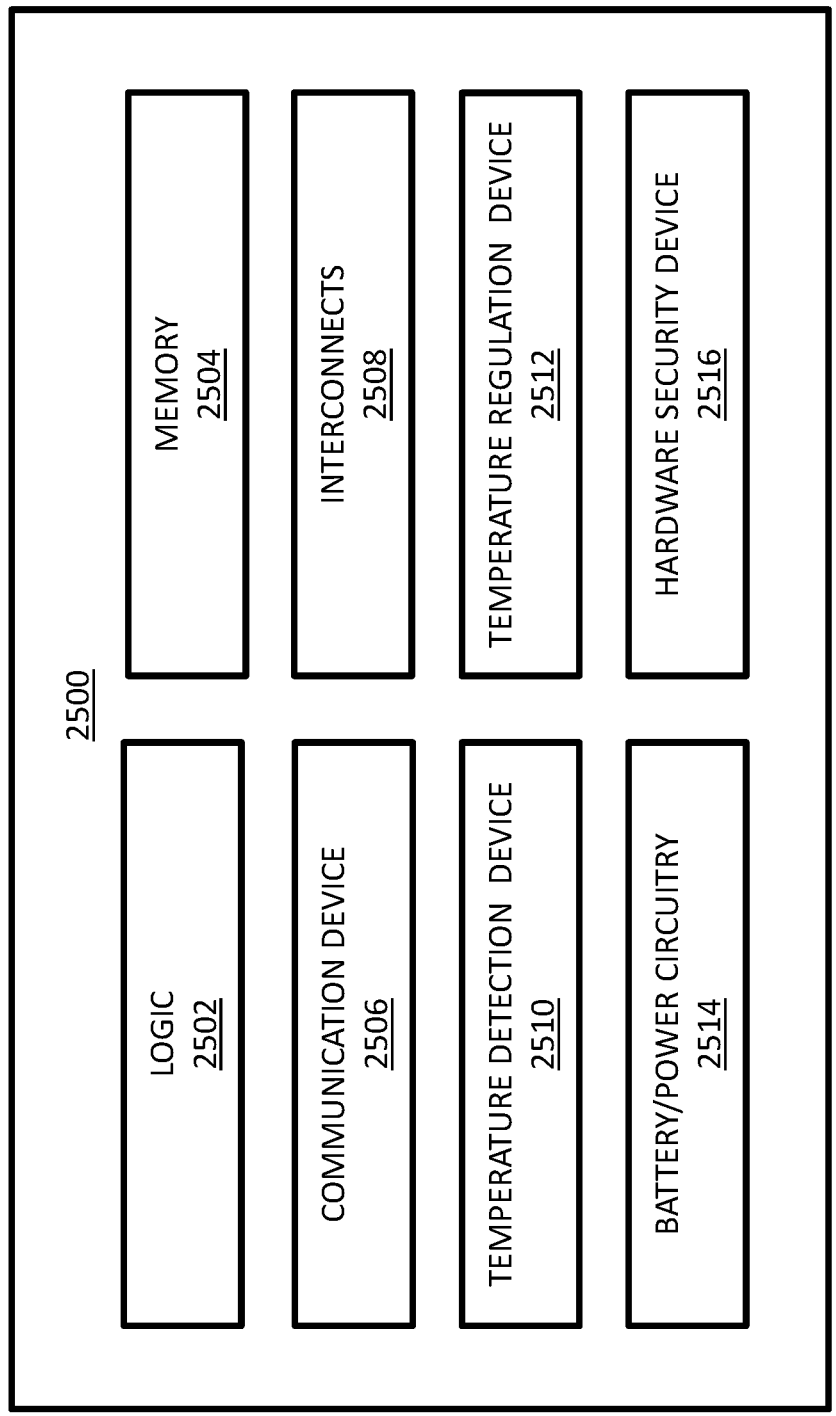
FIG. 18 is a block diagram of an example processing device that may include one or more memory arrays with backside components and angled transistors in accordance with any of the embodiments disclosed herein.

FIG. 18 is a block diagram of an example processing device 2500 that may include one or more memory arrays with backside components and angled transistors in accordance with any of the embodiments disclosed herein. For example, any suitable ones of the components of the processing device 2500 may include a die (e.g., the die 2002 of FIG. 14) having one or more memory arrays with backside components and angled transistors as described herein. Any one or more of the components of the processing device 2500 may include, or be included in, an IC device 2300 (FIG. 16). Any one or more of the components of the processing device 2500 may include, or be included in, an IC package 2200 of FIG. 15 or an IC device 2300 of FIG. 16. Any one or more of the components of the processing device 2500 may include, or be included in, a computing device 2400 of FIG. 17; for example, the processing device 2500 may be the processing device 2402 of the computing device 2400.

A number of components are illustrated in FIG. 18 as included in the processing device 2500, but any one or more of these components may be omitted or duplicated, as suitable for the application. In some embodiments, some or all of the components included in the processing device 2500 may be attached to one or more motherboards. In some embodiments, some or all of these components are fabricated on a single SoC die or coupled to a single support structure, e.g., to a single carrier substrate.

Additionally, in various embodiments, the processing device 2500 may not include one or more of the components illustrated in FIG. 18, but the processing device 2500 may include interface circuitry for coupling to the one or more components. For example, the processing device 2500 may not include a memory 2504, but may include display device interface circuitry (e.g., a connector and driver circuitry) to which a memory 2504 may be coupled.

The processing device 2500 may include logic circuitry 2502 (e.g., one or more circuits configured to implement logic/compute functionality). Examples of such circuits include ICs implementing one or more of input/output (I/O) functions, arithmetic operations, pipelining of data, etc.

In some embodiments, the logic circuitry 2502 may include one or more circuits responsible for read/write operations with respect to the data stored in the memory 2504. To that end, the logic circuitry 2502 may include one or more I/O ICs configured to control access to data stored in the memory 2504.

In some embodiments, the logic circuitry 2502 may include one or more high-performance compute dies, configured to perform various operations with respect to data stored in the memory 2504 (e.g., arithmetic and logic operations, pipelining of data from one or more memory dies of the memory 2504, and possibly also data from external devices/chips). In some embodiments, the logic circuitry 2502 may be configured to only control I/O access to data but not perform any operations on the data. In some embodiments, the logic circuitry 2502 may implement ICs configured to implement I/O control of data stored in the memory 2504, assemble data from the memory 2504 for transport (e.g., transport over a central bus) to devices/chips that are either internal or external to the processing device 2500, etc. In some embodiments, the logic circuitry 2502 may not be configured to perform any operations on the data besides I/O and assembling for transport to the memory 2504.

The processing device 2500 may include a memory 2504, which may include one or more ICs configure to implement memory circuitry (e.g., ICs implementing one or more of memory devices, memory arrays, control logic configured to control the memory devices and arrays, etc.). In some embodiments, the memory 2504 may be implemented substantially as described above with reference to the memory 2404 (FIG. 17). In some embodiments, the memory 2504 may be a designated device configured to provide storage functionality for the components of the processing device 2500 (e.g., local), while the memory 1604 may be configured to provide system-level storage functionality for the entire computing device 2400 (e.g., global). In some embodiments, the memory 2504 may include memory that shares a die with the logic circuitry 2502.

In some embodiments, the memory 2504 may include a flat memory (also sometimes referred to as a "flat hierarchy memory" or a "linear memory") and, therefore, may also be referred to as a "basin memory." As known in the art, a flat memory or a linear memory refers to a memory addressing paradigm in which memory may appear to the program as a single contiguous address space, where a processor can directly and linearly address all of the available memory locations without having to resort to memory segmentation or paging schemes. Thus, the memory implemented in the memory 2504 may be a memory that is not divided into hierarchical layer or levels in terms of access of its data.

In some embodiments, the memory 2504 may include a hierarchical memory. In this context, hierarchical memory refers to the concept of computer architecture where computer storage is separated into a hierarchy based on features of memory such as response time, complexity, capacity, performance, and controlling technology. Designing for high performance may require considering the restrictions of the memory hierarchy, e.g., the size and capabilities of each component. With hierarchical memory, each of the various memory components can be viewed as part of a hierarchy of memories ($m_1$, $m_2$, . . . , $m_n$) in which each member $m_i$ is typically smaller and faster than the next highest member $m_{i+1}$ of the hierarchy. To limit waiting by higher levels, a lower level of a hierarchical memory structure may respond by filling a buffer and then signaling for activating the transfer. For example, in some embodiments, the hierarchical memory implemented in the memory 2504 may be separated into four major storage levels: 1) internal storage (e.g., processor registers and cache), 2) main memory (e.g., the system RAM and controller cards), and 3) on-line mass storage (e.g., secondary storage), and 4) off-line bulk storage (e.g., tertiary, and off-line storage). However, as the number of levels in the memory hierarchy and the performance at each level has increased over time and is likely to continue to increase in the future, this example hierarchical division provides only one non-limiting example of how the memory 2504 may be arranged.

The processing device 2500 may include a communication device 2506, which may be implemented substantially as described above with reference to the communication chip 2406 (FIG. 17). In some embodiments, the communication device 2506 may be a designated device configured to provide communication functionality for the components of the processing device 2500 (e.g., local), while the communication chip 2406 may be configured to provide system-level communication functionality for the entire computing device 2400 (e.g., global).

The processing device 2500 may include interconnects 2508, which may include any element or device that includes an electrically conductive material for providing electrical connectivity to one or more components of, or associated with, a processing device 2500 or/and between various such components. Examples of the interconnects 2508 include conductive lines/wires (also sometimes referred to as "lines" or "metal lines" or "trenches") and conductive vias (also sometimes referred to as "vias" or "metal vias"), metallization stacks, redistribution layers, MIM structures, etc.

The processing device 2500 may include a temperature detection device 2510 which may be implemented substantially as described above with reference to the temperature detection device 2426 of FIG. 17 but configured to determine temperatures on a more local scale, e.g., of the processing device 2500 of components thereof. In some embodiments, the temperature detection device 2510 may be a designated device configured to provide temperature detection functionality for the components of the processing device 2500 (e.g., local), while the temperature detection device 2426 may be configured to provide system-level temperature detection functionality for the entire computing device 2400 (e.g., global).

The processing device 2500 may include a temperature regulation device 2512 which may be implemented substantially as described above with reference to the temperature regulation device 2428 of FIG. 17 but configured to regulate temperatures on a more local scale, e.g., of the processing device 2500 of components thereof. In some embodiments, the temperature regulation device 2512 may be a designated device configured to provide temperature regulation functionality for the components of the processing device 2500 (e.g., local), while the temperature regulation device 2428 may be configured to provide system-level temperature regulation functionality for the entire computing device 2400 (e.g., global).

The processing device 2500 may include a battery/power circuitry 2514 which may be implemented substantially as described above with reference to the battery/power circuitry 2410 of FIG. 17. In some embodiments, the battery/power circuitry 2514 may be a designated device configured to provide battery/power functionality for the components of the processing device 2500 (e.g., local), while the battery/power circuitry 2410 may be configured to provide system-level battery/power functionality for the entire computing device 2400 (e.g., global).

The processing device 2500 may include a hardware security device 2516 which may be implemented substantially as described above with reference to the security interface device 2424 of FIG. 17. In some embodiments, the hardware security device 2516 may be a physical computing device configured to safeguard and manage digital keys, perform encryption and decryption functions for digital signatures, authentication, and other cryptographic functions. In some embodiments, the hardware security device 2516 may include one or more secure cryptoprocessors chips.

The above description of illustrated implementations of the disclosure, including what is described in the Abstract, is not intended to be exhaustive or to limit the disclosure to the precise forms disclosed. Unless specified otherwise, in various embodiments, features described with respect to one of the drawings may be combined with those described with respect to other drawings.

The following paragraphs provide various examples of the embodiments disclosed herein.

Example 1 provides an IC device that includes a support structure (e.g., a die or a substrate); memory cells, an individual memory cell including a transistor and a capacitor coupled to the transistor; and memory control lines, including a plurality of bitlines (BLs) and a plurality of wordlines (WLs), where pair of the memory cells coupled to a single BL of the plurality of BLs are along a single elongated structure including one or more semiconductor materials and have a single source or drain (S/D) region shared between the transistors of the pair, gates of the transistors of the pair are coupled to different WLs of the plurality of WLs, the transistors of the memory cells are on a front side of the support structure, at least one of a set of the capacitors of the memory cells and a set of the BLs is on a back side of the support structure, and a longitudinal axis of the elongated structure is diagonal with respect to an edge of the support structure.

Example 2 provides the IC device according to example 1, where the memory control lines further include a plurality of platelines (PLs), the elongated structure is one of a plurality of elongated structures, the pair is a first pair, second pair of the memory cells coupled to a single PL of the plurality of PLs are along different elongated structures of the plurality of elongated structures, and gates of the transistors of the second pair are coupled to different WLs of the plurality of WLs.

Example 3 provides the IC device according to example 2, where S/D regions of the second pair are coupled to different BLs of the plurality of BLs.

Example 4 provides the IC device according to any one of examples 2-3, where the longitudinal axis of the elongated structure is diagonal with respect to the edge of the support structure for each of the plurality of elongated structures (i.e., the plurality of elongated structures are parallel to one another).

Example 5 provides the IC device according to any one of examples 1-4, where an angle between an edge of the support structure and a projection of the elongated structure onto a plane of the support structure is between about 10 degrees and 80 degrees.

Example 6 provides the IC device according to any one of examples 1-5, where the plurality of the WLs is in a layer over the front side of the support structure, the set of the BLs is on the back side of the support structure, an individual BL of the set of BLs includes a liner material on sidewalls of the BL and a fill material between the sidewalls of the BL (i.e., the liner material is between and may be in contact with, or interface, the insulator material in one side and the fill material on the other side), and, in a transverse cross-section of the BL, a width of the BL at a first distance from the layer (i.e., from the plane of the plurality of WLs) is smaller than a width of the BL at a second distance from the layer when the first distance is smaller than the second distance.

Example 7 provides the IC device according to example 6, where the set of the capacitors is on the back side of the support structure, and, in a cross-section of an individual capacitor along a plane perpendicular to the layer of the WLs, a width of the capacitor at a third distance from the layer (i.e., from the plane of the plurality of WLs) is smaller than a width of the capacitor at a fourth distance from the layer when the third distance is smaller than the fourth distance.

Example 8 provides the IC device according to any one of examples 1-5, where the plurality of the WLs is in a layer over the front side of the support structure, the set of the BLs is on the back side of the support structure, and, in a transverse cross-section of the BL, a width of the BL at a first distance from the layer (i.e., from the plane of the plurality of WLs) is larger than a width of the BL at a second distance from the layer when the first distance is smaller than the second distance.

Example 9 provides the IC device according to example 8, where the set of the capacitors is on the back side of the support structure, and, in a cross-section of an individual capacitor along a plane perpendicular to the layer of the WLs, a width of the capacitor at a third distance from the layer (i.e., from the plane of the plurality of WLs) is smaller than a width of the capacitor at a fourth distance from the layer when the third distance is smaller than the fourth distance.

Example 10 provides the IC device according to any one of examples 1-5, where the plurality of the WLs is in a layer over the front side of the support structure, the set of the capacitors is on the back side of the support structure, and, in a cross-section of an individual capacitor along a plane perpendicular to the layer of the WLs, a width of the capacitor at a first distance from the layer (i.e., from the plane of the plurality of WLs) is smaller than a width of the capacitor at a second distance from the layer when the first distance is smaller than the second distance.

Example 11 provides the IC device according to example 10, where the set of the BLs is on the back side of the support structure, and, in a transverse cross-section of an individual BL of the set of BLs, a width of the BL at a third distance from the layer (i.e., from the plane of the plurality of WLs) is smaller than a width of the BL at a fourth distance from the layer when the third distance is smaller than the fourth distance.

Example 12 provides the IC device according to example 11, where the BL includes a liner material on sidewalls of the BL and a fill material between the sidewalls of the BL (i.e., the liner material is between and may be in contact with, or interface, the insulator material in one side and the fill material on the other side).

Example 13 provides the IC device according to example 10, where the set of the BLs is on the back side of the support structure, and, in a transverse cross-section of an individual BL of the set of BLs, a width of the BL at a third distance from the layer (i.e., from the plane of the plurality of WLs) is larger than a width of the BL at a fourth distance from the layer when the third distance is smaller than the fourth distance.

Example 14 provides an IC device that includes a support structure (e.g., a die, a substrate, a wafer, a carrier substrate, etc.); a memory cell provided over the support structure, the memory cell including a transistor and a capacitor coupled to the transistor; and a control line provided over the support structure, coupled to a first source or drain (S/D) region of the transistor, where the control line is in a first layer, the first layer includes an insulator material, the control line includes a liner material on sidewalls of the control line and a fill material between the sidewalls of the control line (i.e., the liner material is between and may be in contact with, or interface, the insulator material in one side and the fill material on the other side), a channel region of the transistor is in a second layer, the capacitor is in a third layer and is coupled to a second S/D region of the transistor, the second layer is between the first layer and the third layer, a width of the capacitor at a first distance from the second layer is smaller than a width of the capacitor at a second distance from the second layer when the first distance from the second layer is smaller than the second distance from the second layer, and, in a transverse cross-section of the control line, a width of the control line at a third distance from the second layer is smaller than a width of the control line at a fourth distance from the second layer when the third distance from the second layer is smaller than the fourth distance from the second layer.

Example 15 provides the IC device according to example 14, where, in a transverse cross-section of the channel region of the transistor, a width of the channel region at a first distance from the first layer is larger than a width of the channel region at a second distance from the first layer when the first distance from the first layer is smaller than the second distance from the first layer.

Example 16 provides the IC device according to any one of examples 14-15, further including a support structure (e.g., a carrier substrate or a package substrate); and an elongated structure including one or more semiconductor materials, where the memory cell and the control line are provided over the support structure, the channel region of the transistor is a portion of the elongated structure, and an angle between an edge of the support structure and a projection of the elongated structure onto a plane of the support structure is between about 10 degrees and 80 degrees.

Example 17 provides the IC device according to example 16, where an angle between the edge of the support structure and a projection of the control line onto the plane of the support structure is either about 0 degrees or about 90 degrees.

Example 18 provides the IC device according to example 17, where the control line is a first control line, the IC device further includes a second control line coupled to a gate of the transistor, and an angle between the projection of the first control line onto the plane of the support structure and a projection of the second control line onto the plane of the support structure is about 90 degrees.

Example 19 provides the IC device according to example 16, where the control line is a first control line, the IC device further includes a second control line coupled to a gate of the transistor, and an angle between the edge of the support structure and a projection of the second control line onto the plane of the support structure is either about 90 degrees or about 0 degrees.

Example 20 provides an IC device that includes a support structure (e.g., a die, a substrate, a wafer, a carrier substrate, etc.); a memory cell provided over the support structure, the memory cell including a transistor and a capacitor coupled to the transistor; and a control line provided over the support structure, coupled to a first S/D region of the transistor, where the control line is in a first layer, the first layer includes an insulator material, a channel region of the transistor is in a second layer, the capacitor is in a third layer and is coupled to a second S/D region of the transistor, the second layer is between the first layer and the third layer, a width of the capacitor at a first distance from the second layer is smaller than a width of the capacitor at a second distance from the second layer when the first distance from the second layer is smaller than the second distance from the second layer, and, in a transverse cross-section of the control line, a width of the control line at a third distance from the second layer is larger than a width of the control line at a fourth distance from the second layer when the third distance from the second layer is smaller than the fourth distance from the second layer.

Example 21 provides the IC device according to example 20, where, in a transverse cross-section of the channel region of the transistor, a width of the channel region at a first distance from the first layer is larger than a width of the channel region at a second distance from the first layer when the first distance from the first layer is smaller than the second distance from the first layer.

Example 22 provides the IC device according to any one of examples 20-21, further including a support structure (e.g., a carrier substrate or a package substrate); and an elongated structure including one or more semiconductor materials, where the memory cell and the control line are provided over the support structure, the channel region of the transistor is a portion of the elongated structure, and an angle between an edge of the support structure and a projection of the elongated structure onto a plane of the support structure is between about 10 degrees and 80 degrees.

Example 23 provides the IC device according to example 22, where an angle between the edge of the support structure and a projection of the control line onto the plane of the support structure is either about 0 degrees or about 90 degrees.

Example 24 provides the IC device according to example 23, where the control line is a first control line, the IC device further includes a second control line coupled to a gate of the transistor, and an angle between the projection of the first control line onto the plane of the support structure and a projection of the second control line onto the plane of the support structure is about 90 degrees.

Example 25 provides the IC device according to example 22, where the control line is a first control line, the IC device further includes a second control line coupled to a gate of the transistor, and an angle between the edge of the support structure and a projection of the second control line onto the plane of the support structure is either about 90 degrees or about 0 degrees.

Example 26 provides an IC device that includes a support structure (e.g., a die, a substrate, a wafer, a carrier substrate, etc.); a memory cell provided over the support structure, the memory cell including a transistor and a capacitor coupled to the transistor; and a control line provided over the support structure, coupled to a first S/D region of the transistor, where the control line is in a first layer, the first layer includes an insulator material, the control line includes a liner material on sidewalls of the control line and a fill material between the sidewalls of the control line (i.e., the liner material is between and may be in contact with, or interface, the insulator material in one side and the fill material on the other side), a channel region of the transistor is in a second layer, the capacitor is in a third layer and is coupled to a second S/D region of the transistor, the second layer is between the first layer and the third layer, a width of the capacitor at a first distance from the second layer is smaller than a width of the capacitor at a second distance from the second layer when the first distance from the second layer is smaller than the second distance from the second layer, and, in a transverse cross-section of the control line, a width of the control line at a third distance from the second layer is larger than a width of the control line at a fourth distance from the second layer when the third distance from the second layer is smaller than the fourth distance from the second layer.

Example 27 provides the IC device according to example 26, where, in a transverse cross-section of the channel region of the transistor, a width of the channel region at a first distance from the first layer is larger than a width of the channel region at a second distance from the first layer when the first distance from the first layer is smaller than the second distance from the first layer.

Example 28 provides the IC device according to any one of examples 26-27, further including a support structure (e.g., a carrier substrate or a package substrate); and an elongated structure including one or more semiconductor materials, where the memory cell and the control line are provided over the support structure, the channel region of the transistor is a portion of the elongated structure, and an angle between an edge of the support structure and a projection of the elongated structure onto a plane of the support structure is between about 10 degrees and 80 degrees.

Example 29 provides the IC device according to example 28, where an angle between the edge of the support structure and a projection of the control line onto the plane of the support structure is either about 0 degrees or about 90 degrees.

Example 30 provides the IC device according to example 29, where the control line is a first control line, the IC device further includes a second control line coupled to a gate of the transistor, and an angle between the projection of the first control line onto the plane of the support structure and a projection of the second control line onto the plane of the support structure is about 90 degrees.

Example 31 provides the IC device according to example 28, where the control line is a first control line, the IC device further includes a second control line coupled to a gate of the transistor, and an angle between the edge of the support structure and a projection of the second control line onto the plane of the support structure is either about 90 degrees or about 0 degrees.

Example 32 provides an IC device that includes a support structure (e.g., a die, a substrate, a wafer, a carrier substrate, etc.); a memory cell provided over the support structure, the memory cell including a transistor and a capacitor coupled to the transistor; and a control line provided over the support structure, coupled to a first S/D region of the transistor, where the control line is in a first layer, the first layer includes an insulator material, a channel region of the transistor is in a second layer, the capacitor is in a third layer and is coupled to a second S/D region of the transistor, the second layer is between the first layer and the third layer, a width of the capacitor at a first distance from the second layer is smaller than a width of the capacitor at a second distance from the second layer when the first distance from the second layer is smaller than the second distance from the second layer, and in a transverse cross-section of the control line, a width of the control line at a third distance from the second layer is smaller than a width of the control line at a fourth distance from the second layer when the third distance from the second layer is smaller than the fourth distance from the second layer.

Example 33 provides the IC device according to example 32, where, in a transverse cross-section of the channel region of the transistor, a width of the channel region at a first distance from the first layer is larger than a width of the channel region at a second distance from the first layer when the first distance from the first layer is smaller than the second distance from the first layer.

Example 34 provides the IC device according to any one of examples 32-33, further including a support structure (e.g., a carrier substrate or a package substrate); and an elongated structure including one or more semiconductor materials, where the memory cell and the control line are provided over the support structure, the channel region of the transistor is a portion of the elongated structure, and an angle between an edge of the support structure and a projection of the elongated structure onto a plane of the support structure is between about 10 degrees and 80 degrees.

Example 35 provides the IC device according to example 34, where an angle between the edge of the support structure and a projection of the control line onto the plane of the support structure is either about 0 degrees or about 90 degrees.

Example 36 provides the IC device according to example 35, where the control line is a first control line, the IC device further includes a second control line coupled to a gate of the transistor, and an angle between the projection of the first control line onto the plane of the support structure and a projection of the second control line onto the plane of the support structure is about 90 degrees.

Example 37 provides the IC device according to example 34, where the control line is a first control line, the IC device further includes a second control line coupled to a gate of the transistor, and an angle between the edge of the support structure and a projection of the second control line onto the plane of the support structure is either about 90 degrees or about 0 degrees.

Example 38 provides the IC device according to any one of the preceding examples, where the elongated structure is a fin.

Example 39 provides the IC device according to any one of the preceding examples, where the elongated structure is a nanoribbon.

Example 40 provides the IC device according to any one of the preceding examples, where the elongated structure is a planar channel structure.

In a further example of the IC device according to any one of the preceding examples, capacitors of these IC devices may be arranged in a hexagonal arrangement according to any one of examples 41-44 and/or may include an insulator material according to any one of examples 45-48.

Example 41 provides an IC device that includes a support structure (e.g., a die, a substrate, a wafer, a carrier substrate, etc.) and a plurality of layers over the support structure. The plurality of layers includes a first layer including parallel control lines extending in a first direction; a second layer including parallel elongated structures extending in a second direction, the elongated structures including one or more semiconductor materials; and a third layer including capacitors. The IC device further includes transistors having channel regions in different portions of the elongated structures. In such an IC device, the second layer is between the first layer and the third layer; for at least a subset of the elongated structures, an individual elongated structure includes two transistors sharing a single first source or drain (S/D) region, the first S/D region coupled to one of the control lines; second S/D regions of different ones of the transistors are coupled to different ones of the capacitors; the capacitors are in a hexagonal arrangement; and an angle between the first direction and the second direction is between about 10 and 80 degrees.

Example 42 provides the IC device according to example 41, where the third layer includes an insulator material, an individual capacitor is in a respective opening in the insulator material and includes a first electrically conductive material, a second electrically conductive material, and an insulator material between the first and second electrically conductive materials, and, for the individual capacitor, the first electrically conductive material lines sidewalls and bottom of the respective opening, the insulator material lines sidewalls and bottom of the respective opening lined with the first electrically conductive material, and the second electrically conductive material at least partially filles remainder of the respective opening lined with the first electrically conductive material and the insulator material.

Example 43 provides the IC device according to example 42, where the first electrically conductive materials of two or more capacitors are electrically continuous (e.g., in conductive contact).

Example 44 provides the IC device according to any one of examples 42-43, where centers of the respective openings of different ones of the capacitors are vertices of hexagons in the hexagonal arrangement.

Example 45 provides the IC device according to any one of examples 41-44, where at least 5% of the insulator material is in one or more of a tetragonal phase and an orthorhombic phase.

Example 46 provides the IC device according to any one of examples 41-45, where the insulator material includes hafnium, oxygen, and one or more dopants, where the one or more dopants include one or more of zirconium, yttrium, silicon, germanium, and aluminum.

Example 47 provides the IC device according to any one of examples 41-46, where the insulator material includes oxygen and one or more rare-earth elements.

Example 48 provides the IC device according to any one of examples 41-47, where the insulator material is a substoichiometric material with vacancies in concentration of at least about $10^{18}$ vacancies per cubic centimeter.

Example 49 provides the IC device according to any one of examples 41-48, where the elongated structures are fins.

Example 50 provides the IC device according to any one of examples 41-48, where the elongated structures are nanoribbons.

Example 51 provides the IC device according to any one of the preceding examples, where the IC device includes or is a part of a central processing unit.

Example 52 provides the IC device according to any one of the preceding examples, where the IC device includes or is a part of a memory device, e.g., a high-bandwidth memory device.

Example 53 provides the IC device according to any one of the preceding examples, where the IC device further includes a plurality of memory cells, each of the memory cells including a storage element.

Example 54 provides the IC device according to example 53, where the storage element is one of a capacitor, a magnetoresistive material, a ferroelectric material, or a resistance-changing material.

Example 55 provides the IC device according to any one of the preceding examples, where the IC device includes or is a part of a logic circuit.

Example 56 provides the IC device according to any one of the preceding examples, where the IC device includes or is a part of input/output circuitry.

Example 57 provides the IC device according to any one of the preceding examples, where the IC device includes or is a part of an FPGA transceiver.

Example 58 provides the IC device according to any one of the preceding examples, where the IC device includes or is a part of an FPGA logic.

Example 59 provides the IC device according to any one of the preceding examples, where the IC device includes or is a part of a power delivery circuitry.

Example 60 provides the IC device according to any one of the preceding examples, where the IC device includes or is a part of a III-V amplifier.

Example 61 provides the IC device according to any one of the preceding examples, where the IC device includes or is a part of PCIE circuitry or DDR transfer circuitry.

Example 62 provides an IC package that includes a die comprising an IC device according to any one of the preceding examples; and a further IC component, coupled to the die.

Example 63 provides the IC package according to example 62, where the further IC component includes one of a package substrate, an interposer, or a further IC support structure.

Example 64 provides a computing device that includes a carrier substrate and an IC device, coupled to the carrier substrate, where the IC device is an IC device according to any one of the preceding examples, or the IC device is included in the IC package according to any one of examples 62-63.

Example 65 provides the computing device according to example 64, where the computing device is a wearable or handheld computing device.

Example 66 provides the computing device according to examples 64 or 65, where the computing device further includes one or more communication chips and an antenna.

Example 67 provides the computing device according to any one of examples 64-66, where the carrier substrate is a motherboard.

Example 68 provides a method of manufacturing an IC device, the method including providing the IC device according to any one of the preceding examples.

The invention claimed is:

1. An integrated circuit (IC) device, comprising:
a substrate;
memory cells, an individual memory cell comprising a transistor and a capacitor; and
memory control lines, comprising a plurality of bitlines (BLs) and a plurality of wordlines (WLs), wherein:
pair of the memory cells coupled to a single BL of the plurality of BLs are along a single elongated structure comprising one or more semiconductor materials and have a single source or drain (S/D) region shared between the transistors of the pair,
gates of the transistors of the pair are coupled to different WLs of the plurality of WLs,
the transistors of the memory cells are on a front side of the substrate,
at least one of a set of the capacitors of the memory cells and a set of the BLs is on a back side of the substrate, and
a longitudinal axis of the elongated structure is diagonal with respect to an edge of the substrate.

2. The IC device according to claim 1, wherein:
the memory control lines further include a plurality of platelines (PLs),
the elongated structure is one of a plurality of elongated structures,
the pair is a first pair,
second pair of the memory cells coupled to a single PL of the plurality of PLs are along different elongated structures of the plurality of elongated structures, and
gates of the transistors of the second pair are coupled to different WLs of the plurality of WLs, and
the longitudinal axis of the elongated structure is diagonal with respect to the edge of the substrate for each of the plurality of elongated structures.

3. The IC device according to claim 1, wherein:
the plurality of the WLs is in a layer over the front side of the substrate,
the set of the BLs is on the back side of the substrate,
an individual BL of the set of BLs includes a liner material on sidewalls of the BL and a fill material between the sidewalls of the BL, and
in a transverse cross-section of the BL, a width of the BL at a first distance from the layer is smaller than a width of the BL at a second distance from the layer when the first distance is smaller than the second distance.

4. The IC device according to claim 3, wherein:
the set of the capacitors is on the back side of the substrate,
in a cross-section of an individual capacitor along a plane perpendicular to the layer, a width of the capacitor at a third distance from the layer is smaller than a width of the capacitor at a fourth distance from the layer when the third distance is smaller than the fourth distance.

5. The IC device according to claim 1, wherein:
the plurality of the WLs is in a layer over the front side of the substrate,
the set of the BLs is on the back side of the substrate, and in a transverse cross-section of the BL, a width of the BL at a first distance from the layer is larger than a width of the BL at a second distance from the layer when the first distance is smaller than the second distance.

6. The IC device according to claim 5, wherein:
the set of the capacitors is on the back side of the substrate,
in a cross-section of an individual capacitor along a plane perpendicular to the layer, a width of the capacitor at a third distance from the layer is smaller than a width of the capacitor at a fourth distance from the layer when the third distance is smaller than the fourth distance.

7. The IC device according to claim 1, wherein:
the plurality of the WLs is in a layer over the front side of the substrate,
the set of the capacitors is on the back side of the substrate, and
in a cross-section of an individual capacitor along a plane perpendicular to the layer, a width of the capacitor at a first distance from the layer is smaller than a width of the capacitor at a second distance from the layer when the first distance is smaller than the second distance.

8. The IC device according to claim 7, wherein:
the set of the BLs is on the back side of the substrate, and
in a transverse cross-section of an individual BL of the set of BLs, a width of the BL at a third distance from the layer is smaller than a width of the BL at a fourth distance from the layer when the third distance is smaller than the fourth distance.

9. The IC device according to claim 8, wherein the BL includes a liner material on sidewalls of the BL and a fill material between the sidewalls of the BL.

10. The IC device according to claim 7, wherein:
the set of the BLs is on the back side of the substrate,
in a transverse cross-section of an individual BL of the set of BLs, a width of the BL at a third distance from the layer is larger than a width of the BL at a fourth distance from the layer when the third distance is smaller than the fourth distance.

11. An integrated circuit (IC) device, comprising:
a memory cell comprising a transistor and a capacitor coupled to the transistor; and
a control line coupled to a first source or drain (S/D) region of the transistor,
wherein:
the control line is in a first layer,
the first layer includes an insulator material,
the control line includes a liner material on sidewalls of the control line and a fill material between the sidewalls of the control line,
a channel region of the transistor is in a second layer,
the capacitor is in a third layer and is coupled to a second S/D region of the transistor,
the second layer is between the first layer and the third layer,
a width of the capacitor at a first distance from the second layer is smaller than a width of the capacitor at a second distance from the second layer when the first distance from the second layer is smaller than the second distance from the second layer, and
in a transverse cross-section of the control line, a width of the control line at a third distance from the second layer is smaller than a width of the control line at a fourth distance from the second layer when the third distance from the second layer is smaller than the fourth distance from the second layer.

12. The IC device according to claim 11, wherein, in a transverse cross-section of the channel region, a width of the channel region at a first distance from the first layer is larger than a width of the channel region at a second distance from the first layer when the first distance from the first layer is smaller than the second distance from the first layer.

13. The IC device according to claim 11, further comprising:
a support structure; and
an elongated structure comprising one or more semiconductor materials,
wherein:
the memory cell and the control line are over the support structure,
the channel region is a portion of the elongated structure, and
an angle between an edge of the support structure and a projection of the elongated structure onto a plane of the support structure is between about 10 degrees and 80 degrees.

14. An integrated circuit (IC) device, comprising:
a first layer comprising parallel control lines extending in a first direction;
a second layer comprising parallel elongated structures extending in a second direction, the elongated structures comprising one or more semiconductor materials;
a third layer comprising capacitors; and
transistors having channel regions in different portions of the elongated structures,
wherein:
the second layer is between the first layer and the third layer,
for at least a subset of the elongated structures, an individual elongated structure includes two transistors sharing a single first source or drain (S/D) region, the first S/D region coupled to one of the control lines,
second S/D regions of different ones of the transistors are coupled to different ones of the capacitors,
the capacitors are in a hexagonal arrangement, and
an angle between the first direction and the second direction is between about 10 and 80 degrees.

15. The IC device according to claim 14, wherein:
the third layer includes a first insulator material,
an individual capacitor is in a respective opening in the insulator material and includes a first electrically conductive material, a second electrically conductive material, and a second insulator material between the first and second electrically conductive materials, and
for the individual capacitor, the first electrically conductive material lines sidewalls and bottom of the respective opening, the second insulator material lines sidewalls and bottom of the respective opening lined with the first electrically conductive material, and the second electrically conductive material at least partially filles remainder of the respective opening lined with the first electrically conductive material and the second insulator material.

16. The IC device according to claim 15, wherein at least one of:
the first electrically conductive materials of two or more capacitors are electrically continuous, or
centers of the respective openings of different ones of the capacitors are vertices of hexagons in the hexagonal arrangement.

17. The IC device according to claim 14, wherein an individual capacitor includes a first electrically conductive material, a second electrically conductive material, and an insulator material between the first and second electrically conductive materials, and at least 5% of the insulator material is in one or more of a tetragonal phase and an orthorhombic phase.

18. The IC device according to claim 14, wherein an individual capacitor includes a first electrically conductive material, a second electrically conductive material, and an insulator material between the first and second electrically conductive materials, and the insulator material includes hafnium, oxygen, and one or more dopants, wherein the one or more dopants include one or more of zirconium, yttrium, silicon, germanium, and aluminum.

19. The IC device according to claim 14, wherein an individual capacitor includes a first electrically conductive material, a second electrically conductive material, and an insulator material between the first and second electrically conductive materials, and the insulator material includes oxygen and one or more rare-earth elements.

20. The IC device according to claim 14, wherein an individual capacitor includes a first electrically conductive material, a second electrically conductive material, and an insulator material between the first and second electrically conductive materials, and the insulator material is a sub-stoichiometric material with vacancies in concentration of at least about $10^{18}$ vacancies per cubic centimeter.

* * * * *